US012751114B2

(12) United States Patent

Lee et al.

(10) Patent No.: US 12,751,114 B2
(45) Date of Patent: Sep. 29, 2026

(54) DISPLAY DEVICE

(71) Applicant: Samsung Display Co., LTD., Yongin-si (KR)

(72) Inventors: Hyun Wook Lee, Suwon-si (KR); Myeong Hun Song, Daegu (KR); Jeong Hyun Lee, Asan-si (KR); Tae Hee Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 756 days.

(21) Appl. No.: 17/996,780

(22) PCT Filed: Jul. 8, 2020

(86) PCT No.: PCT/KR2020/008927
§ 371 (c)(1),
(2) Date: Oct. 20, 2022

(87) PCT Pub. No.: WO2021/215585
PCT Pub. Date: Oct. 28, 2021

(65) Prior Publication Data

US 2023/0155059 A1 May 18, 2023

(30) Foreign Application Priority Data

Apr. 24, 2020 (KR) ........................ 10-2020-0050090

(51) Int. Cl.
*H10H 20/814* (2025.01)
*H10H 20/01* (2025.01)
(Continued)

(52) U.S. Cl.
CPC .......... *H10H 20/814* (2025.01); *H10H 20/01* (2025.01); *H10H 20/8312* (2025.01); *H10W 90/00* (2026.01); *H10H 20/0364* (2025.01)

(58) Field of Classification Search
CPC .... H10K 59/12; H10K 59/123; H10K 59/124; H10K 59/1213; H10D 86/441; H10D 86/481; H10D 86/451; G09G 3/3275
See application file for complete search history.

(56) References Cited

U.S. PATENT DOCUMENTS 11,424,308 B2 8/2022 Lee
11,751,454 B2 9/2023 Lee
(Continued)

FOREIGN PATENT DOCUMENTS

KR 10-1995218 B1 7/2019
KR 10-2019-0121894 A 10/2019
(Continued)

OTHER PUBLICATIONS

Chinese Office Action dated Sep. 20, 2024 regarding Chinese U.S. Appl. No. 17/996,780.6 corresponding to U.S. Appl. No. 17/996,780 (6 pages).

(Continued)

*Primary Examiner* — Leonard Chang
*Assistant Examiner* — Hajar Kolahdouzan
(74) *Attorney, Agent, or Firm* — Womble Bond Dickinson (US) LLP

(57) ABSTRACT

A display device including: a first substrate; a semiconductor layer on the first substrate; a first gate conductive layer on the semiconductor layer and including a scan line, a sensing line, and gate electrodes; a first data conductive layer on the first gate conductive layer and including a first data line, a second data line, and one electrode and the other electrodes of transistors; a second data conductive layer on the first data conductive layer and including a first voltage wiring and a second voltage wiring; first and second electrodes arranged on the second data conductive layer; light-emitting elements, each of the light-emitting elements having end por-
(Continued)

tions on the first electrode and the second electrode, respectively; and a first transistor electrically connected to the first electrode and the first voltage wiring, and a second transistor electrically connected to the second electrode and the first data line.

20 Claims, 26 Drawing Sheets

(51) Int. Cl.
*H10H 20/831* (2025.01)
*H10W 90/00* (2026.01)

(56) References Cited

U.S. PATENT DOCUMENTS

| | | | | |
|---|---|---|---|---|
| 11,870,024 | B2 | 1/2024 | Li et al. | |
| 12,080,693 | B2 | 9/2024 | Lee et al. | |
| 2013/0147690 | A1 | 6/2013 | Kim et al. | |
| 2013/0257831 | A1* | 10/2013 | Kim | G09G 3/3266 345/205 |
| 2015/0029171 | A1* | 1/2015 | Jo | G09G 3/3233 345/82 |
| 2017/0062545 | A1* | 3/2017 | Oh | H10K 59/1213 |
| 2017/0365651 | A1* | 12/2017 | Lee | H10K 59/1213 |
| 2018/0138157 | A1* | 5/2018 | Im | H10H 20/855 |
| 2018/0158410 | A1* | 6/2018 | Jeon | H10K 59/1213 |
| 2020/0075667 | A1 | 3/2020 | Lee et al. | |
| 2021/0280132 | A1* | 9/2021 | Gao | G09G 3/3233 |

FOREIGN PATENT DOCUMENTS

| | | | |
|---|---|---|---|
| KR | 10-2020-0006209 | A | 1/2020 |
| KR | 2020-0004482 | A | 1/2020 |
| KR | 2020-0017013 | A | 2/2020 |
| KR | 10-2020-0026385 | A | 3/2020 |
| KR | 10-2020-0040347 | A | 4/2020 |
| KR | 2020-0034906 | A | 4/2020 |
| WO | WO 2020-059990 | A1 | 3/2020 |

OTHER PUBLICATIONS

International Search Report of PCT/KR2020/008927, Jan. 20, 2021, 4 pp.

* cited by examiner

DISPLAY DEVICE

CROSS-REFERENCE TO RELATED APPLICATION

This application is a U.S. National Phase Patent Application of International Patent Application Number PCT/KR2020/008927, filed on Jul. 8, 2020, which claims priority of Korean Patent Application No. 10-2020-0050090, filed Apr. 24, 2020, the entire contents of both of which are incorporated herein by reference.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

One or more embodiments of the present disclosure provide a display device that allows the number of manufacturing processes to be reduced by including a separate transistor configured to apply an alignment signal in the manufacturing process.

It should be noted that aspects and features of embodiments of the present disclosure are not limited thereto and other aspects, which are not mentioned herein, will be apparent to those of ordinary skill in the art from the following description.

According to one or more embodiments of the present disclosure, a display device includes a first substrate, a semiconductor layer on the first substrate and including a plurality of active layers; a first gate conductive layer on the semiconductor layer and including a scan line and a sensing line extending in a first direction, and a plurality of gate electrodes partially overlapping the semiconductor layer, a first data conductive layer on the first gate conductive layer and including a first data line and a second data line extending in a second direction and are spaced from each other, and one electrode and the other electrode of each of a plurality of transistors, a second data conductive layer on the first data conductive layer and including a first voltage wiring and a second voltage wiring extending in the second direction between the first data line and the second data line, a first electrode and a second electrode on the second data conductive layer and extending in the second direction, the second electrode spaced from the first electrode; and a plurality of light-emitting elements, each of the plurality of light-emitting elements having end portions respectively on the first electrode and the second electrode, wherein plurality of the transistors include a first transistor having one electrode electrically connected to the first electrode and the other electrode electrically connected to the first voltage wiring, and a second transistor having one electrode electrically connected to the second electrode and the other electrode electrically connected to the first data line.

The plurality of transistors may further include a third transistor having one electrode electrically connected to a gate electrode of the first transistor, the other electrode electrically connected to the second data line, and a gate electrode electrically connected to the scan line.

The first data conductive layer may further include an initialization voltage wiring on one side of the first data line and extending in the second direction, and the plurality of transistors may further include a fourth transistor having one electrode electrically connected to the first electrode and the other electrode electrically connected to the initialization voltage wiring.

The first gate conductive layer may further include an alignment signal line on one side of the sensing line and extending in the first direction, and the second transistor may have a gate electrode electrically connected to the alignment signal line.

Each of the second transistor and the fourth transistor may have a gate electrode electrically connected to the sensing line.

The first gate conductive layer may further include a conductive pattern overlapping the first data conductive layer and the initialization voltage wiring and electrically connected to the second data line and a drain electrode of the second transistor.

The second electrode may be electrically connected to the second voltage wiring.

The second data conductive layer may further include a first electrode conductive pattern in contact with the one electrode of the first transistor and the first electrode, and a second electrode conductive pattern in contact with the one electrode of the second transistor and the second electrode.

The display device may further include a third electrode between the first electrode and the second electrode, wherein the third electrode may be electrically connected to the second voltage wiring, and the plurality of light-emitting elements may include a first light-emitting element on the first electrode and the third electrode, and a second light-emitting element on the third electrode and the second electrode.

The display device may further include a first gate insulating layer between the semiconductor layer and the first gate conductive layer, a first protective layer between the first gate conductive layer and the first data conductive layer, a first interlayer insulating layer between the first data conductive layer and the second data conductive layer, a first planarization layer between the second data conductive layer, and the first electrode and the second electrode; and a first insulating layer partially covering the first electrode and the second electrode, wherein the plurality of light-emitting elements may be on the first insulating layer.

The display device may further include a first contact electrode on the first electrode and in contact with one end portion of each of the light-emitting elements, and a second contact electrode on the second electrode and in contact with the other end portion of each of the light-emitting elements.

The first electrode may include a bent portion extending in a direction different from the first direction and the second direction, an extension portion extending in the second direction and having a width greater than that of the bent portion, and an connection portion configured to connect the bent portion and the extension portion and extending in the second direction, and one end portion of each of the light-emitting elements may be on the extension portion of the first electrode.

The second electrode may have a symmetrical structure with the first electrode, and the other end portion of each of the plurality of light-emitting elements may be on an extension portion of the second electrode.

An interval between the extension portions of the first electrode and the second electrode may be less than an interval between connection portions of the first electrode and the second electrode, and a shortest interval between bent portions of the first electrode and the second electrode may be greater than the interval between the extension portions, and be less than the interval between the connection portions.

According to one or more embodiments of the present disclosure, a display device includes a first voltage wiring configured to receive a first power voltage and a second voltage wiring configured to receive a second power voltage, a first data line and a second data line configured to receive different data signals; a light-emitting diode having one end electrically connected to the first voltage wiring and the other end electrically connected to the second voltage wiring, a first transistor having one electrode electrically connected to the one end of the light-emitting diode and the other electrode electrically connected to the first voltage wiring, a second transistor having one electrode electrically connected to the other end of the light-emitting diode and the other electrode electrically connected to the second data line, a third transistor having one electrode connected to a gate electrode of the first transistor and the other electrode electrically connected to the first data line, and a storage capacitor electrically connected to the gate electrode and the one electrode of the first transistor.

The display device may further includes a scan line configured to receive a scan signal, the scan line being electrically connected to a gate electrode of the third transistor, an alignment signal line configured to receive an alignment signal, the alignment signal line being electrically connected to a gate electrode of the second transistor, and a sensing line configured to receive a sensing signal, wherein the display device may further include a fourth transistor having a gate electrode electrically connected to the sensing line, one electrode electrically connected to the one end of the light-emitting diode, and the other electrode connected to an initialization voltage wiring configured to receive an initialization voltage.

In a manufacturing mode of the display device, the second transistor and the fourth transistor may be turned on in response to signals applied through the alignment signal line and the sensing line, respectively, and the first transistor and the third transistor may be turned off.

In the manufacturing mode, a first alignment voltage applied to the initialization voltage wiring may be transmitted to the one end of the light-emitting diode through the fourth transistor, and a second alignment voltage applied to the second data line may be transmitted to the other end of the light-emitting diode through the second transistor.

In a driving mode of the display device, the first power voltage may be transmitted to the one end of the light-emitting diode through the first transistor, and the second power voltage may be transmitted to the other end of the light-emitting diode through the second voltage wiring.

The light-emitting diode may include a first light-emitting diode and a second light-emitting diode connected in series with each other, and in the manufacturing mode, a first alignment voltage applied to the initialization voltage wiring may be transmitted to one end of the first light-emitting diode through the fourth transistor, a third alignment voltage applied to the second data line may be transmitted to one end of the second light-emitting diode and the other end of the first light-emitting diode through the second transistor, and the second alignment voltage may be transmitted to the other end of the second light-emitting diode through the second voltage wiring.

The details of other embodiments are included in the detailed description and the accompanying drawings.

A display device according to one or more embodiments includes a transistor that is connected to one end of a light-emitting diode and applies an alignment signal during a manufacturing process. The transistor substantially does not transmit a signal or can be turned off while the light-emitting diode emits light, and during the manufacturing process, the transistor can be turned on and apply an alignment signal for aligning light-emitting elements of the light-emitting diode to the light-emitting diode. Accordingly, the display device allows the number of manufacturing processes to be reduced by omitting a disconnection process of each electrode, which is performed after the light-emitting elements are aligned, by including electrodes separated for each pixel.

The effects, aspects, and features of embodiments of the present disclosure are not limited by the contents discussed above, and more various effects aspects, and features are included in this disclosure.

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
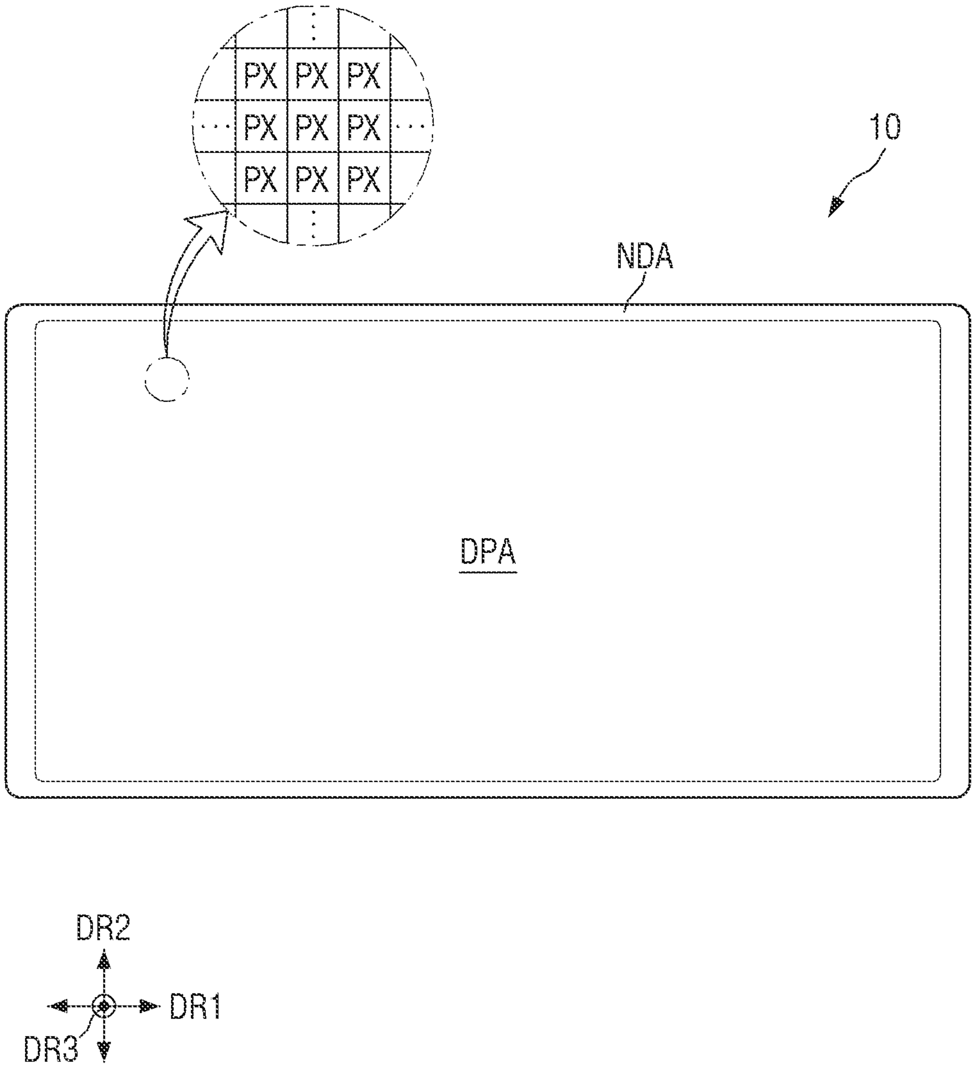
FIG. 1 is a schematic plan view of a display device according to one or more embodiments.

FIG. 1 is a schematic plan view of a display device according to one or more embodiments.

In the specification, with respect to a display device 10, the terms "upper portion," "top," or "upper surface" refer to an upper direction, that is, one direction of a third direction DR3, and the terms "lower portion," "bottom," and "lower surface" refer to the other direction of the third direction DR3. In addition, the terms "left," "right," "upper," and "lower" refer to directions when the display device 10 is viewed in a plan view. For example, the term "left" refers to one direction of a first direction DR1, the term "right" refers to the other direction of the first direction DR1, the term "upper" refers to one direction of a second direction DR2, and the term "lower" refers to the other direction of the second direction DR2.

Referring to FIG. 1, the display device 10 displays a video or a still image. The display device 10 may refer to all electronic devices that provide a display screen. For example, the display device 10 may include a television, a laptop computer, a monitor, a billboard, an Internet of Things device, a mobile phone, a smartphone, a tablet personal computer (PC), an electronic watch, a smartwatch, a watch phone, a head-mounted display, a mobile communication terminal, an electronic organizer, an e-book reader, a portable multimedia player (PMP), a navigation system, a game console, a digital camera, and a camcorder, which are provided with a display screen.

The display device 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, a case in which the inorganic light-emitting diode display panel is applied as an example of the display panel is illustrated, but the present disclosure is not limited thereto, and a device to which the same technical spirit is applicable may be applied to other display panels.

A shape of the display device 10 may be variously changed. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DPA of the display device 10 may also be similar to an overall shape of the display device 10. In FIG. 1, the display device 10 and the display area DPA, which have the rectangular shape of which lateral sides are long, are illustrated.

The display device 10 may include the display area DPA and a non-display area NDA around an edge or periphery of the display area DPA. The display area DPA is an area in which an image may be displayed, and the non-display area NDA is an area in which no image is displayed. The display area DPA may be referred to as an active area, and the non-display area NDA may be referred to as an inactive area. The display area DPA may substantially occupy a center (or a central region) of the display device 10.

The display area DPA may include a plurality of pixels PX. The plurality of pixels PX may be arranged in a matrix direction. For example, the plurality of pixels PX may be arranged along rows and columns of a matrix. A shape of each pixel PX may be a rectangular shape or a square shape in a plan view but is not limited thereto, and the shape may be a rhombus shape of which each side is inclined with respect to one direction. The pixels PX may be alternately arranged as a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light-emitting elements 30 that emit light in a specific wavelength band, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
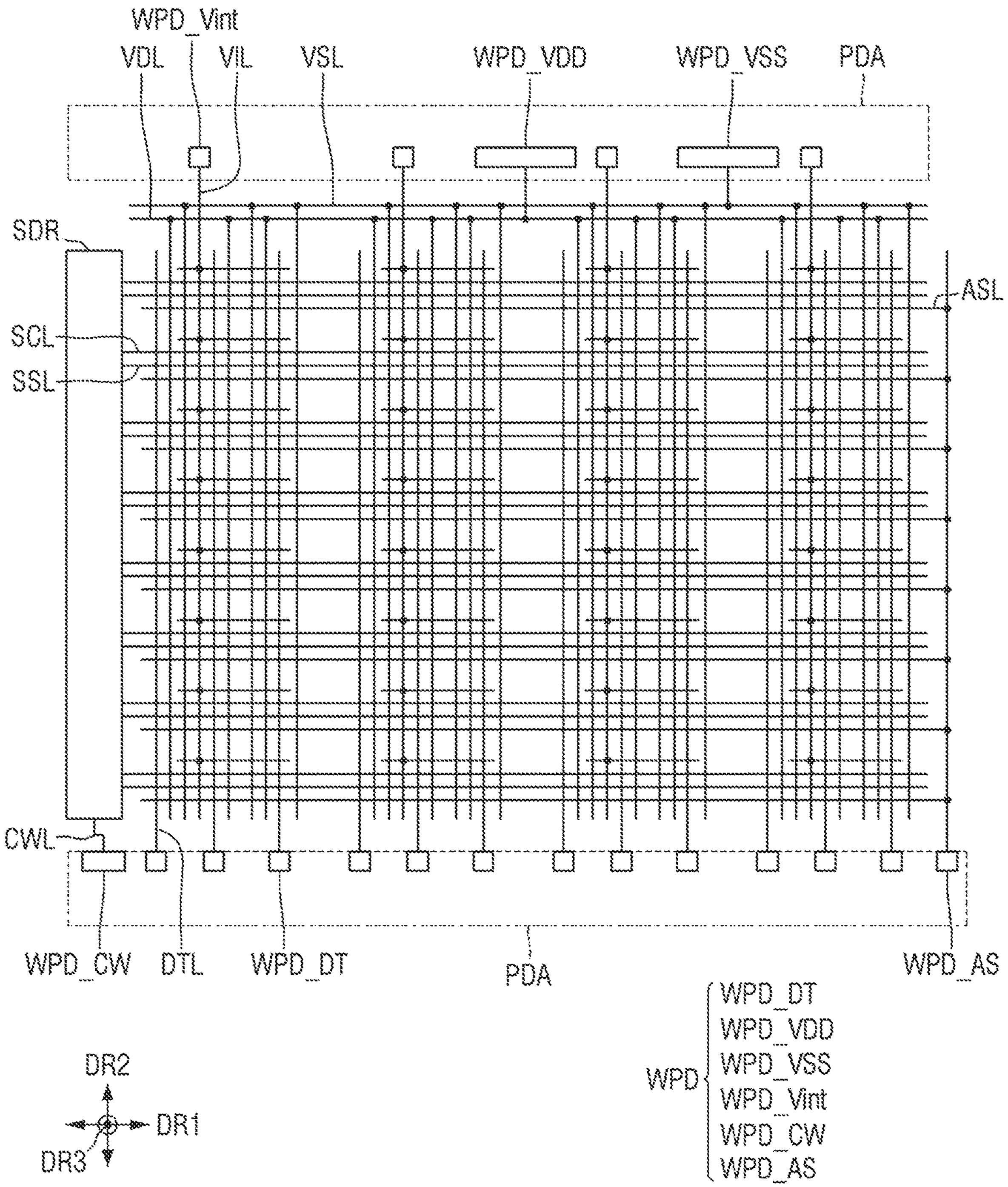
FIG. 2 is a schematic layout illustrating wirings included in the display device according to one or more embodiments.

FIG. 2 is a schematic layout illustrating wirings included in the display device according to one or more embodiments.

Referring to FIG. 2, the display device 10 may include a plurality of wirings. The plurality of wirings may include a scan line SCL, a sensing line SSL, an alignment signal line ASL, a data line DTL, an initialization voltage wiring VIL, a first voltage wiring VDL, a second voltage wiring VSL, and the like. In addition, in one or more embodiments, other wirings may be further disposed in the display device 10.

The scan line SCL, the sensing line SSL, and the alignment signal line ASL may extend in the first direction DR1. The scan line SCL and the sensing line SSL may be connected to a scan driver SDR. The scan driver SDR may include a driving circuit. The scan driver SDR may be disposed at one side of a display area DPA in the first direction DR1, but the present disclosure is not limited thereto. The scan driver SDR may be connected to a signal connection wiring CWL, and at least one end portion of the signal connection wiring CWL may form a pad WPD_CW in the non-display area NDA to be connected to an external device. The alignment signal line ASL may further include a portion extending in the second direction DR2, and the portion of the alignment signal line ASL extending in the second direction DR2 may be connected to a pad WPD_AS on a pad area PDA of the non-display area NDA.

In the specification, the term "connection" may mean that one member is connected to be in physical contact with another member as well as meaning that one member is connected to another member through still another member. In addition, it may be understood that one member and another member are integrated into one member and one portion of the integrated member is connected to the other portion of the integrated member. Furthermore, the connection between one member and another member may be interpreted as including an electrical connection through still another member in addition to a direct contact connection.

The data line DTL and the initialization voltage wiring VIL may extend in the second direction DR2 intersecting the first direction DR1. The initialization voltage wiring VIL may further include a portion extending in the second direction DR2 as well as a portion branched off therefrom in the first direction DR1. Each of the first voltage wiring VDL and the second voltage wiring VSL may also include a portion extending in the second direction DR2 and a portion extending in the first direction DR1. The first voltage wiring VDL and the second voltage wiring VSL may have a mesh structure, but the present disclosure is not limited thereto. In one or more embodiments, each of the pixels PX of the display device 10 may be connected to at least one data line DTL, the initialization voltage wiring VIL, the first voltage wiring VDL, and the second voltage wiring VSL.

The data line DTL, the initialization voltage wiring VIL, the first voltage wiring VDL, and the second voltage wiring VSL may be electrically connected to at least one wiring pad WPD. Each wiring pad WPD may be disposed in the non-display area NDA. In one or more embodiments, a wiring pad WPD_DT (hereinafter, referred to as "data pad") of the data line DTL may be disposed in the pad area PDA on one side of the display area DPA in the second direction DR2, and a wiring pad WPD_Vint (hereinafter, referred to as "initialization voltage pad") of the initialization voltage wiring VIL, a wiring pad WPD_VDD (hereinafter, referred to as "first power pad") of the first voltage wiring VDL, and a wiring pad WPD_VSS (hereinafter, referred to as "second power pad") of the second voltage wiring VSL may be disposed in the pad area PDA positioned on the other side of the display area DPA in the second direction DR2. As another example, the data pad WPD_DT, the initialization voltage pad WPD_Vint, the first power pad WPD_VDD, and the second power pad WPD_VSS may all be disposed in the same area, for example, in the non-display area NDA positioned on an upper side of the display area DPA. The external device may be mounted on the wiring pad WPD. The external device may be mounted on the wiring pad WPD through an anisotropic conductive film, ultrasonic bonding, or the like.

Each pixel PX or sub-pixel PXn (wherein, n is an integer from one to three) of the display device 10 may include a pixel driving circuit. Through the above-described wirings, a driving signal may be applied to each pixel driving circuit while passing through or around each pixel PX. The pixel driving circuit may include transistors and capacitors. The number of the transistors and capacitors of each pixel driving circuit may be variously modified. According to one or more embodiments, each sub-pixel PXn of the display device 10 may have a 4T1C structure in which the pixel driving circuit includes four transistors and one capacitor. Hereinafter, the pixel driving circuit will be described in reference to a 4T1C structure, but the present disclosure is not limited thereto. Various other modified structures of the pixel PX, such as a 2T1C structure, a 7T1C structure, and a 6T1C structure, may be utilized.

Figure 3:
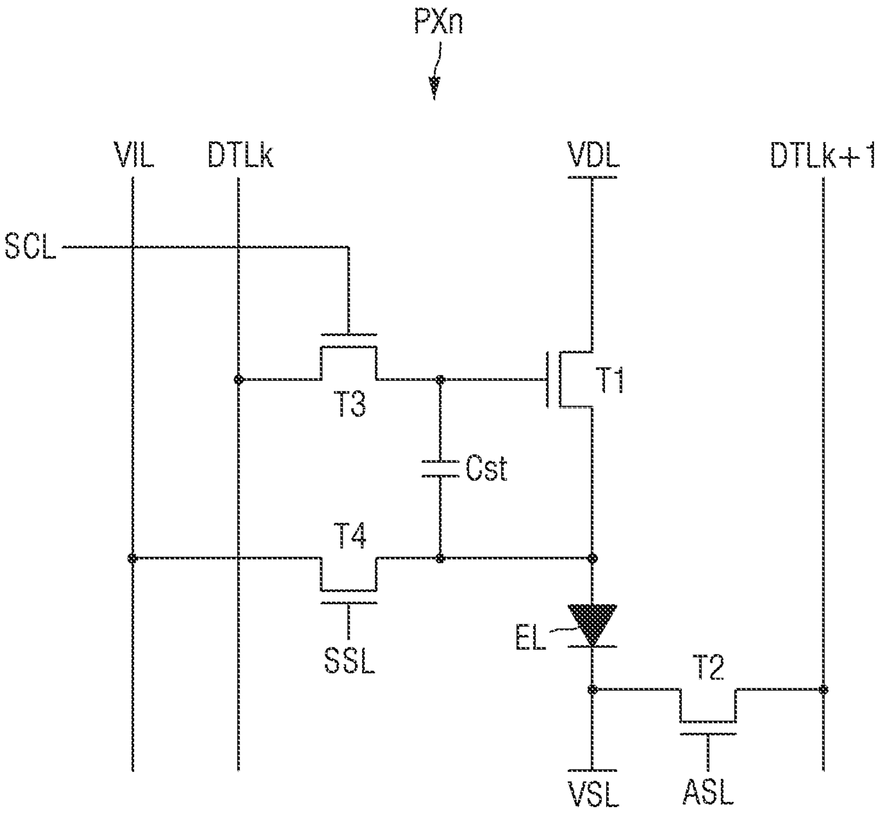
FIG. 3 is an equivalent circuit diagram of one sub-pixel according to one or more embodiments.

FIG. 3 is an equivalent circuit diagram of one sub-pixel according to one or more embodiments.

Referring to FIG. 3, each sub-pixel PXn of the display device 10 according to one or more embodiments includes four transistors T1, T2, T3, and T4 and one storage capacitor Cst in addition to a light-emitting diode EL.

The light-emitting diode EL emits light according to a current supplied through a first transistor T1. The light-emitting diode EL includes a first electrode, a second electrode, and one or more light-emitting elements disposed therebetween. The light-emitting element may emit light having a specific wavelength band due to an electrical signal transmitted from the first electrode and the second electrode.

One end of the light-emitting diode EL may be connected to a source electrode of the first transistor T1, and the other end thereof may be connected to the second voltage wiring VSL to which a low potential voltage (hereinafter, referred to as a second power voltage), which is lower than a high potential voltage (hereinafter, referred to as a first power voltage) of the first voltage wiring VDL, is supplied. In addition, the other end of the light-emitting diode EL may be connected to a source electrode of a second transistor T2.

The first transistor T1 adjusts a current flowing to the light-emitting diode EL from the first voltage wiring VDL, to which the first power voltage is supplied, according to a voltage difference between a gate electrode and the source electrode of the first transistor T1 thereof. As an example, the first transistor T1 may be a driving transistor for driving the light-emitting diode EL. The gate electrode of the first transistor T1 may be connected to a source electrode of a third transistor T3, the source electrode thereof may be connected to the first electrode of the light-emitting diode EL, and a drain electrode thereof may be connected to the first voltage wiring VDL to which the first power voltage is applied.

The second transistor T2 may be turned on in response to a signal of the alignment signal line ASL to transmit a voltage applied to the data line DTL (DTLk or DTLk+1) to the second electrode of the light-emitting diode EL. A gate electrode of the second transistor T2 may be connected to the alignment signal line ASL, the source electrode thereof may be connected to the second electrode of the light-emitting diode EL, and a drain electrode thereof may be connected to a (k+1)th data line DTLk+1 (where k is an integer greater than or equal to one) of a timing different from that of the corresponding sub-pixel PXn. The second transistor T2 may be turned on at the same timing as a fourth transistor T4, which will be described below, during a manufacturing process of the display device 10. The second transistor T2 may be turned on concurrently (e.g. simultaneously) with the fourth transistor T4 to transmit an electrical signal applied to the (k+1)th data line DTLk+1 to the other end of the light-emitting diode EL. However, during the driving of the display device 10, a signal may not be applied to the alignment signal line ASL, and the second transistor T2 may be maintained in a turn-off state so that the electrical signal applied to the (k+1)th data line DTLk+1 may not be transmitted to the other end of the light-emitting diode EL.

The third transistor T3 is turned on in response to a scan signal of the scan line SCL to connect the data line DTL (DTLk or DTLk+1) to the gate electrode of the first transistor T1. A gate electrode of the third transistor T3 may be connected to the scan line SCL, the source electrode thereof may be connected to the gate electrode of the first transistor T1, and a drain electrode thereof may be connected to a kth data line DTLk (where k is an integer greater than or equal to one).

The fourth transistor T4 is turned on in response to a sensing signal of the sensing line SSL to connect the initialization voltage wiring VIL to one end of the light-emitting diode EL. A gate electrode of the fourth transistor T4 may be connected to the sensing line SSL, a drain electrode thereof may be connected to the initialization voltage wiring VIL, and a source electrode thereof may be connected to one end of the light-emitting diode EL or the source electrode of the first transistor T1.

In one or more embodiments, the source electrode and the drain electrode of each of the transistors T1, T2, T3, and T4 are not limited to those described above, and the reverse may well be the case.

The storage capacitor Cst is formed between the gate electrode and the source electrode of the first transistor T1. The storage capacitor Cst stores a differential voltage between a gate voltage and a source voltage of the first transistor T1.

Each of the transistors T1, T2, T3, and T4 may be formed as a thin-film transistor (TFT). In addition, in FIG. 3, the descriptions have been given based on each of the transistors T1, T2, T3, and T4 being formed as an N-type metal oxide semiconductor field effect transistor (MOSFET), but the present disclosure is not limited thereto. That is, each of the transistors T1, T2, T3, and T4 may be formed as a P-type MOSFET, or some thereof may be formed as N-type MOSFETs, and others thereof may be formed as P-type MOSFETs.

Hereinafter, a structure of one pixel PX of the display device 10 according to one or more embodiments will be described in detail with further reference to other drawings.

Figure 4:
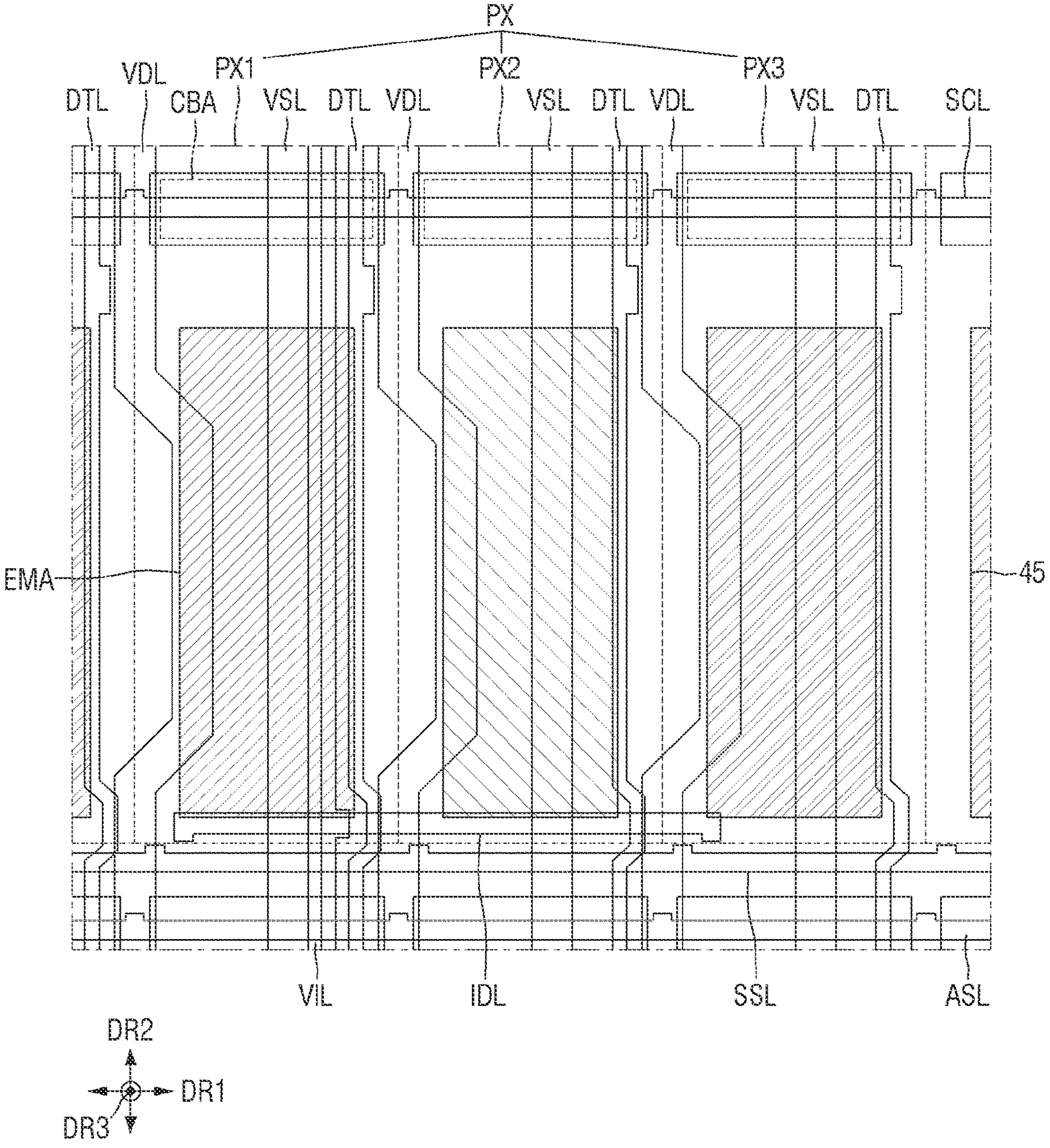
FIG. 4 is a schematic plan view illustrating wirings disposed in one pixel of the display device according to one or more embodiments.

FIG. 4 is a schematic plan view illustrating wirings disposed in one pixel of the display device according to one or more embodiments. In FIG. 4, a schematic shape of the plurality of wirings and a second bank 45 disposed in each pixel PX of the display device 10 is illustrated, and members disposed in a light-emitting area EMA of each sub-pixel PXn and some conductive layers disposed below the members are omitted. In each of the following drawings, both sides of the first direction DR1 may be referred to as left and right sides, respectively, and both sides of the second direction DR2 may be referred to as upper and lower sides, respectively.

Referring to FIG. 4, each of the plurality of pixels PX of the display device 10 may include a plurality of sub-pixels PXn (where n is an integer from one to three). For example, one pixel PX may include a first sub-pixel PX1, a second sub-pixel PX2, and a third sub-pixel PX3. The first sub-pixel PX1 may emit light having a first color, the second sub-pixel PX2 may emit light having a second color, and the third sub-pixel PX3 may emit light having a third color. The first color may be blue, the second color may be green, and the third color may be red. However, the present disclosure is not limited thereto, and the sub-pixels PXn may emit light having the same color.

Each of the sub-pixels PXn of the display device 10 may include the light-emitting area EMA and a non-light-emitting area. The light-emitting area EMA may be an area in which a light-emitting element 30 (see FIG. 7) is disposed so that light having a specific wavelength band is emitted, and the non-light-emitting area may be an area in which the light-emitting element 30 is not disposed so that light emitted from the light-emitting element 30 does not reach and is not emitted. The light-emitting area may include an area in which the light-emitting element 30 is disposed and an area which is adjacent to the light-emitting element 30 and to which the light emitted from the light-emitting element 30 is output.

The present disclosure is not limited thereto, and the light-emitting area may also include an area to which light emitted from the light-emitting element 30 is output due to being reflected or refracted by another member. A plurality of light-emitting elements 30 may be disposed in each sub-pixel PXn, and an area in which the plurality of light-emitting elements 30 are disposed and an area adjacent to the area may form the light-emitting area.

In addition, each sub-pixel PXn may include a cut-out area CBA disposed in the non-light-emitting area. The cut-out area CBA may be disposed at one side of the light-emitting area EMA in the second direction DR2. The cut-out area CBA may be disposed between the light-emitting areas EMA of the sub-pixels PXn adjacent in the second direction DR2. That is, a plurality of light-emitting areas EMA and a plurality of cut-out areas CBA may be arranged in the display area DPA of the display device 10. For example, the plurality of light-emitting areas EMA and the plurality of cut-out areas CBA may be repeatedly arranged along the first direction DR1, and the light-emitting areas EMA and the cut-out areas CBA may be alternately arranged along the second direction DR2. In addition, a spacing interval between the cut-out areas CBA in the first direction DR1 may be less than a spacing interval between the light-emitting areas EMA in the first direction DR1. As will be described below, the second bank 45 may be disposed between the cut-out areas CBA and between the light-emitting areas EMA, and an interval therebetween may vary according to a width of the second bank 45. Because the light-emitting element 30 is not disposed in the cut-out area CBA, light is not emitted through the cut-out area CBA, but some of electrodes 21 and 22 disposed in each sub-pixel PXn may be disposed in the cut-out area CBA. The electrodes 21 and 22 (e.g., see FIG. 7) disposed for each sub-pixel PXn may be separated from each other and disposed in the cut-out area CBA.

The second bank 45 may be disposed in a grid pattern, which includes portions extending in the first direction DR1 and the second direction DR2 in a plan view, on an entire surface of the display area DPA. The second bank 45 may be disposed over boundaries of the sub-pixels PXn to distinguish adjacent sub-pixels PXn. In addition, the second bank 45 may be disposed to surround the light-emitting area EMA and the cut-out area CBA disposed for each sub-pixel PXn to distinguish the light-emitting area EMA and the cut-out area CBA. In a portion of the second bank 45 extending in the second direction DR2, a portion disposed between the light-emitting areas EMA may have a width greater than that of a portion disposed between the cut-out areas CBA. Thus, an interval between the cut-out areas CBA may be less than an interval between the light-emitting areas EMA. A more detailed description of the second bank 45 will be described below.

The plurality of wirings are disposed in each pixel PX and sub-pixel PXn of the display device 10. For example, the display device 10 includes an initialization voltage distribution line IDL disposed over some sub-pixels PXn, in addition to the scan line SCL, the sensing line SSL, and the alignment signal line ASL, which are disposed to extend in the first direction DR1. In addition, the display device 10 includes the data line DTL, the initialization voltage wiring VIL, the first voltage wiring VDL, and the second voltage wiring VSL, which are disposed to extend in the second direction DR2.

The scan line SCL extends in the first direction DR1 and is disposed over the plurality of sub-pixels PXn arranged along the first direction DR1. In addition, a plurality of scan lines SCL are disposed to be spaced from each other in the second direction DR2 over the entire surface of the display area DPA. The scan line SCL may be disposed on an upper side of a center of each pixel PX or sub-pixel PXn. The scan line SCL may be electrically connected to the gate electrode of the third transistor T3, and may apply the scan signal to the third transistor T3.

Similarly, the sensing line SSL extends in the first direction DR1 and is disposed over the plurality of sub-pixels PXn that are arranged along the first direction DR1. In addition, a plurality of sensing lines SSL are disposed to be spaced from each other in the second direction DR2 over the entire surface of the display area DPA. The sensing line SSL may be disposed on a lower side with respect to the center of each pixel PX or sub-pixel PXn. The sensing line SSL may be electrically connected to the gate electrode of the fourth transistor T4, and may apply the sensing signal or an alignment signal to the fourth transistor T4.

The alignment signal line ASL also extends in the first direction DR1 and is disposed over the plurality of sub-pixels PXn arranged along the first direction DR1. A plurality of alignment signal lines ASL are disposed to be spaced from each other in the second direction DR2 over the entire surface of the display area DPA. The alignment signal line ASL may be disposed below the sensing line SSL of each pixel PX or sub-pixel PXn. The alignment signal line ASL may be electrically connected to the gate electrode of the second transistor T2 and may apply the alignment signal to the second transistor T2.

The initialization voltage distribution line IDL may be disposed for each pixel PX and may be disposed over three sub-pixels PXn. The initialization voltage distribution line IDL may have a shape disposed above the sensing line SSL and extending in the first direction DR1. The initialization voltage distribution line IDL may be electrically connected to the initialization voltage wiring VIL and may transmit an initialization voltage Vint, which is applied for each pixel PX, to each sub-pixel PXn. As an example, the initialization voltage distribution line IDL may be in direct contact with the initialization voltage wiring VIL through a contact hole CT11 (see FIG. 5). The initialization voltage distribution line IDL may be electrically connected to the drain electrode of the fourth transistor T4 of each sub-pixel PXn. The initialization voltage distribution line IDL may apply the initialization voltage, which is applied from the initialization voltage wiring VIL, to the fourth transistor T4.

The scan line SCL, the sensing line SSL, the alignment signal line ASL, and the initialization voltage distribution line IDL may be formed of a first gate conductive layer, which will be described below. The first gate conductive layer may further include more conductive layers in addition to the above lines.

The data line DTL extends in the second direction DR2 and is disposed over the plurality of sub-pixels PXn arranged along the second direction DR2. In addition, a plurality of data lines DTL are disposed to be spaced from each other in the first direction DR1 over the entire surface of the display area DPA. The data line DTL may be disposed on a right side of each sub-pixel PXn. The data line DTL that transmits a data signal to any one sub-pixel PXn may be disposed on a right side of another sub-pixel PXn adjacent in the first direction DR1, and the data line DTL disposed on a right side of the corresponding sub-pixel PXn may transmit the data signal to another sub-pixel PXn. That is, the data line DTL may not be disposed in an area occupied by the sub-pixel PXn to which the data line DTL is connected. However, the present disclosure is not limited thereto. The data line DTL may be electrically connected to the drain electrode of the third transistor T3, and may apply the data signal to the third transistor T3.

The initialization voltage wiring VIL extends in the second direction DR2 and is disposed over the plurality of pixels PX arranged along the second direction DR2. In addition, a plurality of initialization voltage wirings VIL are disposed to be spaced from each other in the first direction DR1 over the entire surface of the display area DPA. The initialization voltage wirings VIL may each be disposed for every three sub-pixels PXn or every one pixel PX. As an example, the initialization voltage wiring VIL may be disposed on a left side of the data line DTL connected to one sub-pixel PXn. In the drawing, an example in which the initialization voltage wiring VIL is disposed on the left side of the data line DTL disposed in an area occupied by the first sub-pixel PX1 is illustrated as the data line DTL connected to the second sub-pixel PX2, but the present disclosure is not limited thereto. The initialization voltage wiring VIL may be electrically connected to the initialization voltage distribution line IDL, and may transmit an initialization voltage to each sub-pixel PXn. The initialization voltage wiring VIL may be electrically connected to the drain electrode of the fourth transistor T4, and may apply the initialization voltage to the fourth transistor T4.

The data line DTL and the initialization voltage wiring VIL may be formed of a first data conductive layer, which will be described below. The first data conductive layer may further include more conductive layers in addition to the above lines and wirings.

The first voltage wiring VDL and the second voltage wiring VSL may extend in the second direction DR2 and may be disposed over the plurality of sub-pixels PXn adjacent in the second direction DR2. In addition, a plurality of first voltage wirings VDL and a plurality of second voltage wirings VSL are disposed to be spaced from each other in the first direction DR1 over the entire surface of the display area DPA. The first voltage wiring VDL and the second voltage wiring VSL may be disposed between the plurality of data lines DTL in a plan view. The first voltage wiring VDL may be disposed on a left side with respect to the center of each sub-pixel PXn, and the second voltage wiring VSL may be disposed on a right side thereof. However, the first voltage wiring VDL may extend in the second direction DR2 and may be partially bent. For example, the first voltage wiring VDL may include a portion bent toward the second voltage wiring VSL in addition to a portion disposed to extend downward from an upper side of each sub-pixel PXn. Accordingly, an interval between the first voltage wiring VDL and the second voltage wiring VSL disposed in each sub-pixel PXn may partially vary.

The first voltage wiring VDL may be electrically connected to the drain electrode of the first transistor T1, and may apply the first power voltage to the first transistor T1. The second voltage wiring VSL may be electrically connected to the second electrode of the light-emitting diode EL, and may apply the second power voltage to the light-emitting element. The first voltage wiring VDL and the second voltage wiring VSL may be formed of a second data conductive layer, which will be described below.

Figure 5:
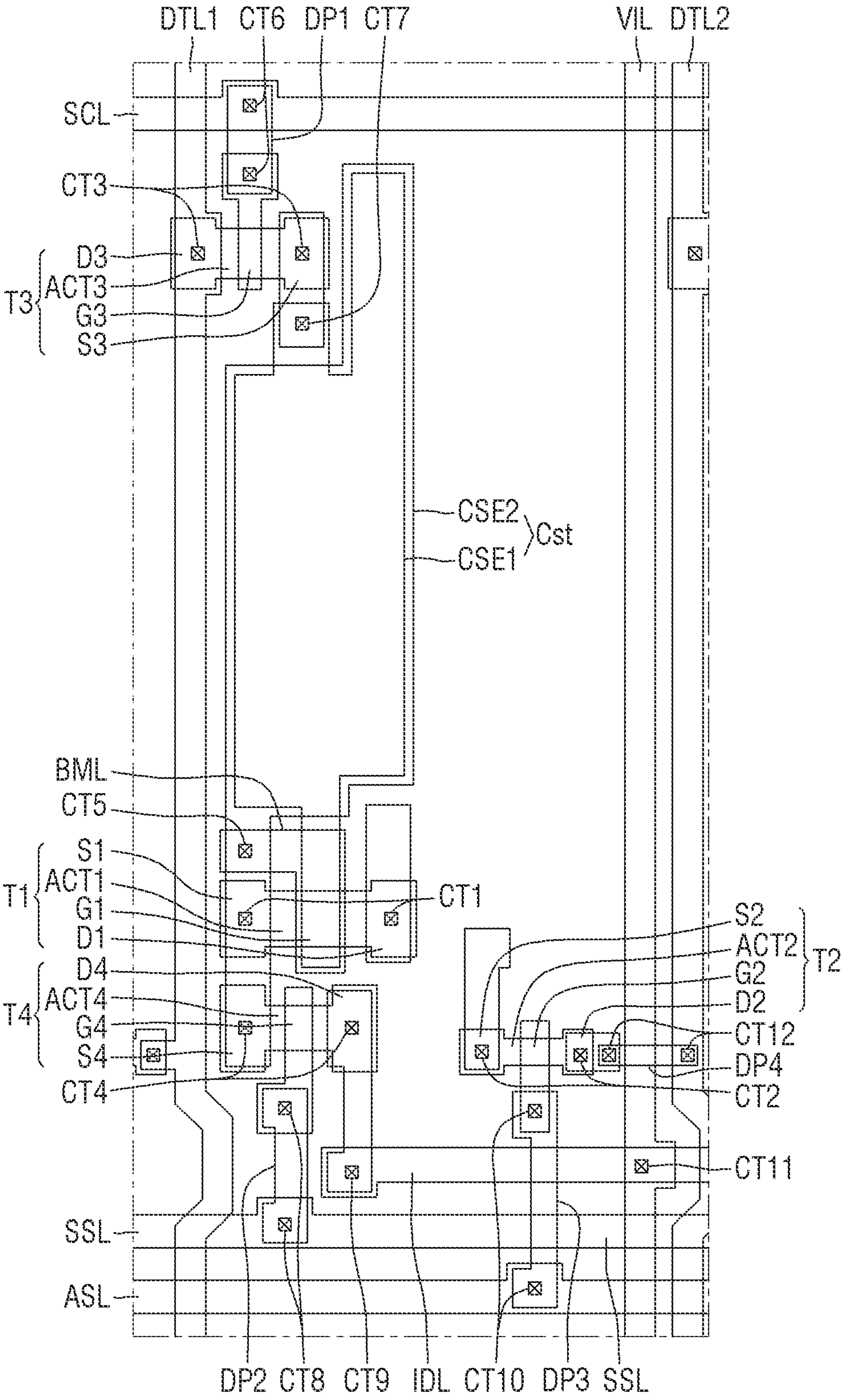
FIG. 5 is a layout diagram illustrating a plurality of conductive layers included in one sub-pixel of the display device according to one or more embodiments.
Figure 6:
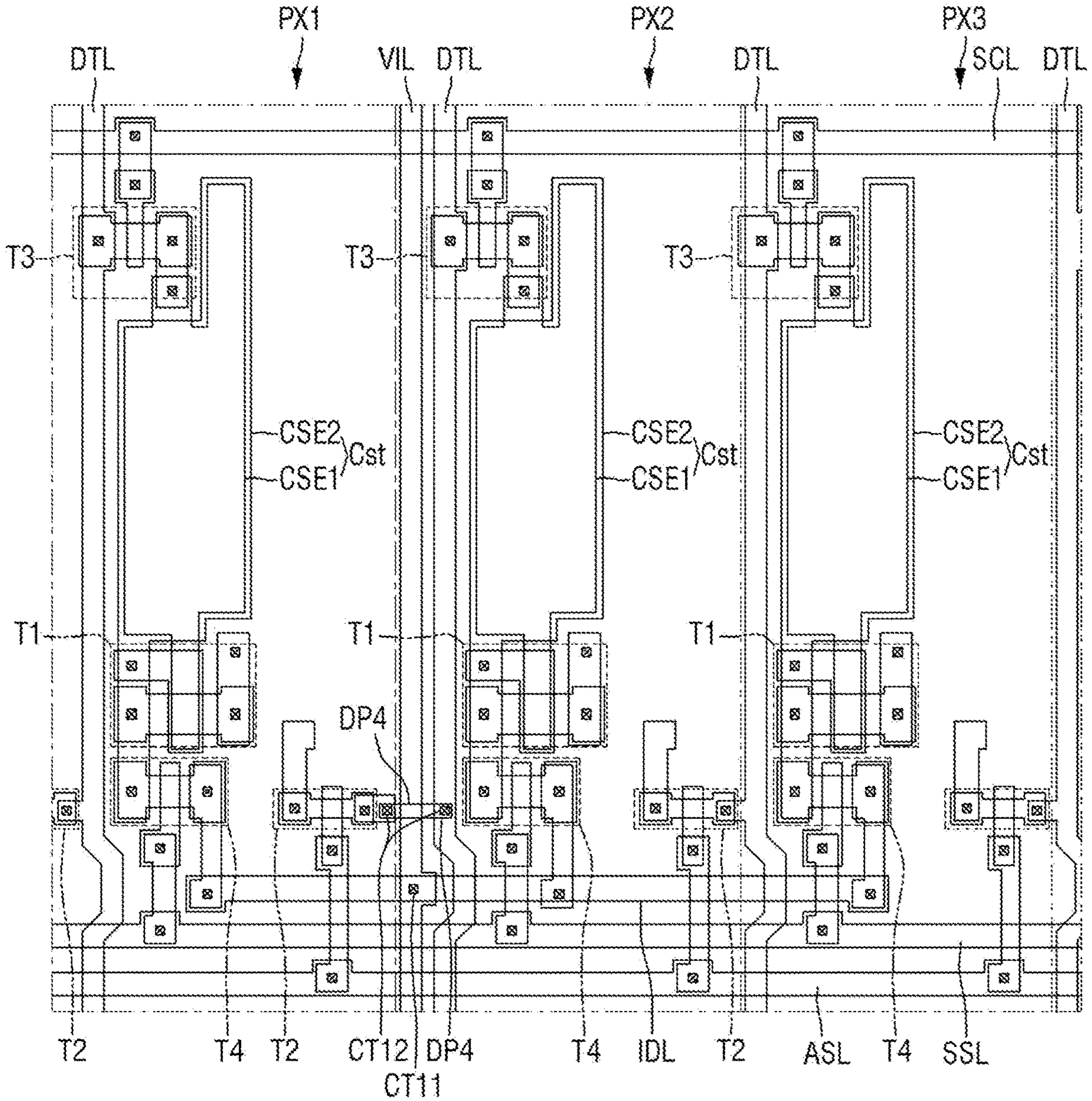
FIG. 6 is a layout diagram illustrating a plurality of conductive layers included in one pixel of the display device according to one or more embodiments.
Figure 7:
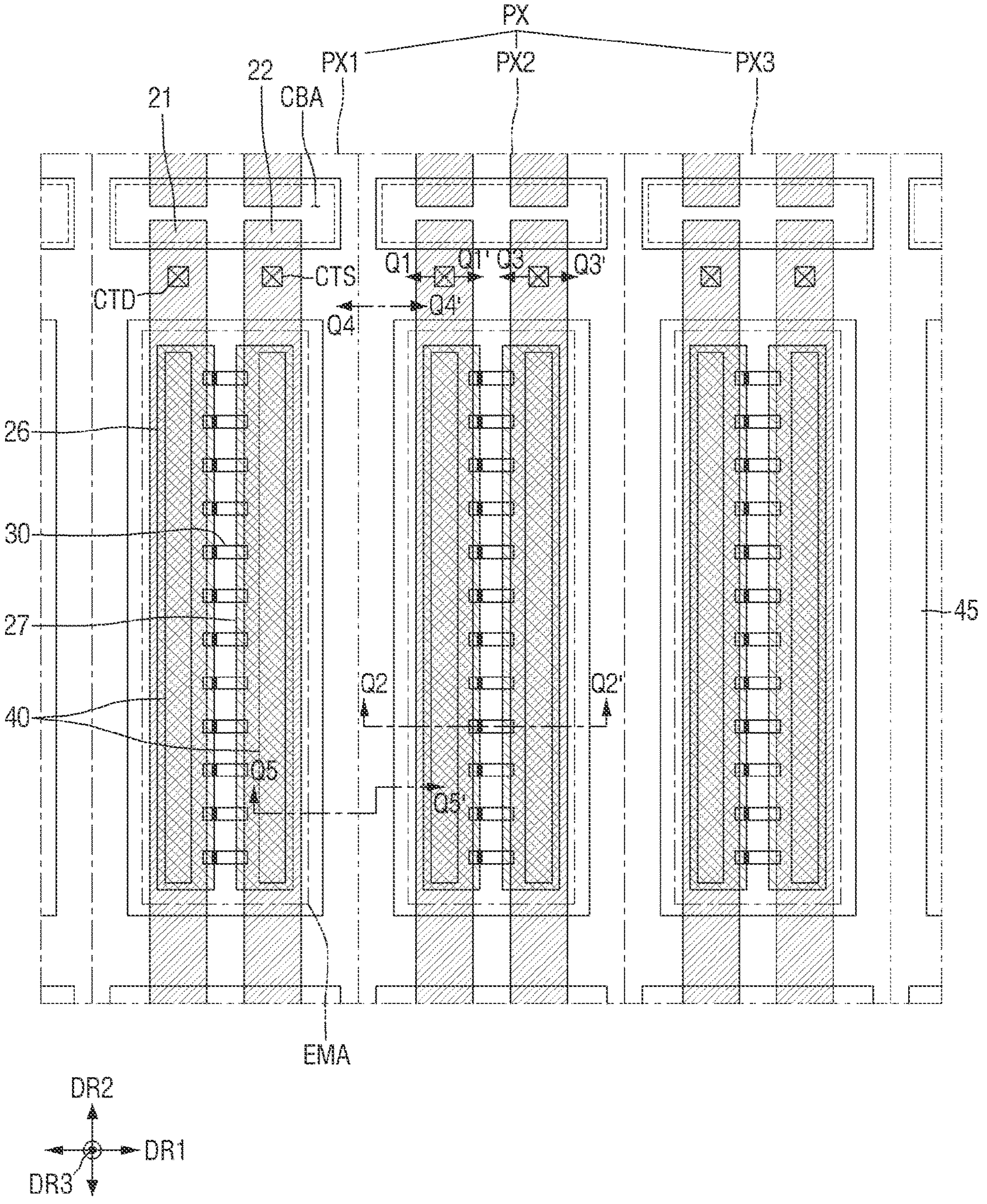
FIG. 7 is a schematic plan view illustrating a plurality of electrodes and a plurality of banks included in one pixel of the display device according to one or more embodiments.
Figure 8:
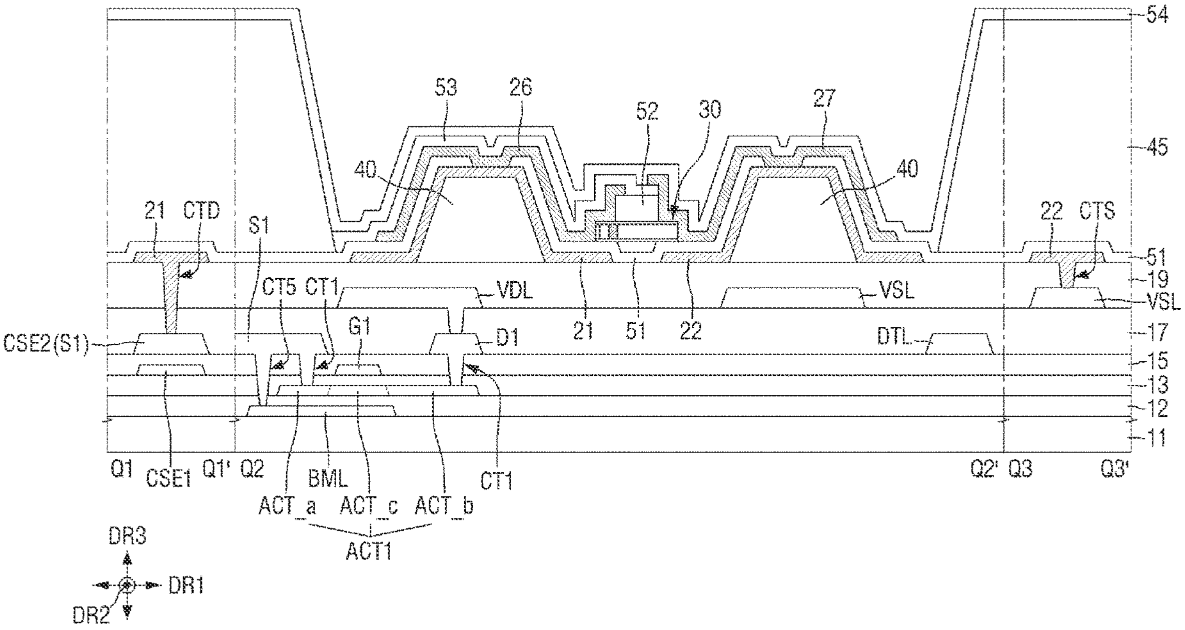
FIG. 8 is a cross-sectional view taken along the lines Q1-Q1', Q2-Q2', and Q3-Q3' of FIG. 7.
Figure 9:
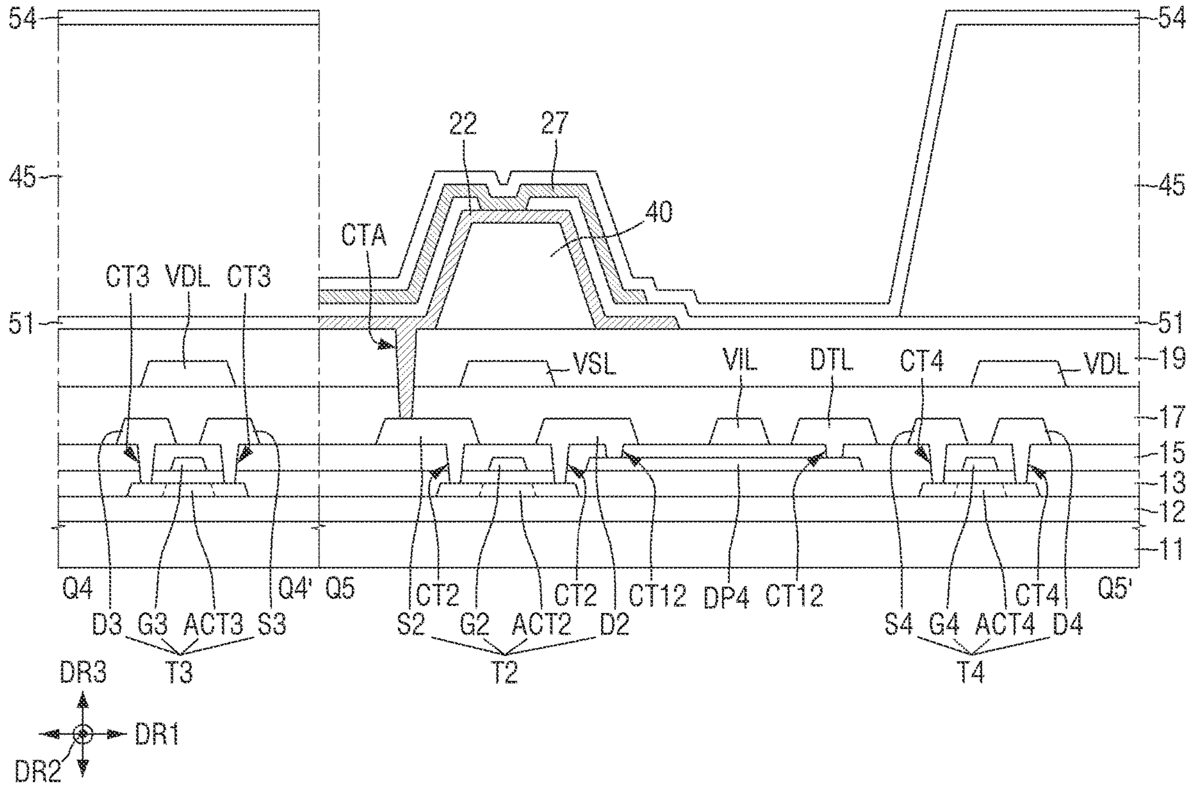
FIG. 9 is a cross-sectional view taken along the lines Q4-Q4' and Q5-Q5' of FIG. 7.

FIG. 5 is a layout diagram illustrating a plurality of conductive layers included in one sub-pixel of the display device according to one or more embodiments. FIG. 6 is a layout diagram illustrating a plurality of conductive layers included in one pixel of the display device according to one or more embodiments. FIG. 7 is a schematic plan view illustrating a plurality of electrodes and a plurality of banks included in one pixel of the display device according to one or more embodiments. FIG. 8 is a cross-sectional view taken along the lines Q1-Q1', Q2-Q2', and Q3-Q3' of FIG. 7. FIG. 9 is a cross-sectional view taken along the lines Q4-Q4' and Q5-Q5' of FIG. 7

In FIG. 5, as a circuit element layer disposed in each sub-pixel PXn, a layout diagram of the conductive layers, which are disposed in the first sub-pixel PX1, and the wirings and the transistors connected to the conductive layers is illustrated, and in FIG. 6, a layout diagram of the conductive layers, which are disposed in one pixel PX, and the wirings and the transistors connected to the conductive layers is illustrated. In FIGS. 5 and 6, the first and second voltage wirings VDL and VSL are omitted. The sub-pixels PXn illustrated in FIG. 6 are illustrated by not separating the areas occupied by the sub-pixels and illustrated by separating the circuit element layers connected to the light-emitting diode EL disposed in each sub-pixel PXn.

Further, in FIG. 7, as a display element layer disposed in each pixel PX, the arrangement of a plurality of banks 40 and 45 and a plurality of contact electrodes 26 and 27 is illustrated in addition to the electrodes 21 and 22 and the light-emitting element 30, which constitute the light-emitting diode EL. FIG. 8 illustrates a cross section crossing both end portions of the light-emitting element 30, in addition to the first transistor T1, and FIG. 9 illustrates a cross section of the second to fourth transistors T2 to T4.

Referring to FIGS. 5 to 9 in conjunction with FIG. 4, the display device 10 may include the circuit element layer and the display element layer. The display element layer may be a layer in which a first electrode 21 and a second electrode 22, as well as the light-emitting element 30 of the light-emitting diode EL, are disposed, and the circuit element layer may be a layer in which the plurality of wirings, as well as pixel circuit elements for driving the light-emitting diode EL, are disposed. For example, the circuit element layer may include each of the transistors T1, T2, T3, and T4, in addition to the scan line SCL, the sensing line SSL, the alignment signal line ASL, the data line DTL, the initialization voltage wiring VIL, the first voltage wiring VDL, and the second voltage wiring VSL.

Specifically, the display device 10 includes a first substrate 11 on which the circuit element layer and the display element layer are disposed. The first substrate 11 may be an insulating substrate, and may be made of an insulating material such as glass, quartz, a polymer resin, or the like. In addition, the first substrate 11 may be a rigid substrate but may also be a flexible substrate that is bendable, foldable, and rollable.

A light-blocking layer BML may be disposed on the first substrate 11. The light-blocking layer BML is disposed to overlap a first active layer ACT1 of the first transistor T1 of the display device 10 in the third direction DR3. The light-blocking layer BML may include a material that blocks light, thereby preventing light from being incident on the active layer ACT1 of the first transistor T1. As an example, the light-blocking layer BML may be made of an opaque metal material that blocks light transmission. However, the present disclosure is not limited thereto, and the light-blocking layer BML may be omitted, or may be disposed to overlap active layers of the other transistors T1, T2, T3, and T4.

A buffer layer 12 may be entirely disposed on the first substrate 11, including the light-blocking layer BML. The buffer layer 12 may be formed on the first substrate 11 to protect each of the transistors T1, T2, T3, and T4 from moisture penetrating through the first substrate 11 that is vulnerable to moisture permeation, and may perform a surface planarization function. The buffer layer 12 may include a plurality of inorganic layers that are alternately stacked. For example, the buffer layer 12 may be formed as multiple layers in which inorganic layers including at least one of silicon oxide (SiOx), silicon nitride (SiNx), and silicon oxynitride (SiON) are alternately stacked.

A semiconductor layer is disposed on the buffer layer 12. The semiconductor layer may include active layers ACT1, ACT2, ACT3, and ACT4 of the transistors T1, T2, T3, and T4 (e.g., see FIG. 5). The first active layer ACT1 of the first transistor T1 may be disposed below of the center of each sub-pixel PXn and adjacent to the center of each sub-pixel PXn. A third active layer ACT3 of the third transistor T3 may be disposed on the upper side with respect to the center of each sub-pixel PXn, and a fourth active layer ACT4 of the fourth transistor T4 may be disposed below the first active layer ACT1. A second active layer ACT2 of the second transistor T2 may be disposed on a right side of the fourth active layer ACT4.

In one or more embodiments, the semiconductor layer may include polycrystalline silicon, single-crystal silicon, an oxide semiconductor, and the like. The polycrystalline silicon may be formed by crystallizing amorphous silicon. When the semiconductor layer includes an oxide semiconductor, each of the active layers ACT1, ACT2, ACT3, and ACT4 may include a plurality of conductive areas ACTa and ACTb and a channel area ACTc disposed therebetween. The oxide semiconductor may be an oxide semiconductor including indium (In). In one or more embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like.

In one or more embodiments, the semiconductor layer may include polycrystalline silicon. The polycrystalline silicon may be formed by crystallizing amorphous silicon, and in this case, the conductive areas of each of the active layers ACT1, ACT2, ACT3, and ACT4 may be doped areas doped with impurities. However, the present disclosure is not limited thereto.

A first gate insulating layer 13 is disposed on the semiconductor layer and the buffer layer 12. The first gate insulating layer 13 may include the semiconductor layer and may be disposed on the buffer layer 12. The first gate insulating layer 13 may serve as a gate insulating film of each of the transistors. The first gate insulating layer 13 may be formed as an inorganic layer including an inorganic material such as silicon oxide (SiOx), silicon nitride (SiNx), and silicon oxynitride (SiON), or in a stacked structure thereof.

The first gate conductive layer is disposed on the first gate insulating layer 13. The first gate conductive layer may include gate electrodes G1, G2, G3, and G4 of the transistors T1, T2, T3, and T4, the scan line SCL, the sensing line SSL, the alignment signal line ASL, the initialization voltage distribution line IDL, and a first capacitor electrode CSE1 of the storage capacitor. Because the description of the scan line SCL, the sensing line SSL, the alignment signal line ASL, and the initialization voltage distribution line IDL is the same as described above, a plurality of gate electrodes and the first capacitor electrode CSE1 will be described below.

The gate electrodes G1, G2, G3, and G4 of the first gate conductive layer may be disposed to partially overlap the active layers ACT of the transistors T1, T2, T3, and T4, respectively, in the third direction DR3. For example, a first gate electrode G1 of the first transistor T1 may be disposed to partially overlap the first active layer ACT1. The first gate electrode G1 may be connected to and integrated with the first capacitor electrode CSE1 of the storage capacitor, which will be described below.

A second gate electrode G2 of the second transistor T2 may be disposed to partially overlap the second active layer ACT2, a third gate electrode G3 of the third transistor T3 may be disposed to partially overlap the third active layer ACT3, and a fourth gate electrode G4 of the fourth transistor T4 may be disposed to partially overlap the fourth active layer ACT4. The second gate electrode G2 may be electrically connected to the alignment signal line ASL, and the alignment signal may be applied to the second transistor T2 during the manufacturing process of the display device 10. The third gate electrode G3 may be electrically connected to the scan line SCL, and the scan signal may be applied to the third transistor T3. The fourth gate electrode G4 may be electrically connected to the sensing line SSL, and the sensing signal or the alignment signal may be applied to the gate electrode of the fourth transistor T4.

The first capacitor electrode CSE1 of the storage capacitor Cst is disposed between the scan line SCL and the sensing line SSL. The first capacitor electrode CSE1 may be electrically connected to the first gate electrode G1 of the first transistor T1 and the source electrode of the third transistor T3. As an example, the first capacitor electrode CSE1 may be formed integrally with the first gate electrode G1, and may be connected to the source electrode of the third transistor T3 through a contact hole CT7.

In one or more embodiments, the first gate conductive layer may further include a fourth conductive pattern DP4 overlapping the data line DTL and the initialization voltage wiring VIL in a thickness direction (e.g., the third direction DR3). As will be described below, the drain electrode of the second transistor T2 may be connected to the data line DTL, and in some sub-pixels PXn, the initialization voltage wiring VIL may be disposed between the second active layer ACT2 of the second transistor T2 and the data line DTL. Because the data line DTL and the initialization voltage wiring VIL may be formed of the first data conductive layer disposed in the same layer, a bridge electrode connecting the data line DTL and the drain electrode of the second transistor T2 may be further required. According to one or more embodiments, the fourth conductive pattern DP4 disposed on the first gate conductive layer may include a bridge electrode configured to interconnect the drain electrode of the second transistor T2 disposed in one sub-pixel, for example, the first sub-pixel PX1 and the data line DTL connected to the second sub-pixel PX2. The fourth conductive pattern DP4 may be disposed to overlap the initialization voltage wiring VIL and the data line DTL in the thickness direction (e.g., the third direction DR3), and may be connected to the drain electrode of the second transistor T2. For example, the fourth conductive pattern DP4 may be in contact with the data line DTL and a drain electrode D2 of the second transistor T2 through a contact hole CT12 passing through the insulating layer disposed thereabove. The fourth conductive pattern DP4 may not be disposed for each sub-pixel PXn, and may be disposed for a sub-pixel PXn in which the initialization voltage wiring VIL is disposed. However, the present disclosure is not limited thereto.

The first gate conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

A first protective layer 15 is disposed on the first gate conductive layer and the first gate insulating layer 13. The first protective layer 15 may be disposed to cover the first gate conductive layer and may serve to protect the first gate conductive layer. The first protective layer 15 may be formed as an inorganic layer including an inorganic material such as silicon oxide (SiOx), silicon nitride (SiNx), and silicon oxynitride (SiON), or in a stacked structure thereof.

The first data conductive layer is disposed on the first protective layer 15. The first data conductive layer may include the source electrodes and the drain electrodes of the transistors T1, T2, T3, and T4, the data line DTL, the initialization voltage wiring VIL, and a second capacitor electrode CSE2 of the storage capacitor. In one or more embodiments, the first data conductive layer may include a plurality of conductive patterns DP1, DP2, DP3, and DP4. Because the description of the data line DTL and the initialization voltage wiring VIL is the same as described above, a plurality of source electrodes, a plurality of drain electrodes, the second capacitor electrode CSE2, and the conductive patterns will be described below.

A first source electrode S1 and a first drain electrode D1 of the first transistor T1 are disposed to partially overlap the first active layer ACT1 in the third direction DR3. The first source electrode S1 and the first drain electrode D1 may each be in contact with the first active layer ACT1 through a respective contact hole CT1 passing through the first protective layer 15 and the first gate insulating layer 13. In addition, the first source electrode S1 may be in contact with the light-blocking layer BML through a contact hole CT5 passing through the first protective layer 15, the first gate insulating layer 13, and the buffer layer 12. The first drain electrode D1 may be electrically connected to the first voltage wiring VDL, and the first source electrode S1 may be connected to the second capacitor electrode CSE2 of the storage capacitor connected to the first electrode 21 of the light-emitting diode EL. As an example, the first drain electrode D1 may be in direct contact with the first voltage wiring VDL through the contact hole, and the first source electrode S1 may be integrated with and connected to the second capacitor electrode CSE2. The first transistor T1 may be turned on in response to the data signal transmitted from the third transistor T3 to transmit the first power voltage to the first electrode 21.

A second source electrode S2 and the second drain electrode D2 of the second transistor T2 are disposed to partially overlap the second active layer ACT2 in the third direction DR3. The second source electrode S2 and the second drain electrode D2 may each be in contact with the second active layer ACT2 through a respective contact hole CT2 passing through the first protective layer 15 and the first gate insulating layer 13. The second drain electrode D2 may be integrated with and connected to the data line DTL, and the second source electrode S2 may be electrically connected to the second electrode 22 of the light-emitting diode EL, which will be described below. However, the present disclosure is not limited thereto, and as described above, the second drain electrode D2 may be electrically connected to the data line DTL through the fourth conductive pattern DP4. The second source electrode S2 may be in direct contact with the second electrode 22 through a contact hole CTA passing through the insulating layers disposed thereabove. The second transistor T2 may be turned on in response to the signal of the alignment signal line ASL to transmit the signal applied to the data line DTL to the second electrode 22.

A third source electrode S3 and a third drain electrode D3 of the third transistor T3 may be disposed to partially overlap the third active layer ACT3 in the third direction DR3. The third source electrode S3 and the third drain electrode D3 may each be in contact with the third active layer ACT3 through a respective contact hole CT3 passing through the first protective layer 15 and the first gate insulating layer 13. The third drain electrode D3 may be integrated with and connected to the data line DTL, and the third source electrode S3 may be in contact with the first capacitor electrode CSE1 through the contact hole CT7 passing through the first protective layer 15. The third transistor T3 may be turned on in response to the scan signal to transmit the data signal applied from the data line DTL to the first gate electrode G1 of the first transistor T1.

In one or more embodiments, the second transistor T2 and the third transistor T3 may each be connected to the data line DTL, but may be connected to different signal lines, and thus the second transistor T2 and the third transistor T3 of each sub-pixel PXn may not be concurrently (e.g., simultaneously) turned on. The second transistor T2 may be turned on in response to the signal of the alignment signal line ASL, and the third transistor T3 may be turned on in response to the signal of the scan line SCL. In addition, because the second transistor T2 is turned on only during the manufacturing process of the display device 10, even when the third transistor T3 is turned on to transmit the data signal to the first transistor T1 during the driving of the display device 10, a signal through the second transistor T2 is not transmitted to the second electrode 22 because the second transistor T2 is in a turn-off state. As will be described below, the second electrode 22 is connected to the second voltage wiring VSL so that the second power voltage is applied thereto, and while the light-emitting element 30 emits light, an electrical signal through the second transistor T2 may not be transmitted to the second electrode 22, and only the second power voltage may be transmitted to the second electrode 22.

The display device 10 may concurrently (e.g., simultaneously) turn on the second transistor T2 and the fourth transistor T4 during the manufacturing process thereof so that alignment signals may be transmitted to the first electrode 21 and the second electrode 22. The display device 10 may concurrently (e.g., simultaneously) turn on the second transistor T2 and the fourth transistor T4 by applying a signal to each of the alignment signal line ASL and the sensing line SSL during the manufacturing process thereof, and the second transistor T2 may maintain a turn-off state by not applying the signal to the alignment signal line ASL during the driving of the display device 10. That is, the second transistor T2 may be turned on only during the manufacturing process of the display device 10 and may be turned off during the driving of the display device 10.

A fourth source electrode S4 and a fourth drain electrode D4 of the fourth transistor T4 are disposed to partially overlap the fourth active layer ACT4 in the third direction DR3. The fourth source electrode S4 and the fourth drain electrode D4 may each be in contact with the fourth active layer ACT4 through a respective contact hole CT4 passing through the first protective layer 15 and the first gate insulating layer 13. The fourth drain electrode D4 may be in contact with the initialization voltage distribution line IDL through a contact hole CT9 passing through the first protective layer 15, and the fourth source electrode S4 may be connected to the second capacitor electrode CSE2 of the storage capacitor. As an example, the fourth source electrode S4 may be integrated with and connected to the second capacitor electrode CSE2. In addition, the initialization voltage distribution line IDL may be connected to the initialization voltage wiring VIL through the contact hole CT11 passing through the first protective layer 15 so that the initialization voltage may be connected thereto, and the initialization voltage may be transmitted to the fourth drain electrode D4. The fourth transistor T4 may be turned on in response to the sensing signal to transmit the initialization voltage to the first electrode 21 of the light-emitting diode EL through the second capacitor electrode CSE2.

The second capacitor electrode CSE2 of the storage capacitor Cst is disposed to overlap the first capacitor electrode CSE1 in the third direction DR3. The second capacitor electrode CSE2 may be integrated with and connected to the first source electrode S1 of the first transistor T1 and the fourth source electrode S4 of the fourth transistor T4. In addition, as will be described below, the second capacitor electrode CSE2 may be electrically connected to the first electrode 21 of the light-emitting diode EL through an electrode contact hole CTD passing through the insulating layers disposed thereabove. In the drawings, it is illustrated that the second capacitor electrode CSE2 is in direct contact with the first electrode 21, but the present disclosure is not limited thereto. In one or more embodiments, the second capacitor electrode CSE2 may be electrically connected to the first electrode 21 through an electrode formed of a conductive layer disposed thereabove.

A first conductive pattern DP1 is disposed to overlap the scan line SCL and the third gate electrode G3. The first conductive pattern DP1 may be in contact with the scan line SCL and the third gate electrode G3 through one or more contact holes CT6 passing through the first protective layer 15. The third gate electrode G3 may be electrically connected to the scan line SCL through the first conductive pattern DP1. A second conductive pattern DP2 is disposed to overlap the sensing line SSL and the fourth gate electrode G4. The second conductive pattern DP2 may be in contact with the sensing line SSL and the fourth gate electrode G4 through a contact hole CT8 passing through the first protective layer 15. The fourth gate electrode G4 may be electrically connected to the sensing line SSL through the second conductive pattern DP2. A third conductive pattern DP3 is disposed to overlap the alignment signal line ASL and the second gate electrode G2. The third conductive pattern DP3 may be in contact with the alignment signal line ASL and the second gate electrode G2 through one or more contact holes CT10 passing through the first protective layer 15. The second gate electrode G2 may be electrically connected to the alignment signal line ASL through the third conductive pattern DP3.

The first data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

A first interlayer insulating layer 17 is disposed on the first data conductive layer and the first protective layer 15. The first interlayer insulating layer 17 may serve as an insulating film between the first data conductive layer and the other layers disposed thereon. In addition, the first interlayer insulating layer 17 may cover the first data conductive layer and serve to protect the first data conductive layer. The first interlayer insulating layer 17 may be formed as an inorganic layer including an inorganic material such as silicon oxide (SiOx), silicon nitride (SiNx), and silicon oxynitride (SiON), or in a stacked structure thereof.

The second data conductive layer is disposed on the first interlayer insulating layer 17. The second data conductive layer includes the first voltage wiring VDL and the second voltage wiring VSL. However, the present disclosure is not limited thereto, and the second data conductive layer may further include a plurality of conductive patterns. The first voltage wiring VDL may be electrically connected to the first drain electrode D1 of the first transistor T1 through a contact hole passing through the first interlayer insulating layer 17. The first power voltage applied to the first voltage wiring VDL may be transmitted to the first electrode 21 of the light-emitting diode EL through the first transistor T1. The second voltage wiring VSL may be electrically connected to the second electrode 22 of the light-emitting diode EL and may transmit the second power voltage to the second electrode 22. Because the description of the first voltage wiring VDL and the second voltage wiring VSL is the same as described above, a detailed description thereof will be omitted.

The second data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

A first planarization layer 19 is disposed on the second data conductive layer. The first planarization layer 19 may include an organic insulating material, for example, an organic material such as polyimide (PI), and may perform a surface planarization function.

A plurality of first banks 40, the plurality of electrodes 21 and 22, the light-emitting elements 30, the second bank 45, and the plurality of contact electrodes 26 and 27 are disposed on the first planarization layer 19. In addition, a plurality of insulating layers 51, 52, 53, and 54 may be further disposed on the first planarization layer 19.

The plurality of first banks 40 may be disposed directly on the first planarization layer 19. The plurality of first banks 40 may extend in the second direction DR2 in each sub-pixel PXn, and may be disposed in the light-emitting area EMA so as not to extend to the other sub-pixels PXn adjacent in the second direction DR2. In addition, the plurality of first banks 40 may be disposed to be spaced from each other in the first direction DR1, and may form an area in which the light-emitting elements 30 are disposed therebetween. The plurality of first banks 40 may be disposed for each sub-pixel PXn to form linear patterns in the display area DPA of the display device 10. Two first banks 40 are illustrated in the drawing, but the present disclosure is not limited thereto. A larger number of first banks 40 may be further disposed depending on the number of the electrodes 21 and 22, which will be described below.

The first bank 40 may have a structure of which at least a portion protrudes on the basis of an upper surface of the first planarization layer 19. The protruding portion of the first bank 40 may have an inclined side surface, and light emitted from the light-emitting element 30 may travel toward the inclined side surface of the first bank 40. The electrodes 21 and 22 disposed on the first banks 40 may include a material having high reflectivity, and the light emitted from the light-emitting element 30 may be reflected from the electrodes 21 and 22 disposed on the side surfaces of the first banks 40 to be emitted in an upward direction with respect to the first planarization layer 19. That is, the first banks 40 may provide an area in which the light-emitting element 30 is disposed and concurrently (e.g., simultaneously) may serve as a reflective partition wall that reflects light emitted from the light-emitting element 30 upward. The side surface of the first bank 40 may be inclined in a linear shape, but the present disclosure is not limited thereto. The first bank 40 may have an outer surface that has a curved semi-circular or semi-elliptical shape. In one or more embodiments, the first banks 40 may include an organic insulating material such as polyimide (PI), but the present disclosure is not limited thereto.

The plurality of electrodes 21 and 22 are disposed on the first banks 40 and the first planarization layer 19. The plurality of electrodes 21 and 22 may include the first electrode 21 and the second electrode 22. The first electrode 21 and the second electrode 22 may extend in the second direction DR2 and may be disposed to be spaced from each other in the first direction DR1.

The first electrode 21 and the second electrode 22 may each extend in the second direction DR2 in the sub-pixel PXn and may be separated from other electrodes 21 and 22 in the cut-out area CBA. In one or more embodiments, the cut-out area CBA may be disposed between the light-emitting areas EMA of the sub-pixels PXn that are adjacent in the second direction DR2, and in the cut-out area CBA, the first electrode 21 and the second electrode 22 may be separated from another first electrode 21 and another second electrode 22 disposed in the sub-pixels PXn that are adjacent in the second direction DR2. However, the present disclosure is not limited thereto, and some of the electrodes 21 and 22 may be disposed to extend over the sub-pixel PXn adjacent in the second direction DR2 instead of being separated for each sub-pixel PXn, or only one of the first electrode 21 and the second electrode 22 may be separated.

The first electrode 21 may be electrically connected to the first transistor T1 and the fourth transistor T4, and the second electrode 22 may be electrically connected to the second voltage wiring VSL and the second transistor T2. For example, the first electrode 21 may be in contact with the first source electrode S1 or the second capacitor electrode CSE2 through a first electrode contact hole CTD passing through the first planarization layer 19 and the first interlayer insulating layer 17. The second electrode 22 may be connected to the second voltage wiring VSL through a second electrode contact hole CTS passing through the first planarization layer 19, and may be in contact with the second source electrode S2 through a third electrode contact hole CTA. As an example, the first electrode 21 and the second electrode 22 may overlap a portion of the second bank 45 extending in the first direction DR1, and the first electrode contact hole CTD and the second electrode contact hole CTS may be respectively formed in areas in which the electrodes 21 and 22 and the second banks 45 overlap. The third electrode contact hole CTA may be formed in a portion in which the second electrode 22 is disposed on the first planarization layer 19 in the light-emitting area EMA of each sub-pixel PXn. However, the present disclosure is not limited thereto. The position of the third electrode contact hole CTA may be variously modified as long as the second transistor T2 and the second electrode 22 may be electrically connected. In addition, the first electrode 21 and the second electrode 22 may be in contact with electrode conductive patterns disposed on the second data conductive layer, and as the electrode conductive patterns are disposed, the positions of the electrode contact holes CTD, CTS, and CTA may be changed. For example, all of the electrode contact holes CTD, CTS, and CTA may be formed in the light-emitting area EMA.

In the drawing, it is illustrated that one first electrode 21 and one second electrode 22 are disposed for each sub-pixel PXn, but the present disclosure is not limited thereto. In one or more embodiments, a larger number of first electrodes 21 and second electrodes 22 may be disposed for each sub-pixel PXn. In addition, the first electrode 21 and the second electrode 22 disposed in each sub-pixel PXn may not necessarily have a shape extending in one direction, and the first electrode 21 and the second electrode 22 may be disposed in various structures. For example, the first electrode 21 and the second electrode 22 may have a shape that is partially curved or bent or may be disposed so that any one electrode surrounds the other electrode.

Each of the first electrode 21 and the second electrode 22 may be disposed on the first banks 40. In one or more embodiments, each of the first electrode 21 and the second electrode 22 may be formed to have a width greater than that of the first bank 40. For example, each of the first electrode 21 and the second electrode 22 may be disposed to cover the outer surface of the first bank 40. Each of the first electrode 21 and the second electrode 22 may be disposed on a side surface of the first bank 40, and an interval between the first electrode 21 and the second electrode 22 may be less than an interval between the first banks 40. In addition, at least a partial area of each of the first electrode 21 and the second electrode 22 may be disposed directly on the first planarization layer 19.

Each of the electrodes 21 and 22 may include a conductive material with high reflectivity. For example, the material with high reflectivity of each of the electrodes 21 and 22 may include a metal such as silver (Ag), copper (Cu), and aluminum (Al) or may be an alloy including aluminum (Al), nickel (Ni), lanthanum (La), and the like. Each of the electrodes 21 and 22 may reflect light, which is emitted from the light-emitting element 30 and travels toward the side surface of the first bank 40, in an upward direction with respect to each sub-pixel PXn.

However, the present disclosure is not limited thereto, and each of the electrodes 21 and 22 may further include a transparent conductive material. For example, each of the electrodes 21 and 22 may include materials such as indium tin oxide (ITO), indium zinc oxide (IZO), and indium tin-zinc oxide (ITZO). In one or more embodiments, each of the electrodes 21 and 22 may have a structure in which one or more layers of the transparent conductive material and one or more layers of the metal material with high reflectivity are stacked, or each of the electrodes 21 and 22 may be formed as a single layer that includes the transparent conductive material and the metal material with high reflectivity. For example, each of the electrodes 21 and 22 may have a stacked structure such as ITO/Ag/ITO, ITO/Ag/IZO, or ITO/Ag/ITZO/IZO.

The plurality of electrodes 21 and 22 may be electrically connected to the light-emitting elements 30, and a suitable voltage (e.g., a predetermined voltage) may be applied to the plurality of electrodes 21 and 22 so that the light-emitting elements 30 emit light. For example, the plurality of electrodes 21 and 22 may be electrically connected to the light-emitting element 30 through the contact electrodes 26 and 27, which will be described below, and an electrical signal applied to the electrodes 21 and 22 may be transmitted to the light-emitting element 30 through the contact electrodes 26 and 27.

In one or more embodiments, one of the first electrode 21 and the second electrode 22 may be electrically connected to an anode of the light-emitting element 30, and the other one thereof may be electrically connected to a cathode of the light-emitting element 30. However, the present disclosure is not limited thereto, and the reverse may well be the case.

Further, each of the electrodes 21 and 22 may also be utilized in forming an electric field in the sub-pixel PXn to align the light-emitting elements 30. The light-emitting elements 30 may be disposed between the first electrode 21 and the second electrode 22 due to the electric field formed between the first electrode 21 and the second electrode 22. In one or more embodiments, the light-emitting elements 30 of the display device 10 may be sprayed onto the electrodes 21 and 22 through an inkjet printing process. When an ink including the light-emitting elements 30 is sprayed onto the electrodes 21 and 22, the alignment signals are applied to the electrodes 21 and 22 to generate the electric field. The light-emitting elements 30 dispersed in the ink may receive a dielectrophoretic force due to the electric field generated on the electrodes 21 and 22 and may be aligned on the electrodes 21 and 22.

A first insulating layer 51 is disposed on the first planarization layer 19, the first electrode 21, and the second electrode 22. The first insulating layer 51 may be disposed to partially cover the first electrode 21 and the second electrode 22, including an area between the first electrode 21 and the second electrode 22. For example, the first insulating layer 51 may be disposed to cover most of an upper surface of each of the first electrode 21 and the second electrode 22 but to expose a portion of the first electrode 21 and the second electrode 22. In other words, the first insulating layer 51 may be formed substantially entirely on the first planarization layer 19 and may include an opening partially exposing the first electrode 21 and the second electrode 22.

In one or more embodiments, a stepped portion may be formed in the first insulating layer 51 between the first electrode 21 and the second electrode 22 so that a portion of an upper surface of the first insulating layer 51 is recessed.

However, the present disclosure is not limited thereto. The first insulating layer 51 may form a flat upper surface so as to allow the light-emitting element 30 to be disposed.

The first insulating layer 51 may protect the first electrode 21 and the second electrode 22, and concurrently (e.g., simultaneously), insulate the first electrode 21 from the second electrode 22. In addition, the first insulating layer 51 may prevent the light-emitting element 30 disposed thereon from being damaged by direct contact with other members. However, the shape and structure of the first insulating layer 51 are not limited thereto.

The second bank 45 may be disposed on the first insulating layer 51. The second bank 45 may be disposed in a grid pattern, which includes portions extending in the first direction DR1 and the second direction DR2 in a plan view, on an entire surface of the display area DPA. The second bank 45 may be disposed over boundaries of the sub-pixels PXn to distinguish adjacent sub-pixels PXn. In addition, according to one or more embodiments, the second bank 45 may be formed to have a height greater than that of the first bank 40. The second bank 45 may serve to prevent inks from overflowing to adjacent sub-pixels PXn in an inkjet printing process of the manufacturing process of the display device 10. The second bank 45 may separate inks in which different light-emitting elements 30 are dispersed in different sub-pixels PXn so as to prevent the inks from being mixed with each other.

In addition, the second bank 45 may be disposed to surround the light-emitting area EMA and the cut-out area CBA disposed for each sub-pixel PXn to distinguish the light-emitting area EMA and the cut-out area CBA. The first electrode 21 and the second electrode 22 may extend in the second direction DR2 and may be disposed to cross a portion of the second bank 45 extending in the first direction DR1. In the portion of the second bank 45 extending in the second direction DR2, a portion disposed between the light-emitting areas EMA may have a width greater than that of a portion disposed between the cut-out areas CBA. Accordingly, an interval between the cut-out areas CBA may be smaller than an interval between the light-emitting areas EMA. Like the first bank 40, the second bank 45 may include polyimide (PI), but the present disclosure is not limited thereto.

The light-emitting element 30 may be disposed on the first insulating layer 51. The plurality of light-emitting elements 30 may be disposed to be spaced from each other in the second direction DR2, in which each of the electrodes 21 and 22 extends, and may be aligned to be substantially parallel to each other. The spacing interval between the light-emitting elements 30 is not particularly limited. In addition, the light-emitting element 30 may have a shape extending in one direction, and the extending direction of the light-emitting element 30 may be substantially perpendicular to the direction in which each of the electrodes 21 and 22 extends. However, the present disclosure is not limited thereto, and the light-emitting element 30 may be obliquely disposed without being perpendicular to the direction in which each of the electrodes 21 and 22 extends.

The light-emitting elements 30 may include light-emitting layers 36 having different materials to emit light having different wavelength bands to the outside. The display device 10 may include the light-emitting elements 30 emitting light in different wavelength bands. Accordingly, first color light, second color light, and third color light may be emitted from the first sub-pixel PX1, the second sub-pixel PX2, and the third sub-pixel PX3, respectively. However, the present disclosure is not limited thereto. In some cases, each of the sub-pixels PXn may include the same type of light-emitting elements 30 to emit light of substantially the same color.

In addition, both end portions of the light-emitting element 30 may be respectively disposed on the electrodes 21 and 22 between the first banks 40. For example, the light-emitting element 30 may be disposed such that one end portion thereof is placed on the first electrode 21 and the other end portion thereof is placed on the second electrode 22. A length at which the light-emitting element 30 extends may be greater than the interval between the first electrode 21 and the second electrode 22, and both end portions of the light-emitting element 30 may be disposed on the first electrode 21 and the second electrode 22.

The light-emitting element 30 may include a plurality of layers disposed therein in a direction perpendicular to an upper surface of the first substrate 11 or the first planarization layer 19. The light-emitting element 30 of the display device 10 may be disposed such that one direction, in which the light-emitting element 30 extends, is parallel to the first planarization layer 19, and the plurality of semiconductor layers included in the light-emitting element 30 may be sequentially disposed in the direction parallel to the upper surface of the first planarization layer 19. However, the present disclosure is not limited thereto. In some cases, when the light-emitting element 30 has a different structure, the plurality of layers may be disposed in a direction perpendicular to the first planarization layer 19.

In addition, both end portions of the light-emitting element 30 may be in contact with the contact electrodes 26 and 27. According to one or more embodiments, because an insulating film 38 is not formed and the semiconductor layer is partially exposed on surfaces of end portions in one direction in which the light-emitting element 30 extends, the exposed semiconductor layer may be in contact with the contact electrodes 26 and 27. However, the present disclosure is not limited thereto. In some cases, in the light-emitting element 30, at least a partial area of the insulating film 38 may be removed, and the insulating film 38 may be removed to partially expose side surfaces of both end portions of the semiconductor layers. The exposed side surfaces of the semiconductor layer may be in direct contact with the contact electrodes 26 and 27.

A second insulating layer 52 may be partially disposed on the light-emitting element 30. As an example, the second insulating layer 52 may be disposed to partially surround an outer surface (e.g., an outer peripheral or circumferential surface) of the light-emitting element 30 and disposed not to cover one end portion and the other end portion of the light-emitting element 30. The contact electrodes 26 and 27, which will be described below, may be in contact with both end portions of the light-emitting element 30, which are not covered by the second insulating layer 52. A portion of the second insulating layer 52 disposed on the light-emitting element 30 may be disposed to extend in the second direction DR2 on the first insulating layer 51 in a plan view, thereby forming a linear or island-shaped pattern in each sub-pixel PXn. The second insulating layer 52 may protect the light-emitting element 30 and concurrently (e.g., simultaneously) fix the light-emitting element 30 in the manufacturing process of the display device 10.

The plurality of contact electrodes 26 and 27 and a third insulating layer 53 may be disposed on the second insulating layer 52.

The plurality of contact electrodes 26 and 27 may have a shape extending in one direction. A first contact electrode 26 and a second contact electrode 27 of the contact electrodes

26 and 27 may be disposed on a portion of the first electrode 21 and a portion of the second electrode 22, respectively. The first contact electrode 26 may be disposed on the first electrode 21, the second contact electrode 27 may be disposed on the second electrode 22, and each of the first contact electrode 26 and the second contact electrode 27 may have a shape extending in the second direction DR2. The first contact electrode 26 and the second contact electrode 27 may be spaced from each other in the first direction DR1, and may form a stripe pattern in the light-emitting area EMA of each sub-pixel PXn.

In one or more embodiments, a width of each of the first contact electrode 26 and the second contact electrode 27, which is measured in one direction, may be smaller than or equal to a width of each of the first electrode 21 and the second electrode 22, which is measured in the one direction. The first contact electrode 26 and the second contact electrode 27 may be disposed to be in contact with one end portion and the other end portion of the light-emitting element 30, respectively, and concurrently (e.g., simultaneously), to cover a portion of the upper surface of the first electrode 21 and a portion of the upper surface of the second electrode 22, respectively.

The plurality of contact electrodes 26 and 27 may each be in contact with the light-emitting element 30, and may be respectively in contact with the electrodes 21 and 22. The semiconductor layer may be exposed on surfaces of both end portions in a direction in which the light-emitting element 30 extends, and the first contact electrode 26 and the second contact electrode 27 may be in contact with the surfaces of the end portions of the light-emitting element 30 at which the semiconductor layer is exposed. One end portion of the light-emitting element 30 may be electrically connected to the first electrode 21 through the first contact electrode 26, and the other end portion thereof may be electrically connected to the second electrode 22 through the second contact electrode 27.

In the drawing, it is illustrated that one first contact electrode 26 and one second contact electrode 27 are disposed in one sub-pixel PXn, but the present disclosure is not limited thereto. The number of the first contact electrodes 26 and second contact electrodes 27 may vary depending on the number of the first electrodes 21 and second electrodes 22 disposed in each sub-pixel PXn.

The third insulating layer 53 is disposed on the first contact electrode 26. The third insulating layer 53 may electrically insulate the first contact electrode 26 and the second contact electrode 27 from each other. The third insulating layer 53 may be disposed to cover the first contact electrode 26 and may not be disposed on the other end portion of the light-emitting element 30 so that the light-emitting element 30 may be in contact with the second contact electrode 27. The third insulating layer 53 may be partially in contact with the first contact electrode 26 and the second insulating layer 52 at an upper surface of the second insulating layer 52. A side surface of the third insulating layer 53 in a direction in which the second electrode 22 is disposed may be aligned with one side surface of the second insulating layer 52. In addition, the third insulating layer 53 may also be disposed in a non-light-emitting area, for example, on the first insulating layer 51 disposed on the first planarization layer 19. However, the present disclosure is not limited thereto.

The second contact electrode 27 is disposed on the second electrode 22, the second insulating layer 52, and the third insulating layer 53. The second contact electrode 27 may be in contact with the other end portion of the light-emitting element 30 and the exposed upper surface of the second electrode 22. The other end portion of the light-emitting element 30 may be electrically connected to the second electrode 22 through the second contact electrode 27.

The second contact electrode 27 may be partially in contact with the second insulating layer 52, the third insulating layer 53, the second electrode 22, and the light-emitting element 30. The first contact electrode 26 and the second contact electrode 27 may not be in contact with each other due to the second insulating layer 52 and the third insulating layer 53. However, the present disclosure is not limited thereto, and in some cases, the third insulating layer 53 may be omitted.

The contact electrodes 26 and 27 may include a conductive material. For example, the contact electrodes 26 and 27 may include ITO, IZO, ITZO, aluminum (Al), or the like. As an example, the contact electrodes 26 and 27 may include a transparent conductive material, and light emitted from the light-emitting element 30 may pass through the contact electrodes 26 and 27 and travel toward the electrodes 21 and 22. However, the present disclosure is not limited thereto.

A fourth insulating layer 54 may be entirely disposed on the first substrate 11. The fourth insulating layer 54 may serve to protect members disposed on the first substrate 11 from an external environment.

Each of the first insulating layer 51, the second insulating layer 52, the third insulating layer 53, and the fourth insulating layer 54 may include an inorganic insulating material or an organic insulating material. In one or more embodiments, the first insulating layer 51, the second insulating layer 52, the third insulating layer 53, and the fourth insulating layer 54 may each include an inorganic insulating material such as silicon oxide (SiOx), silicon nitride (SiNx), silicon oxynitride (SiOxNy), aluminum oxide (Al2O3), aluminum nitride (AlN), or the like. Alternatively, the first insulating layer 51, the second insulating layer 52, the third insulating layer 53, and the fourth insulating layer 54 may each include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

In one or more embodiments, the first electrode 21 and the second electrode 22 may transmit the driving signal to the light-emitting element 30 during the driving of the display device 10 so that the light-emitting element 30 emits light. During the driving of the display device 10 or in a driving mode, the first power voltage may be transmitted to the first electrode 21 through the first transistor T1, and the second power voltage may be transmitted to the second electrode 22 through the second voltage wiring VSL. In addition, the data signal may be applied to the first gate electrode G1 of the first transistor T1 through the third transistor T3, and the initialization voltage may be transmitted to the first source electrode S1 of the first transistor T1 or the first electrode 21 through the fourth transistor T4.

During the manufacturing process of the display device 10, alignment signals are applied to the first electrode 21 and the second electrode 22. When the alignment signals are applied to the first electrode 21 and the second electrode 22, an electric field may be generated between the electrodes 21 and 22 due to a voltage difference between the electrodes 21 and 22. In the manufacturing process or manufacturing mode of the display device 10, the light-emitting elements

30 may be sprayed onto the electrodes 21 and 22 in a state of being dispersed in an ink, and the light-emitting elements 30 receiving a dielectrophoretic force due to the electric field may be disposed such that both end portions thereof are placed on the electrodes 21 and 22 while changing an alignment direction and position thereof. That is, according to the driving or manufacturing process of the display device 10, different electrical signals may be transmitted to the first electrode 21 and the second electrode 22.

In the manufacturing process of the display device 10, when each of the electrodes 21 and 22 is formed in a separate state and the alignment signals are applied through the first transistor T1 and the second voltage wiring VSL connected thereto, a voltage drop of the signal applied through the second voltage wiring VSL or a damage of the first transistor T1 due to an alignment voltage may occur. In order to prevent this, the alignment signals may be applied to the electrodes 21 and 22 through separate pads after forming each of the electrodes 21 and 22 disposed in the plurality of pixels PX or sub-pixels PXn in a connected state. However, in order for the light-emitting elements 30 to individually emit light for each sub-pixel PXn, a process of separating each of the electrodes 21 and 22 for each sub-pixel PXn may be necessary.

Unlike the transistor to which the driving signal for driving the light-emitting element 30 is applied, the display device 10 according to one or more embodiments may further include a transistor to which the alignment signal for aligning the light-emitting element 30 is applied. The second transistor T2 and the fourth transistor T4 of the display device 10 may be electrically connected to the second electrode 22 and the first electrode 21, respectively, and the alignment signals for aligning the light-emitting element 30 during the manufacturing process of the display device 10 may be applied respectively through the second transistor T2 and the fourth transistor T4. Each of the second transistor T2 and the fourth transistor T4 has the gate electrode that may be connected to the alignment signal line ASL or the sensing line SSL, and may be turned on at the same timing. The alignment signals may be applied to the first electrode 21 and the second electrode 22 respectively through the data line DTL and the initialization voltage wiring VIL by turning on the second transistor T2 and the fourth transistor T4 during the manufacturing process of the display device 10.

In particular, the second transistor T2 may be a transistor that does not substantially transmit a signal to the second electrode 22 when the display device 10 is driven. The fourth transistor T4 may be turned on when the corresponding sub-pixel PXn is driven to transmit the initialization voltage, but the second transistor T2 may maintain a turn-off state when the corresponding sub-pixel PXn is driven, or may be turned on but may not transmit an electrical signal. The signal applied to the alignment signal line ASL may be applied through the pad WPD_AS disposed in the pad area PDA, and the signal may not be applied during the driving of the display device 10. The alignment signal line ASL may be used during the manufacturing process, and thereafter, the alignment signal line ASL may remain as a floating wiring during driving. Because the second transistor T2 is not turned on in response to a signal of the alignment signal line ASL even when the second drain electrode D2 of the second transistor T2 is connected to the data line DTL, the signal of the second transistor T2 may not be transmitted when the light-emitting element 30 is driven.

Further, the second transistor T2 connected to the second electrode 22 is connected to the data line DTL to which the data signal is applied at a different timing from the data line DTL to which the data signal for causing the corresponding sub-pixel PXn to emit light is applied. Even when the second transistor T2 is turned on during the driving of the display device 10, a signal for causing the corresponding sub-pixel PXn to emit light may not be applied. Accordingly, the second transistor T2 may apply the alignment signal to the second electrode 22 during the manufacturing process of the display device 10, but may not transmit an electrical signal to the second electrode 22 during the driving of the display device 10.

However, the present disclosure is not limited thereto, and in the display device 10, the alignment signal line ASL may be omitted, and the second transistor T2 may be connected to the sensing line SSL. Although the second transistor T2 and the fourth transistor T4 may be concurrently (e.g., simultaneously) turned on in response to the sensing line SSL, the influence on the light emission of each sub-pixel PXn may be small even when the second transistor T2 is turned on during the driving of the display device 10.

Because each of the electrodes 21 and 22 may be formed in a separate state as the display device 10 includes the second transistor T2, an additional separation process of the electrodes 21 and 22 may be omitted after the light-emitting elements 30 are aligned. In addition, because the second transistor T2 to which an electrical signal is not substantially transmitted in the driving mode of the display device 10 is included, the alignment signal may be applied through the second transistor T2, and thus the first transistor T1, which is a driving transistor, may be prevented from being damaged by the alignment signal in the manufacturing mode of the display device 10.

Figure 10:
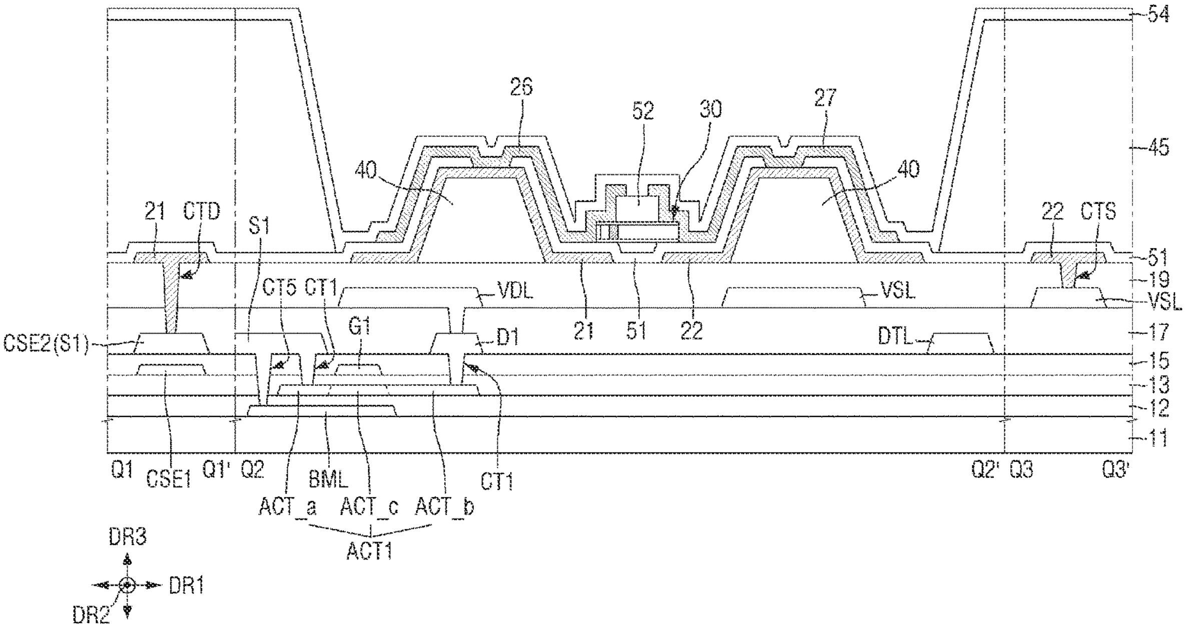
FIG. 10 is a schematic cross-sectional view illustrating a portion of a display device according to one or more embodiments.

FIG. 10 is a schematic cross-sectional view illustrating a portion of a display device according to one or more embodiments.

Referring to FIG. 10, a third insulating layer 53 may be omitted from a display device 10. A portion of a second contact electrode 27 may be disposed directly on a second insulating layer 52, and a first contact electrode 26 and the second contact electrode 27 may be spaced from each other on the second insulating layer 52. In the display device 10 according to one or more embodiments, even though the third insulating layer 53 is omitted, the second insulating layer 52 may include an organic insulating material to serve to fix a light-emitting element 30. In addition, the first contact electrode 26 and the second contact electrode 27 may be concurrently (e.g., simultaneously) formed through a patterning process. The embodiment of FIG. 10 is the same as the embodiment of FIG. 8 except that the third insulating layer 53 is omitted. Hereinafter, repeated descriptions will be omitted.

Figure 11:
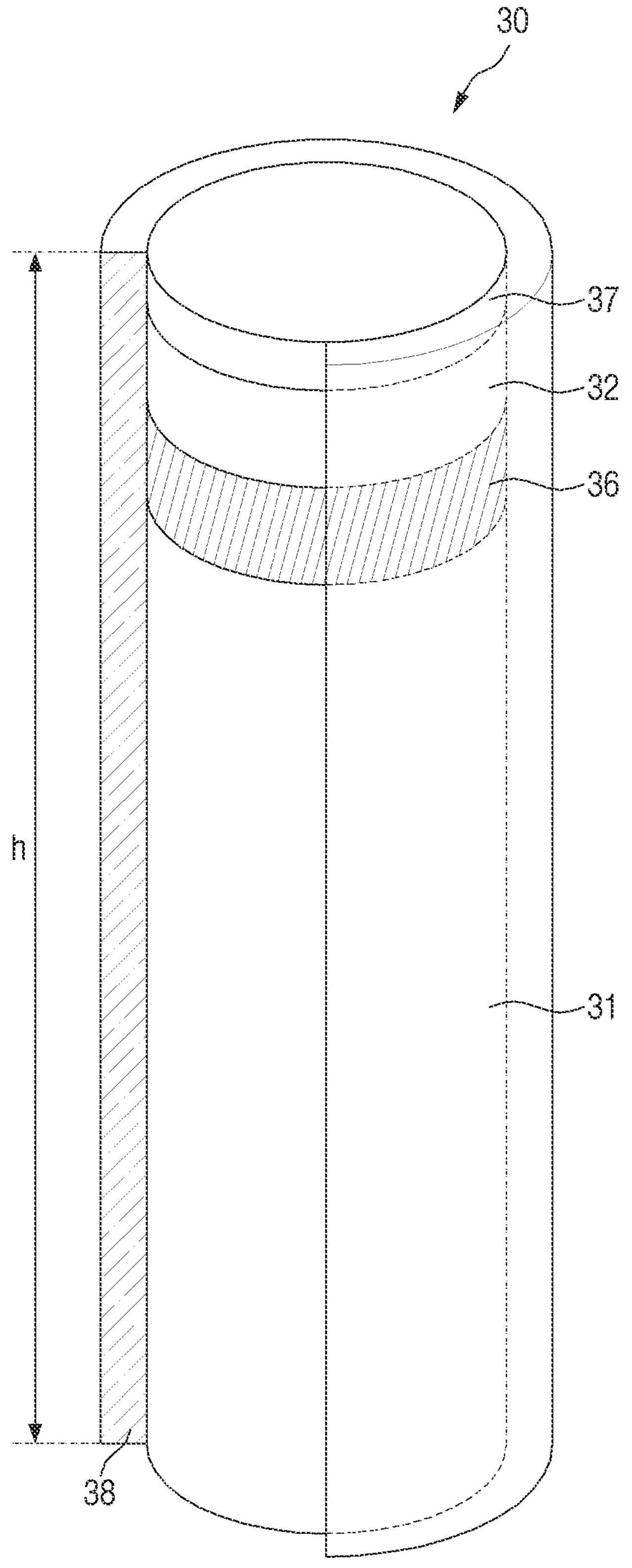
FIG. 11 is a schematic cutaway view of a light-emitting element according to one or more embodiments.

FIG. 11 is a schematic cutaway view of the light-emitting element according to one or more embodiments.

The light-emitting element 30 may be a light-emitting diode (LED), and specifically, may be an inorganic LED having a size of a micrometer or nanometer unit and made of an inorganic material. The inorganic LED may be aligned between two electrodes in which a polarity is formed when an electric field is formed in a specific direction between the two electrodes facing (e.g., opposing) each other. The light-emitting element 30 may be aligned between two electrodes due to the electric field formed between the two electrodes.

The light-emitting element 30 according to one or more embodiments may have a shape extending in one direction. The light-emitting element 30 may have a shape of a rod, a wire, a tube, or the like. In one or more embodiments, the light-emitting element 30 may have a cylindrical shape or a rod shape. However, the shape of the light-emitting element 30 is not limited thereto, and the light-emitting element 30 may have various forms such as a shape of a cube, a rectangular parallelepiped, a polygonal pillar such as a hexagonal pillar, or the like or a shape that extends in one direction and has a partially inclined outer surface. A plurality of semiconductors included in the light-emitting element 30, which will be described below, may have a structure in which the semiconductors are sequentially disposed or stacked in the one direction.

The light-emitting element 30 may include a semiconductor layer doped with an arbitrary conductivity type (for example, p-type or n-type) impurity. The semiconductor layer may emit light at a specific wavelength band by receiving an electrical signal applied from an external power source.

Referring to FIG. 11, the light-emitting element 30 may include a first semiconductor layer 31, a second semiconductor layer 32, a light-emitting layer 36, an electrode layer 37, and an insulating film 38.

The first semiconductor layer 31 may be an n-type semiconductor. As an example, when the light-emitting element 30 emits light in a blue wavelength band, the first semiconductor layer 31 may include a semiconductor material having a chemical formula of AlxGayIn1-x-yN (0<=x<=1, 0<=y<=1, and 0<=x+y<=1). For example, the semiconductor material may be one or more of n-type doped AlGaInN, GaN, AlGaN, InGaN, AlN, and InN. The first semiconductor layer 31 may be doped with an n-type dopant. As an example, the n-type dopant may be Si, Ge, Sn, or the like. In one or more embodiments, the first semiconductor layer 31 may include n-GaN doped with n-type Si. The first semiconductor layer 31 may have a length ranging from 1.5 μm to 5 μm, but the present disclosure is not limited thereto.

The second semiconductor layer 32 is disposed on the light-emitting layer 36 to be described below. The second semiconductor layer 32 may be a p-type semiconductor, and as an example, when the light-emitting element 30 emits light in a blue or green wavelength band, the second semiconductor layer 32 may include a semiconductor material having a chemical formula of AlxGayIn1-x-yN (0<=x<=1, 0<=y<=1, and 0<=x+y<=1). For example, the semiconductor material may be one or more of p-type doped AlGaInN, GaN, AlGaN, InGaN, AlN, and InN. The second semiconductor layer 32 may be doped with a p-type dopant, and as an example, the p-type dopant may be Mg, Zn, Ca, Se, Ba, or the like. In one or more embodiments, the second semiconductor layer 32 may include p-GaN doped with p-type Mg. The second semiconductor layer 32 may have a length ranging from 0.05 μm to 0.10 μm, but the present disclosure is not limited thereto.

In the drawing (e.g., see FIG. 11), the first semiconductor layer 31 and the second semiconductor layer 32 are illustrated as being formed as one layer, but the present disclosure is not limited thereto. According to one or more embodiments, each of the first semiconductor layer 31 and the second semiconductor layer 32 may further include a larger number of layers, e.g., a clad layer or a tensile strain barrier reducing (TSBR) layer according to the material of the light-emitting layer 36.

The light-emitting layer 36 is disposed between the first semiconductor layer 31 and the second semiconductor layer 32. The light-emitting layer 36 may include a material having a single or multi-quantum well structure. When the light-emitting layer 36 includes a material having a multi-quantum well structure, the light-emitting layer 36 may have a structure in which a plurality of quantum layers and a plurality of well layers are alternately stacked. The light-emitting layer 36 may emit light due to combination of electron-hole pairs according to an electrical signal applied through the first semiconductor layer 31 and the second semiconductor layer 32. As an example, when the light-emitting layer 36 emits light in a blue wavelength band, the light-emitting layer 36 may include a material such as AlGaN, AlGaInN, or the like. In particular, in a case in which the light-emitting layers 36 has the multi-quantum well structure in which the quantum layers and the well layers are alternately stacked, the quantum layer may include a material such as AlGaN or AlGaInN, and the well layer may include a material such as GaN or AlInN. In one or more embodiments, the light-emitting layer 36 may include AlGaInN as the quantum layer, and the light-emitting layer 36 may emit blue light having a center wavelength band ranging from 450 nm to 495 nm.

However, the present disclosure is not limited thereto, and the light-emitting layer 36 may have a structure in which semiconductor materials with high bandgap energy and semiconductor materials with low bandgap energy are alternately stacked or may include other Group III to V semiconductor materials according to a wavelength band of light being emitted. The light emitted by the light-emitting layer 36 is not limited to light in the blue wavelength band, and the light-emitting layer 36 may also emit light in the red or green wavelength band in some cases. The light-emitting layer 36 may have a length ranging from 0.05 μm to 0.10 μm, but the present disclosure is not limited thereto.

In one or more embodiments, the light emitted from the light-emitting layer 36 may be emitted to both side surfaces of the light-emitting element 30 as well as an outer surface of the light-emitting element 30 in a length direction. Directivity of the light emitted from the light-emitting layer 36 is not limited to one direction.

The electrode layer 37 may be an ohmic contact electrode. However, the present disclosure is not limited thereto, and the electrode layer 37 may also be a Schottky contact electrode. The light-emitting element 30 may include at least one electrode layer 37. Although the light-emitting element 30 is illustrated in FIG. 11 as including one electrode layer 37, the present disclosure is not limited thereto. In some cases, the light-emitting element 30 may include a larger number of electrode layers 37, or the electrode layer 37 may be omitted. The following description of the light-emitting element 30 may be similarly (or identically) applied even when the number of electrode layers 37 is changed or the light-emitting element 30 further includes other structures.

In the display device 10 according to one or more embodiments, when the light-emitting element 30 is electrically connected to an electrode or a contact electrode, the electrode layer 37 may reduce resistance between the light-emitting element 30 and the electrode or between the light-emitting element 30 and the contact electrode. The electrode layer 37 may include a conductive metal. For example, the electrode layer 37 may include at least one from among aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include an n-type or p-type doped semiconductor material. The electrode layer 37 may include the same material or different materials, but the present disclosure is not limited thereto.

The insulating film 38 is disposed to be around (e.g., to surround) outer surfaces (e.g., the outer peripheral or circumferential surfaces) of the plurality of semiconductor layers and electrode layers. In one or more embodiments, the insulating film 38 may be disposed to be around (e.g., to surround) at least an outer surface (e.g., the outer peripheral or circumferential surface) of the light-emitting layer 36 and may extend in one direction in which the light-emitting element 30 extends. The insulating film 38 may serve to protect the members. As an example, the insulating film 38 may be formed to be around (e.g., to surround) side surfaces of the members and may be formed to expose both end portions of the light-emitting element 30 in the length direction thereof.

In the drawing, the insulating film 38 is illustrated as being formed to extend in the length direction of the light-emitting element 30 to cover from the first semiconductor layer 31 to a side surface of the electrode layer 37, but the present disclosure is not limited thereto. Because the insulating film 38 covers only the outer surfaces (e.g., the outer peripheral or circumferential surfaces) of some semiconductor layers, including the light-emitting layer 36 or covers only a portion of an outer surface of the electrode layer 37, the outer surface (e.g., the outer peripheral or circumferential surface) of the electrode layer 37 may be partially exposed. In addition, an upper surface of the insulating film 38 may be formed to be rounded in cross section in an area adjacent to at least one end portion of the light-emitting element 30.

The insulating film 38 may have a thickness ranging from 10 nm to 1.0 μm, but the present disclosure is not limited thereto. In one or more embodiments, the thickness of the insulating film 38 may be about 40 nm.

The insulating film 38 may include materials having insulation properties, for example, silicon oxide (SiOx), silicon nitride (SiNx), silicon oxynitride (SiOxNy), aluminum nitride (AlN), aluminum oxide (Al2O3), and the like. Accordingly, it is possible to prevent an electrical short circuit that may occur when the light-emitting layer 36 is in direct contact with an electrode through which an electrical signal is transmitted to the light-emitting element 30. In addition, because the insulating film 38 protects the outer surface of the light-emitting element 30, including the light-emitting layer 36, it is possible to prevent degradation in light emission efficiency.

In addition, in one or more embodiments, the outer surface of the insulating film 38 may be surface-treated. The light-emitting elements 30 dispersed in ink (e.g., a predetermined ink) may be sprayed onto electrodes and aligned thereon. Here, in order to maintain a state in which the light-emitting elements 30 are dispersed in the ink without aggregating with other adjacent light-emitting elements 30, the surface of the insulating film 38 may be treated to be hydrophobic or hydrophilic.

The light-emitting element 30 may have a length h ranging from 1 μm to 10 μm or from 2 μm to 6 μm, and preferably from 3 μm to 5 μm. Further, a diameter of the light-emitting element 30 may range from 300 nm to 700 nm, and an aspect ratio of the light-emitting element 30 may range from 1.2 to 100. However, the present disclosure is not limited thereto, and the plurality of light-emitting elements 30 included in the display device 10 may have different diameters according to a composition difference of the light-emitting layer 36. In one or more embodiments, the diameter of the light-emitting element 30 may have a range of about 500 nm.

Hereinafter, a manufacturing process of the display device 10 according to one or more embodiments will be described with further reference to other drawings.

A manufacturing method of the display device 10 according to one or more embodiments may include spraying an ink including light-emitting elements 30 on electrodes 21 and 22, and applying alignment signals to the electrodes 21 and 22 to mount the light-emitting element 30 on the electrodes 21 and 22. Unlike when the display device 10 is driven, the alignment signals applied to the first electrode 21 and the second electrode 22 may be transmitted respectively through a fourth transistor T4 and a second transistor T2. Each of the second transistor T2 and the fourth transistor T4 has a gate electrode connected to an alignment signal line ASL or a sensing line SSL, and may be concurrently (e.g., simultaneously) turned on. The alignment signals applied to a data line DTL and an initialization voltage wiring VIL may be transmitted to the second electrode 22 and the first electrode 21 respectively through the turned-on second transistor T2 and fourth transistor T4. Hereinafter, the manufacturing process of the display device 10 will be described with further reference to other drawings.

Figure 12:
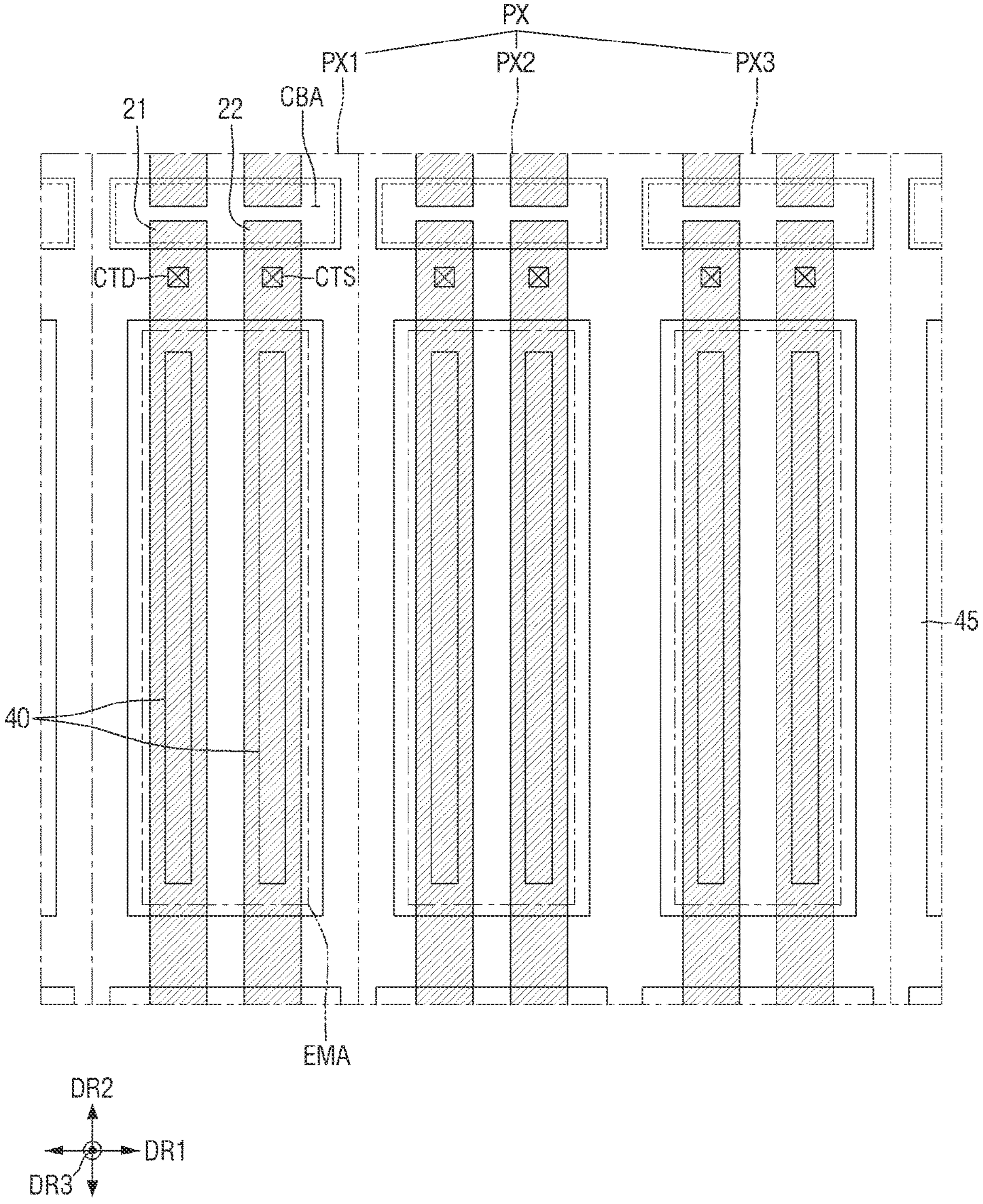
FIGS. 12 and 13 are schematic plan views illustrating some operations of a manufacturing process of the display device according to one or more embodiments.
Figure 13:
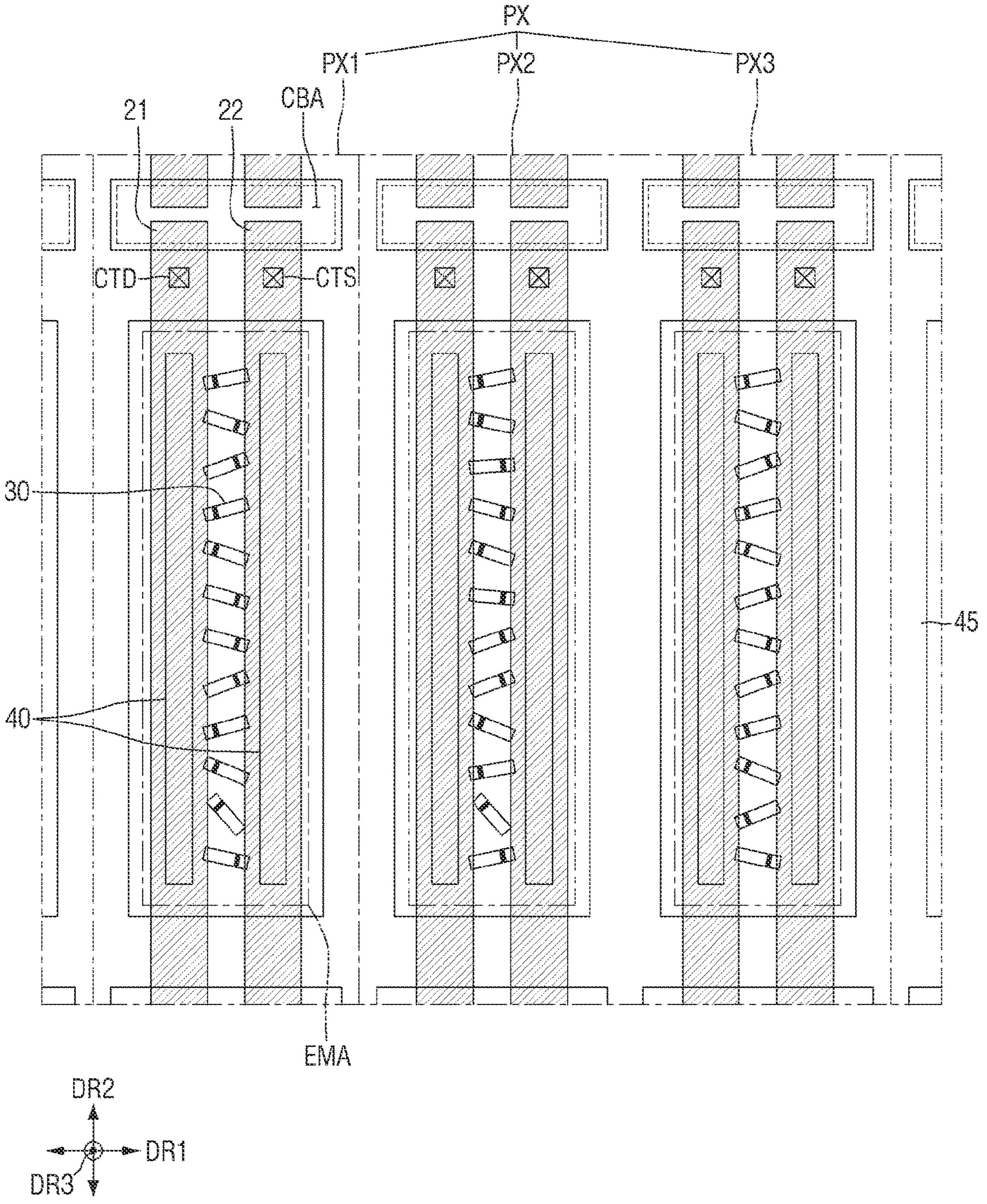

FIGS. 12 and 13 are schematic views illustrating some operations of a manufacturing process of the display device according to one or more embodiments.

First, referring to FIG. 12, a plurality of electrodes 21 and 22, and a first insulating layer 51 and a second bank 45 disposed on the electrodes 21 and 22 are formed. Each of the first electrode 21 and the second electrode 22 is disposed to extend in the second direction DR2. Each of the electrodes 21 and 22 extends in the second direction DR2 in a light-emitting area EMA of each sub-pixel PXn, and may be separated from the other electrodes 21 and 22 at a cut-out area CBA. The description of the arrangement and shape of the first insulating layer 51, a first bank 40, and the second bank 45 are the same as described above.

Subsequently, referring to FIG. 13, ink in which light-emitting elements 30 are dispersed is sprayed on the electrodes 21 and 22 disposed in the light-emitting area EMA surrounded by the second bank 45. In one or more embodiments, the light-emitting elements 30 are prepared in a state of being dispersed in the ink, and may be sprayed onto the electrodes 21 and 22 by a printing process using an inkjet printing device. The ink sprayed through the inkjet printing device may be seated in an area surrounded by the second bank 45. The light-emitting elements 30 may have a shape extending in one direction and may have an alignment direction in which one end portion thereof is directed. As shown in the drawing, a plurality of light-emitting elements 30 dispersed in the ink may have a random alignment direction rather than a constant alignment direction. Some light-emitting elements 30 may be placed between the electrodes 21 and 22 and the second bank 45, or above the electrodes 21 and 22, which is an area other than an area between the electrodes 21 and 22.

In order to align the light-emitting elements 30 on the electrodes 21 and 22, alignment signals are applied to each of the electrodes 21 and 22 to generate an electric field between the electrodes 21 and 22. Each of the light-emitting elements 30 dispersed in the ink may be disposed such that both end portions thereof are placed on the electrodes 21 and 22 while the position and alignment direction thereof are changed by the electric field.

Figure 14:
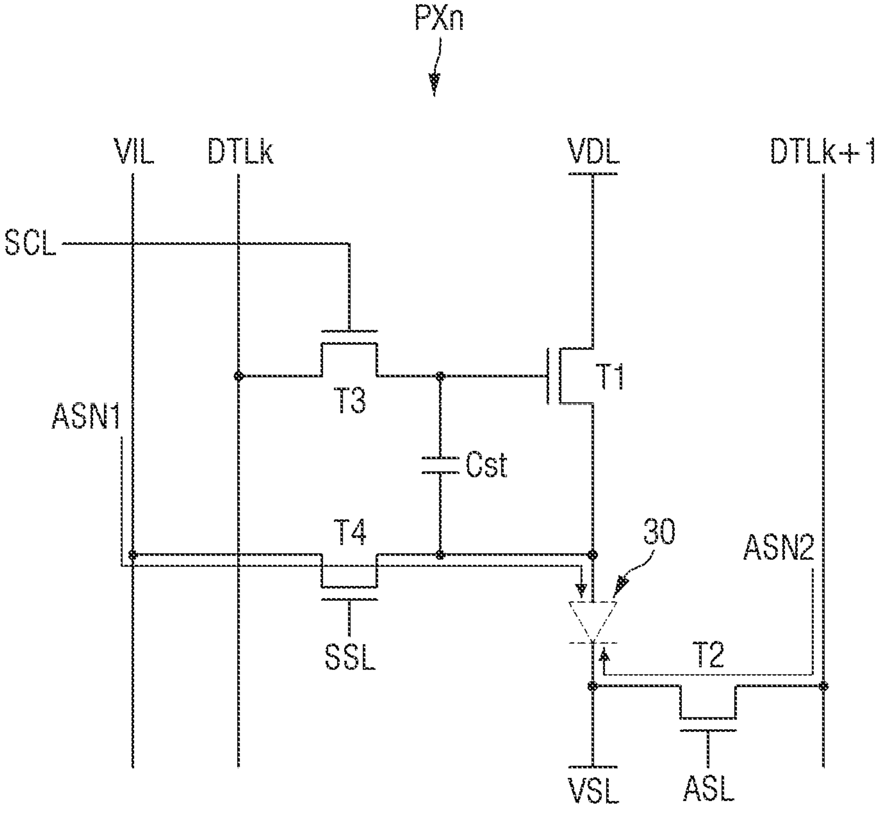
FIG. 14 is a schematic circuit diagram illustrating one operation of a manufacturing process of the display device according to one or more embodiments.
Figure 15:
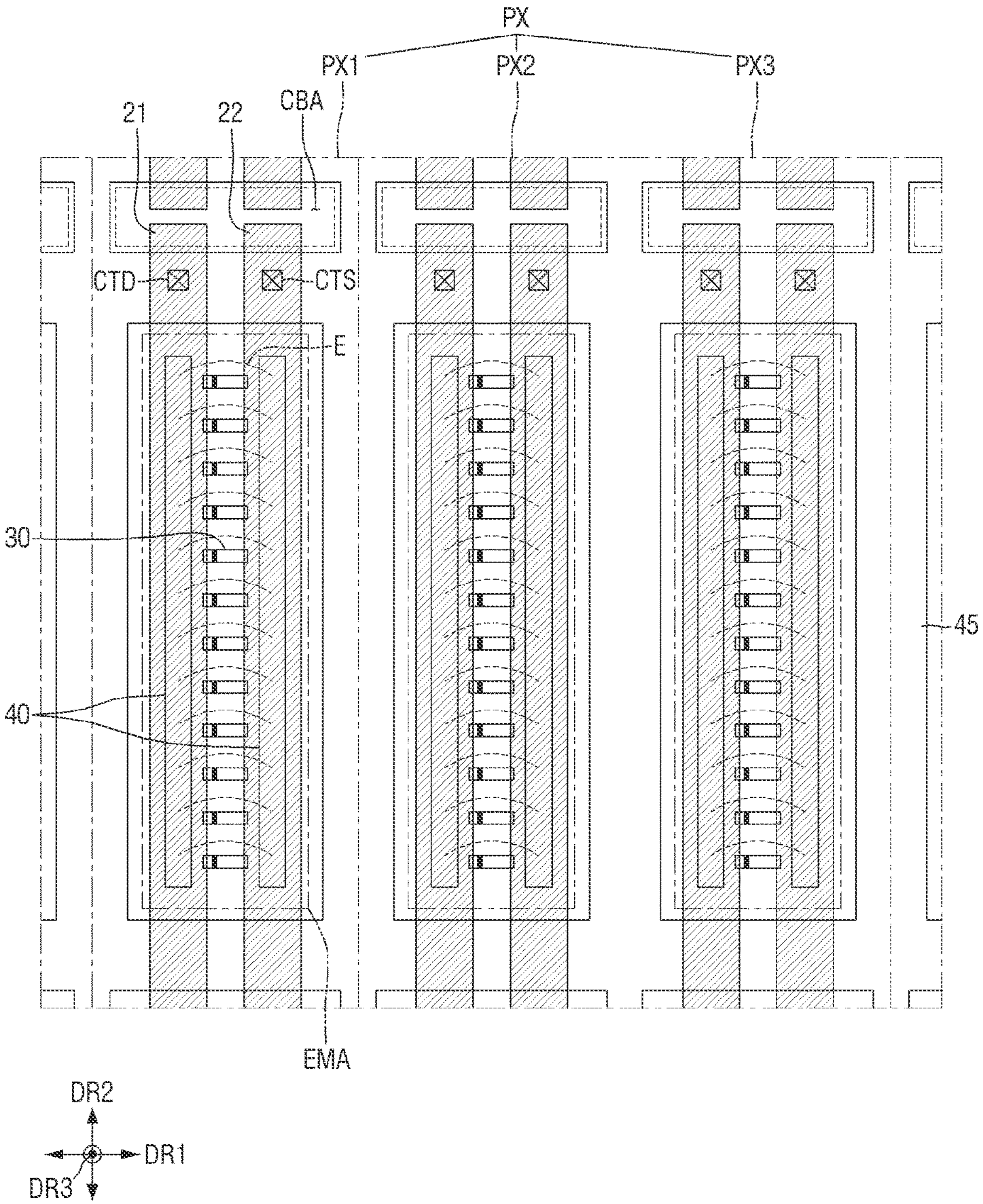
FIG. 15 is a cross-sectional view illustrating one operation of the manufacturing process of the display device according to one or more embodiments.

FIG. 14 is a schematic circuit diagram illustrating one operation of a manufacturing process of the display device according to one or more embodiments. FIG. 15 is a schematic view illustrating one operation of the manufacturing process of the display device according to one embodiment.

Referring to FIGS. 14 and 15, alignment voltages ASN1 and ASN2 are respectively applied to a first electrode 21 and a second electrode 22 through a fourth transistor T4 and a second transistor T2 of each sub-pixel PXn to generate an electric field E between the electrodes 21 and 22. According to one or more embodiments, during the manufacturing process of the display device 10, signals are applied through an alignment signal line ASL and a sensing line SSL to turn on the second transistor T2 and the fourth transistor T4 at the same timing, and the alignment voltages ASN1 and ASN2 are applied respectively through an initialization voltage wiring VIL and a data line DTL. The fourth transistor T4 may transmit a first alignment voltage ASN1 applied through the initialization voltage wiring VIL or an initialization voltage distribution line IDL to the first electrode 21, and the second transistor T2 may transmit a second alignment voltage ASN2 applied through the data line DTL to the second electrode 22. The electric field E may be generated between the first electrode 21 and the second electrode 22 by a voltage difference between the applied alignment voltages ASN1 and ASN2, and the light-emitting elements 30 may be disposed on the electrodes 21 and 22 while the position and alignment direction thereof are changed by the electric field E.

The light-emitting element 30 dispersed in the ink may have a dipole moment therein as a plurality of semiconductor layers have a polarity. The light-emitting element 30 having a dipole moment may receive a dielectrophoretic force according to the intensity or direction of the electric field E, and may move such that both end portions thereof may be placed on the electrodes 21 and 22, respectively.

The display device 10 may apply the alignment signal to each of the electrodes 21 and 22 using a transistor other than a first transistor T1, which is a driving transistor. The second transistor T2, that does not substantially transmit a signal during the driving of the display device 10, may be concurrently (e.g., simultaneously) turned on at the same timing as the fourth transistor T4. Because the fourth transistor T4 is electrically connected to the first electrode 21 and the second transistor T2 is electrically connected to the second electrode 22, the alignment voltages ASN1 and ASN2 may be transmitted to the first electrode 21 and the second electrode 22 through the fourth transistor T4 and the second transistor T2, respectively, during the manufacturing process of the display device 10. The second transistor T2 and the fourth transistor T4 may be concurrently (e.g., simultaneously) turned on through the alignment signal line ASL and the sensing line SSL, and the alignment voltages ASN1 and ASN2 may be applied through the initialization voltage wiring VIL and the data line DTL, respectively, to align the light-emitting elements 30 on the first electrode 21 and the second electrode 22.

The first alignment voltage ASN1 transmitted through the fourth transistor T4 may be different from the second alignment voltage ASN2 transmitted through the second transistor T2. In one or more embodiments, the second alignment voltage ASN2 transmitted through the second transistor T2 may be an alternating current (AC) voltage or a direct current (DC) voltage, and the first alignment voltage ASN1 transmitted through the fourth transistor T4 may be a ground voltage. That is, when the first electrode 21 is grounded and the AC or DC voltage is transmitted to the second electrode 22, the electric field E may be generated by a voltage difference therebetween. However, the present disclosure is not limited thereto, and the alignment signals applied to the first electrode 21 and the second electrode 22 may be opposite to each other, and in some cases, the AC or DC voltage may be applied to each of the first electrode 21 and the second electrode 22.

Subsequently, in one or more embodiments, a second insulating layer 52, a third insulating layer 53, a first contact electrode 26, a second contact electrode 27, and a fourth insulating layer 54 are formed on the light-emitting elements 30 after removing the ink. A description of the arrangement and shape thereof is the same as described above. The display device 10 including a plurality of light-emitting elements 30 may be manufactured through the above processes.

In the display device 10 according to one or more embodiments, transistors for applying signals to the first electrode 21 and the second electrode 22 during the driving and manufacturing process of the display device 10 may be different. In particular, because the alignment signal can be applied through a transistor other than the driving transistor during the manufacturing process, it is possible to individually apply the alignment signal to each sub-pixel PXn. Accordingly, the alignment signals may be applied even when the plurality of electrodes 21 and 22 are formed in a separate state for each sub-pixel PXn, and a process of separating each of the electrodes 21 and 22 for each sub-pixel PXn after the light-emitting elements 30 are aligned may be omitted.

Hereinafter, other embodiments of the display device 10 will be described with reference to other drawings.

Figure 16:
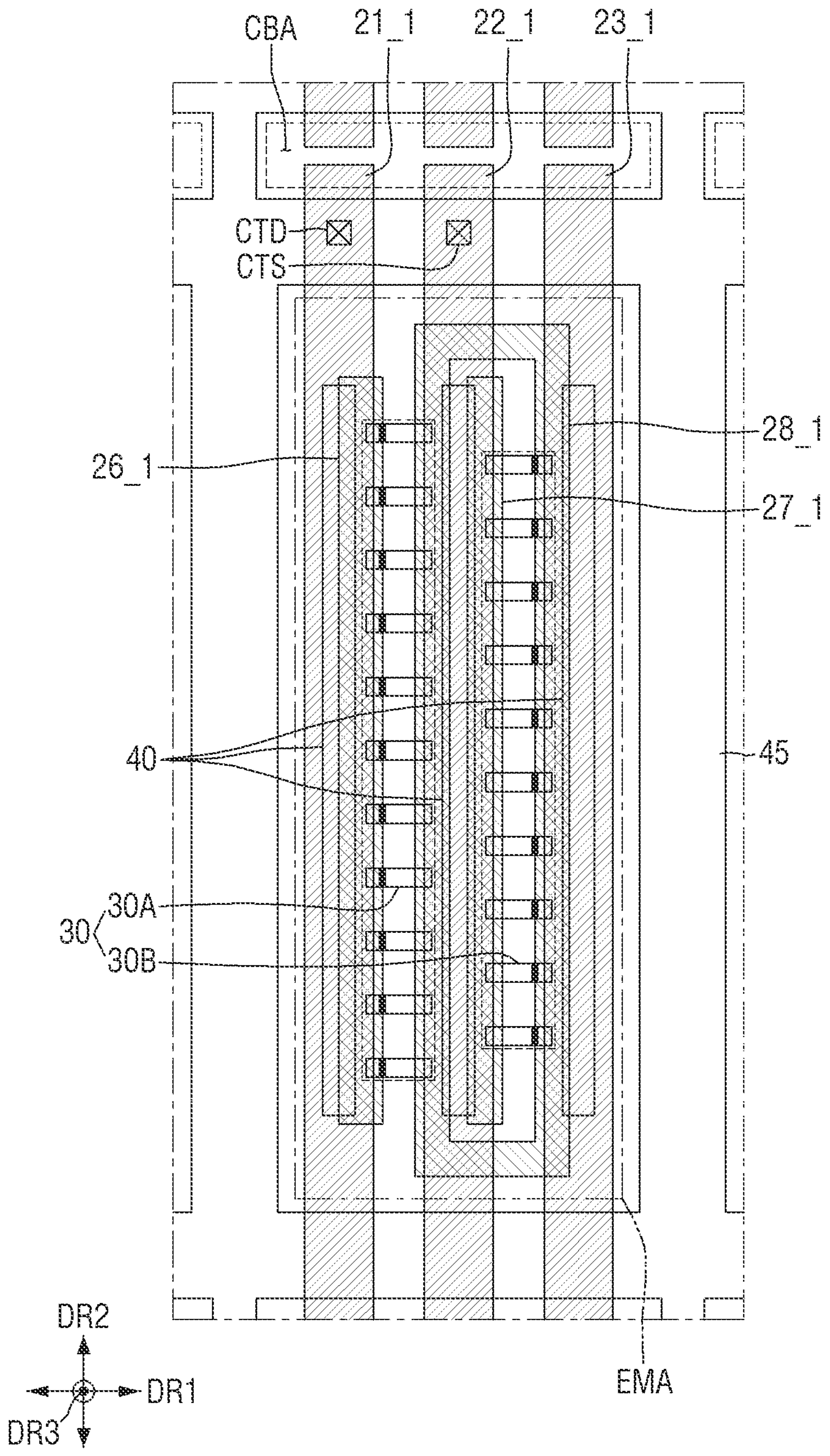
FIG. 16 is a schematic plan view illustrating one sub-pixel of a display device according to one or more embodiments.
Figure 17:
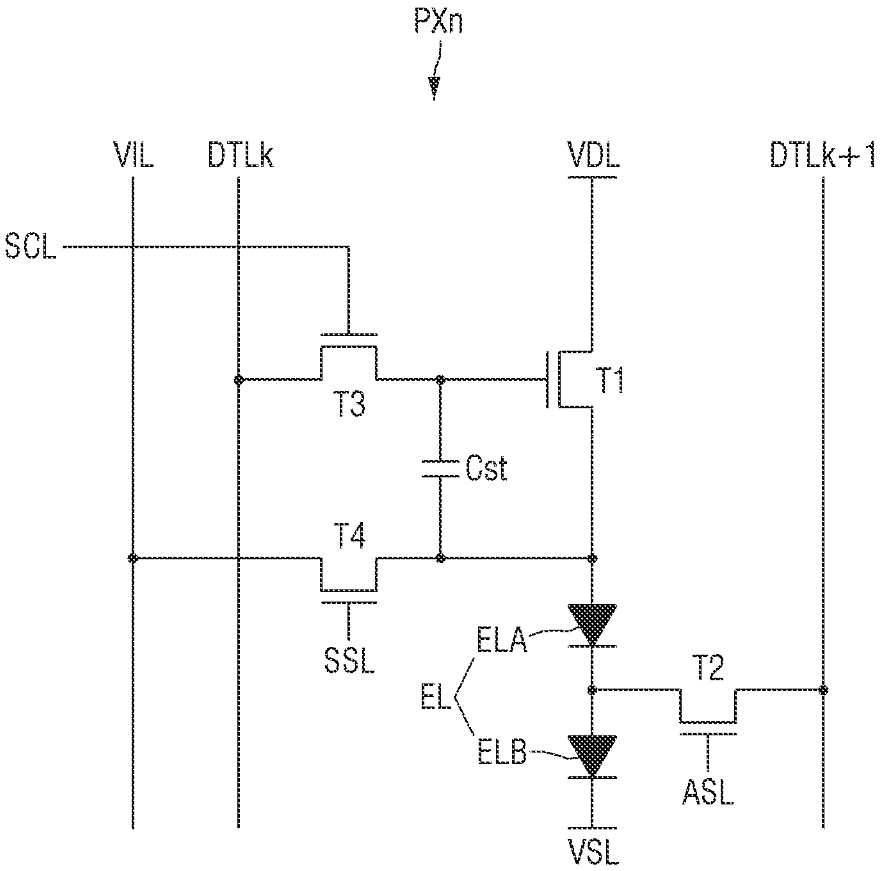
FIG. 17 is an equivalent circuit diagram of one sub-pixel of FIG. 16.

FIG. 16 is a schematic plan view illustrating one sub-pixel of a display device according to one or more embodiments. FIG. 17 is an equivalent circuit diagram of one sub-pixel of FIG. 16. In FIG. 16, only a display element layer of a first sub-pixel PX1 is schematically illustrated.

Referring to FIGS. 16 and 17, a display device 10 according to one or more embodiments may include a larger number of electrodes 21_1, 22_1, and 23_1 disposed for each sub-pixel PXn. The display device 10 may further include a third electrode 231 disposed for each sub-pixel PXn, and light-emitting elements 30 may also be disposed between a second electrode 22_1 and the third electrode 23_1. The embodiment is different from the embodiment of FIG. 7 in that the third electrode 23_1 disposed for each sub-pixel PXn is further included. Hereinafter, redundant descriptions will be omitted, and descriptions will be provided based on differences from the above-described contents.

Each sub-pixel PXn of the display device 10 further includes the third electrode 23_1 that is spaced from the second electrode 22_1 in the first direction DR1 and extends in the second direction DR2. The shape of the third electrode 23_1 is substantially the same as a first electrode 21_1 and the second electrode 22_1. A larger number of first banks 40 may be disposed in a light-emitting area EMA of each sub-pixel PXn, and at least a portion of each of the electrodes 21_1, 22_1, and 23_1 may be disposed on the first bank 40.

A plurality of light-emitting elements 30A and 30B (collectively 30) may include first light-emitting elements 30A disposed on the first electrode 21_1 and the second electrode 22_1, and second light-emitting elements 30B disposed on the second electrode 22_1 and the third electrode 23_1. One end portion of the first light-emitting element 30A is disposed on the first electrode 21_1 and the other end portion thereof is disposed on the second electrode 22_1. One end portion of the second light-emitting element 30B is disposed on the third electrode 23_1 and the other end portion thereof is disposed on the second electrode 22_1. The one end portions of the first light-emitting element 30A and the second light-emitting element 30B may face in opposite directions. During a manufacturing process of the display device 10, when the same alignment signal is applied to the first electrode 21_1 and the third electrode 23_1, and a different alignment signal is applied to the second electrode 22_1, directions in which one end portions of the light-emitting elements 30 face may be different due to a voltage difference therebetween.

Further, because the display device 10 includes a larger number of the electrodes 21_1, 22_1, and 23_1, the display device 10 may include a larger number of contact electrodes 26_1, 27_1, and 28_1.

In one or more embodiments, the contact electrodes 26_1, 27_1, and 28_1 may include a first contact electrode 261 disposed on the first electrode 21_1, a second contact electrode 27_1 disposed on one side of the second electrode 22_1, and a third contact electrode 281 disposed on the third electrode 23_1 and the other side of the second electrode 22_1 and surrounding the second contact electrode 27_1.

The first contact electrode 261 may be disposed on the first electrode 21_1, on which one end portion of the first light-emitting element 30A is disposed, and may be in contact with one end portion of the first light-emitting element 30A. The second contact electrode 27_1 may be disposed on the second electrode 22_1, on which the other end portion of the second light-emitting element 30B is disposed, and may be in contact with the other end portion of the second light-emitting element 30B. The first contact electrode 26_1 and the second contact electrode 27_1 may be in contact with the electrodes 21_1 and 22_1 in which a first electrode contact hole CTD and a second electrode contact hole CTS are formed, respectively. The first contact electrode 26_1 may be in contact with the first electrode 21_1 that is electrically connected to a first transistor T1 through the first electrode contact hole CTD, and the second contact electrode 27_1 may be in contact with the second electrode 22_1 that is electrically connected to a second voltage wiring VSL through the second electrode contact hole CTS. The first contact electrode 26_1 and the second contact electrode 271 may transmit an electrical signal applied from the first transistor T1 or the second voltage wiring VSL to the light-emitting elements 30.

Each sub-pixel PXn may include the third electrode 23_1 in which the first electrode contact hole CTD and the second electrode contact hole CTS are not formed. The third electrode 231 may be in a floating state in which an electrical signal is not directly applied from the first transistor T1 or the second voltage wiring VSL when the display device 10 is driven. However, the third contact electrode 28_1 may be disposed on the third electrode 23_1, and the electrical signal transmitted to the light-emitting element 30 may flow through the third contact electrode 28_1.

The third contact electrode 281 may be disposed on the third electrode 23_1 to surround the second contact electrode 27_1. The third contact electrode 28_1 may surround the second contact electrode 271 by including portions extending in the second direction DR2, and portions extending in the first direction DR1 and configured to connect the portions extending in the second direction DR2. The portions of the third contact electrode 28_1 extending in the second direction DR2 may be disposed on one side of the third electrode 23_1 and the other side of the second electrode 22_1, and may be in contact with the light-emitting element 30. For example, a portion of the third contact electrode 28_1, which is disposed on the second electrode 22_1, may be in contact with the other end portion of the first light-emitting element 30A, and a portion thereof disposed on the third electrode 23_1 may be in contact with one end portion of the second light-emitting element 30B. A portion of the third contact electrode 28_1 extending in the first direction DR1 and the second electrode 22_1 in which the second electrode contact hole CTS is formed may overlap each other, but may not be in direct contact with each other because another insulating layer may be disposed therebetween.

The electrical signal transmitted from the first contact electrode 26_1 to one end portion of the first light-emitting element 30A is transmitted to the third contact electrode 28_1 that is in contact with the other end portion of the first light-emitting element 30A. The third contact electrode 28_1 may transmit the electrical signal to one end portion of the second light-emitting element 30B, and the electrical signal may be transmitted to the second electrode 22_1 through the second contact electrode 27_1. Accordingly, the electrical signal, which is transmitted from the first transistor T1 and the second voltage wiring VSL to allow the light-emitting element 30 to emit light, may be transmitted only to the first electrode 21_1 and the second electrode 22_1, and a first light-emitting diode ELA including the first light-emitting element 30A and a second light-emitting diode ELB including the second light-emitting element 30B may be connected in series, as light-emitting diodes EL disposed in each sub-pixel PXn, through the third electrode 23_1 and the third contact electrode 28_1.

In one or more embodiments, the alignment signal for the manufacturing process of the display device 10 may be transmitted to each of the first electrode 21_1, the second electrode 22_1, and the third electrode 23_1. The first electrode 21_1 may be electrically connected to the first transistor T1 and a fourth transistor T4. However, according to one or more embodiments, the second electrode 22_1 may be electrically connected to the second voltage wiring VSL, and the third electrode 23_1 may be electrically connected to a second transistor T2 through a third electrode contact hole CTA. The embodiment is different from other embodiments in that the second transistor T2 is connected to the third electrode 23_1 and thus is connected between the first light-emitting diode ELA and the second light-emitting diode ELB. The second transistor T2 may be electrically connected to the third electrode 23_1 through which the first light-emitting diode ELA and the second light-emitting diode ELB are connected in series. During the manufacturing process of the display device 10, alignment signals may be applied to the first electrode 21_1 and the third electrode 23_1 respectively through the fourth transistor T4 and the second transistor T2, and an alignment signal may be applied to the second electrode 22_1 through the second voltage wiring VSL. When the alignment signal applied to the second electrode 22_1 and the alignment signal applied to the first electrode 21_1 and the third electrode 23_1 have a voltage difference, an electric field E may be generated therebetween so that the light-emitting elements 30A and 30B (collectively 30) may be aligned.

Figure 18:
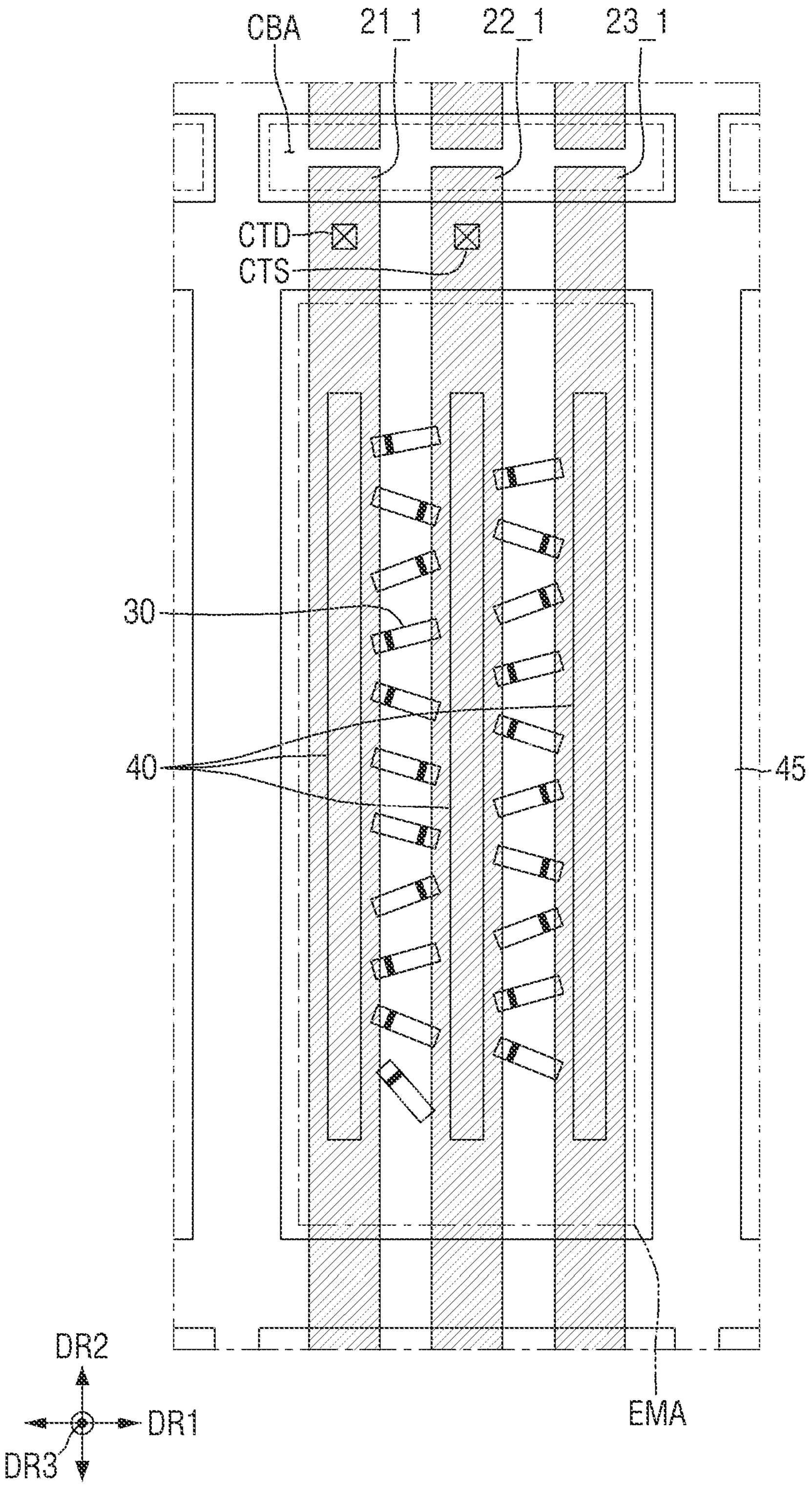
FIG. 18 is a schematic plan view illustrating one operation of a manufacturing process of the display device of FIG. 17.
Figure 19:
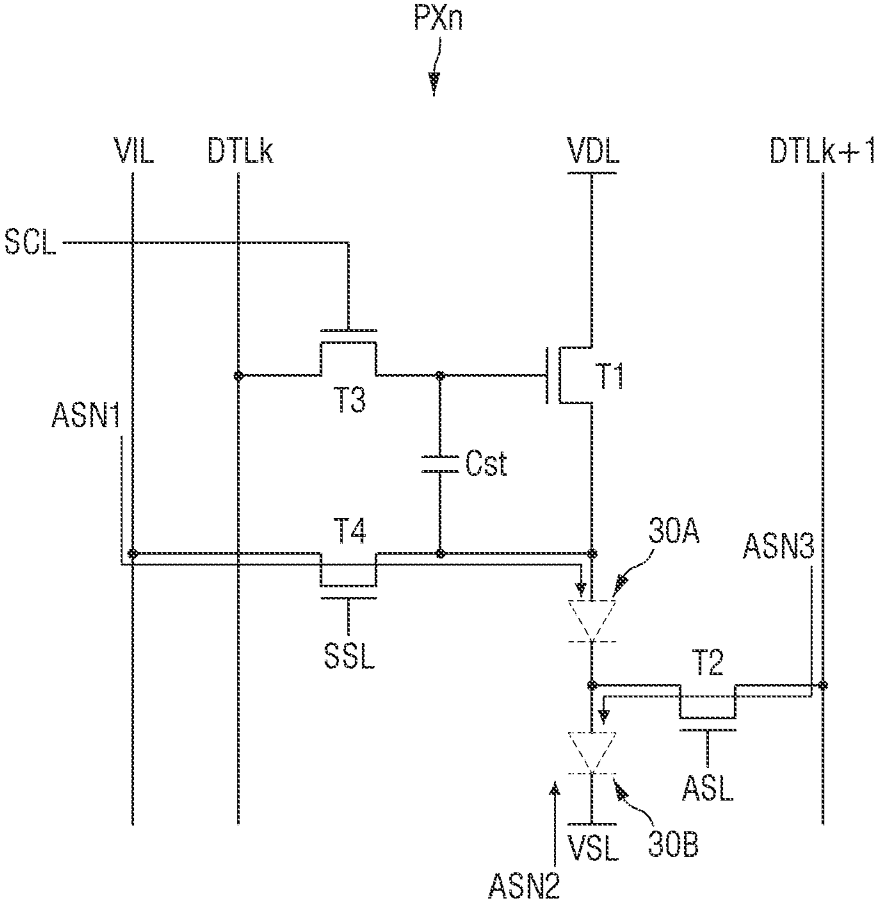
FIG. 19 is a schematic circuit diagram illustrating one operation of the manufacturing process of the display device of FIG. 17.

FIG. 18 is a schematic view illustrating one operation of a manufacturing process of the display device of FIG. 17. FIG. 19 is a schematic circuit diagram illustrating one operation of the manufacturing process of the display device of FIG. 17.

Referring to FIGS. 18 and 19, when an ink in which light-emitting elements 30 are dispersed is sprayed on electrodes 21_1, 22_1, and 23_1, alignment voltages ASN1, ASN2, and ASN3 may be applied respectively through a fourth transistor T4, a second voltage wiring VSL, and a second transistor T2. The second transistor T2 and the fourth transistor T4 may be turned on in response to signals applied respectively through an alignment signal line ASL and a sensing line SSL to transmit alignment voltages to a third electrode 23_1 and a first electrode 21_1, respectively. In addition, an alignment voltage may also be applied to the second voltage wiring VSL and may be transmitted to the second electrode 22_1. In one or more embodiments, a first alignment voltage ASN1 and a third alignment voltage ASN3 respectively applied to the first electrode 21_1 and the third electrode 23_1 are the same voltage, a second alignment voltage ASN2 applied to the second electrode 22_1 is different from the first alignment voltage ASN1 and the third alignment voltage ASN3, and an electric field E may be generated between the first electrode 21_1 and the second electrode 22_1 and between the second electrode 22_1 and the third electrode 23_1 due to a voltage difference of the alignment signals therebetween. As an example, an AC voltage may be applied to the first electrode 21_1 and the third electrode 23_1, and a DC voltage may be applied to the second electrode 22_1. The voltage difference between the first electrode 21_1 and the third electrode 23_1, and the second electrode 221 may generate an electric field E therebetween, and the light-emitting elements 30 may be aligned on the electrodes 21_1, 22_1, and 23_1 by the electric field. However, the present disclosure is not limited thereto, and the types of the alignment voltages ASN1, ASN2, and ASN3 applied to the respective electrodes 21_1, 22_1, and 23_1 may be reversed or different from each other.

The display device 10 according to the embodiment may include a larger number of electrodes 21_1, 22_1, and 23_1 to increase the number of the light-emitting elements 30 disposed per sub-pixel PXn. In addition, as the first light-emitting element 30A and the second light-emitting element 30B are connected in series, even when one light-emitting element is short-circuited, a current may flow through the other light-emitting element, thereby reducing a defect rate of the sub-pixel PXn. In addition, because the second transistor T2 for applying an alignment signal during the manufacturing process of the display device 10 may be connected to an electrode different from the second voltage wiring VSL, the alignment signal may be applied to each of the electrodes 2_1, 22_1, and 23_1.

Figure 20:
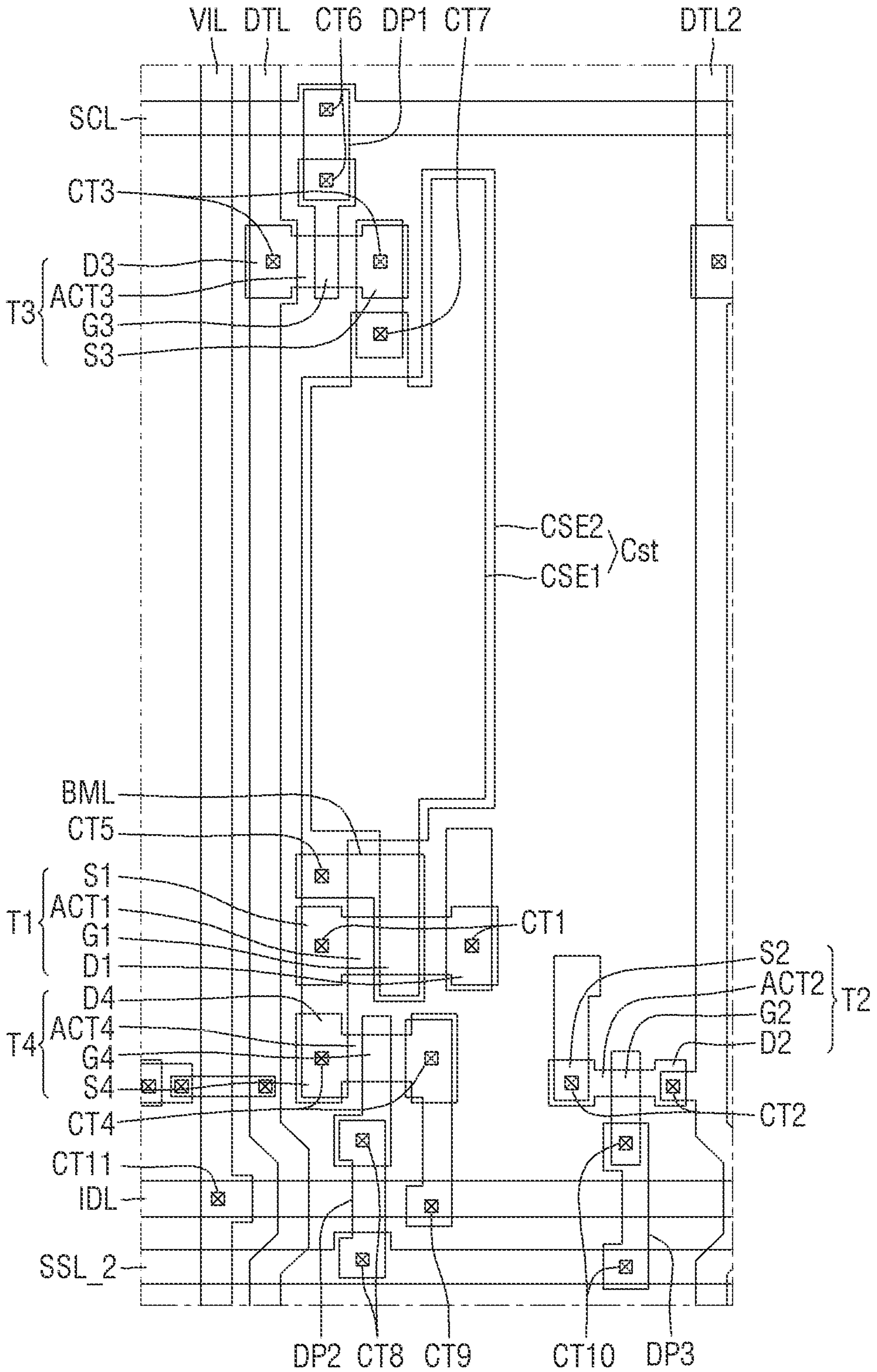
FIG. 20 is a layout diagram illustrating a plurality of conductive layers included in one sub-pixel of a display device according to one or more embodiments.
Figure 21:
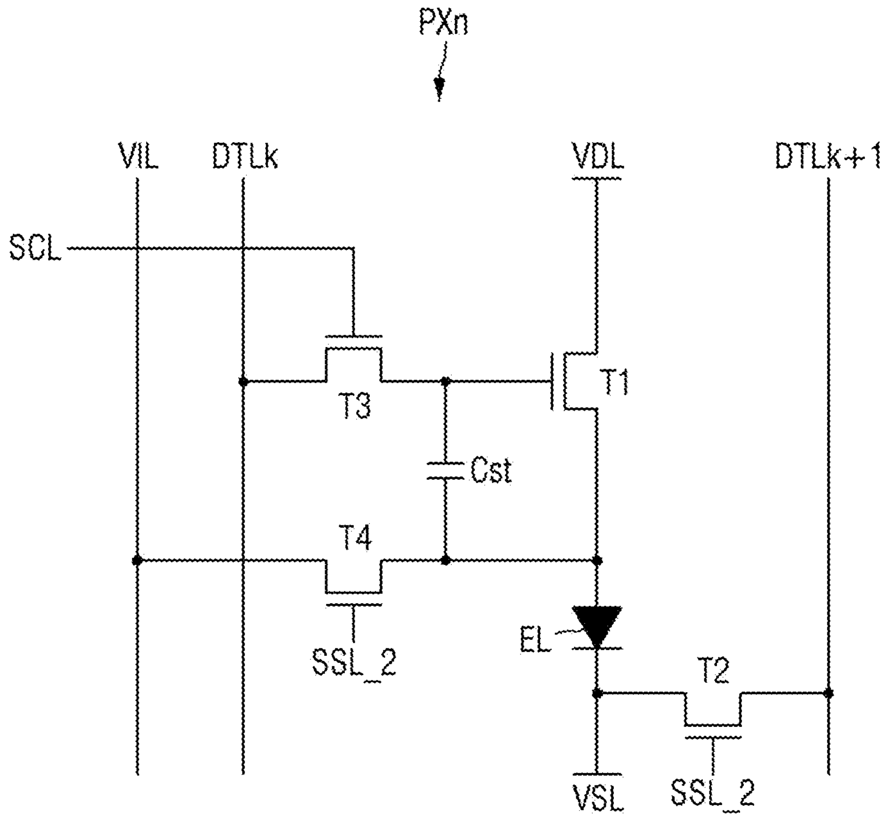
FIG. 21 is an equivalent circuit diagram of one sub-pixel of FIG. 20.

FIG. 20 is a layout diagram illustrating a plurality of conductive layers included in one sub-pixel of a display device according to yet another embodiment. FIG. 21 is an equivalent circuit diagram of one sub-pixel of FIG. 20. In FIG. 20, a layout diagram of a light-blocking layer, a semiconductor layer, a first gate conductive layer, and a first data conductive layer of circuit element layers disposed in a second sub-pixel PX2 is illustrated.

Referring to FIGS. 20 and 21, in a display device 10, an alignment signal line ASL may be omitted, and a second gate electrode G2 of a second transistor T2 may be electrically connected to a sensing line SSL_2. A signal for turning the second transistor T2 and a fourth transistor T4 on may be applied to the sensing line SSL_2 during a manufacturing process of the display device 10, and the embodiment is different from the embodiment of FIGS. 5 and 6 in that the second gate electrode G2 of the second transistor T2 is connected to the sensing line SSL_2. Hereinafter, redundant descriptions will be omitted, and descriptions will be provided based on differences from the above-described contents.

A third conductive pattern DP3 may be in contact with the sensing line SSL_2 and the second gate electrode G2 through one or more contact hole CT10 passing through a first protective layer 15 disposed below the third conductive pattern DP3. The second gate electrode G2 may be electrically connected to the sensing line SSL_2 through the third conductive pattern DP3, and the second transistor T2 may be turned on in response to a signal applied from the sensing line SSL_2.

Unlike the embodiment of FIGS. 3 and 5, the second transistor T2 and a third transistor T3 may each be connected to a data line DTL, but may be connected to different signal lines so that the second transistor T2 and the third transistor T3 of each sub-pixel PXn may not be concurrently (e.g., simultaneously) turned on. The second transistor T2 may be turned on in response to a signal of the sensing line SSL, and the third transistor T3 may be turned on in response to a signal of a scan line SCL. In addition, the second transistor T2 and the third transistor T3 of the corresponding sub-pixel PXn are connected to data lines DTL of different timings. For example, the third transistor T3 may be connected to a first data line DTL1 of the corresponding sub-pixel PXn, and the second transistor T2 may be connected to a second data line DTL2 of another sub-pixel PXn. Even when the second transistor T2 is turned on in response to a sensing signal, a data signal that may be transmitted through the second transistor T2 may be a signal transmitted at a timing different from that of a data signal causing the corresponding sub-pixel PXn to emit light. Accordingly, even when the second transistor T2 is turned on, the second transistor T2 may not transmit a signal when the corresponding sub-pixel PXn emits light.

Furthermore, because the second transistor T2 is turned on concurrently (e.g., simultaneously) with the fourth transistor T4 configured to transmit an initialization voltage to one electrode of a light-emitting diode EL, a driving time may be reduced. Even when the second transistor T2 is turned on and a data signal of a different timing is transmitted to the second electrode 22, the influence on the light emission of the corresponding sub-pixel PXn may be small. In the display device 10 according to the present embodiment, the alignment signal line ASL is omitted, and the second transistor T2 and the fourth transistor T4 may be concurrently (e.g., simultaneously) turned on using one wiring, for example, the sensing line SSL_2, thereby reducing the number of wirings disposed in each sub-pixel PXn.

Figure 22:
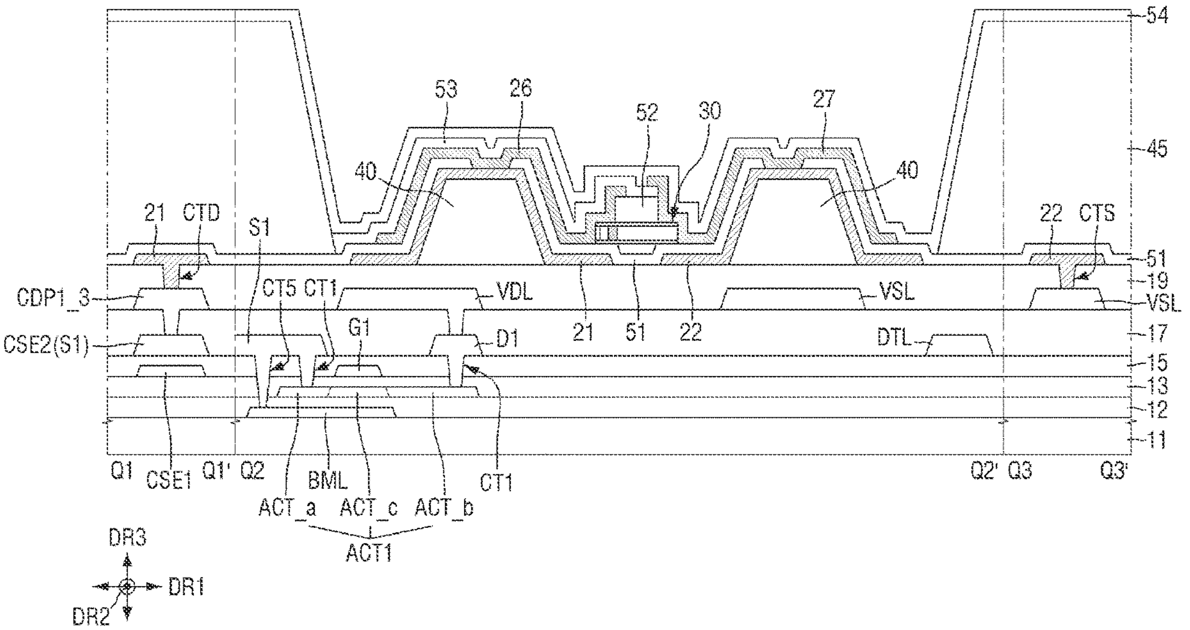
FIGS. 22 and 23 are schematic cross-sectional views illustrating a portion of a display device according to one or more embodiments.
Figure 23:
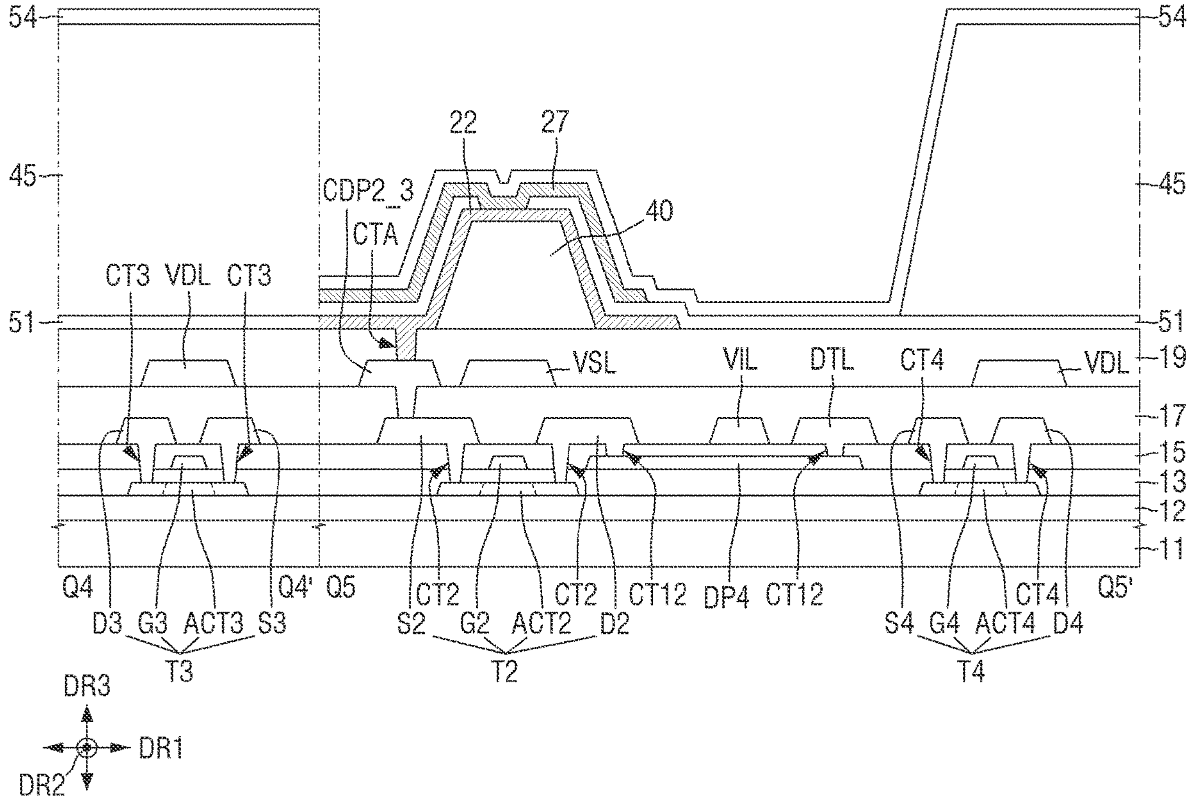

FIGS. 22 and 23 are schematic cross-sectional views illustrating a portion of a display device according to one or more embodiments.

Referring to FIGS. 22 and 23, a display device 10 may further include a plurality of electrode conductive patterns CDP1_3 and CDP 2_3 disposed on a second data conductive layer. The electrode conductive patterns CDP1_3 and CDP 2_3 may include a first electrode conductive pattern CDP1_3 in contact with a second capacitor electrode CSE2, or a first source electrode S1 of a first transistor T1 and a first electrode 21 and a second electrode conductive pattern CDP 2_3 in contact with a second source electrode S2 of a second transistor T2 and a second electrode 22. The first electrode 21 and the second electrode 22 may be electrically connected to the first transistor T1 and the second transistor T2 and may be connected thereto through the electrode conductive patterns CDP1_3 and CDP 2_3 disposed on the second data conductive layer, respectively. The present embodiment is different from the embodiment of FIGS. 8 and 9 in that the electrode conductive patterns disposed on the second data conductive layer are further included. Hereinafter, redundant descriptions will be omitted.

In one or more embodiments, the first electrode 21 and the second electrode 22 may not necessarily have a shape extending in one direction. In one or more embodiments, the electrodes 21 and 22 of the display device 10 may have a shape including portions extending in different directions and with different widths.

Figure 24:
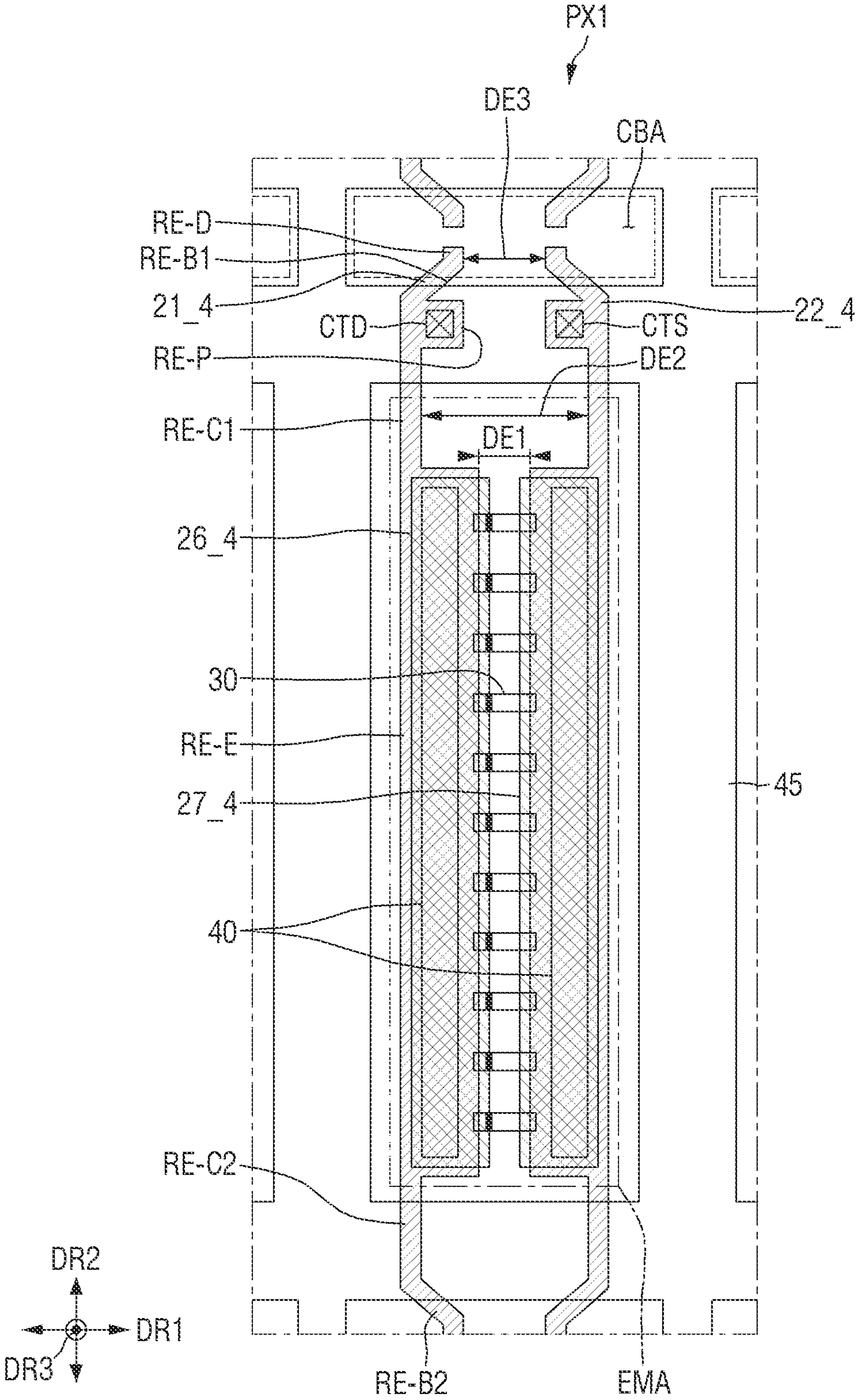
FIG. 24 is a plan view illustrating one sub-pixel of a display device according to one or more embodiments.

FIG. 24 is a plan view illustrating one sub-pixel of a display device according to one or more embodiments.

Referring to FIG. 24, each of electrodes 21_4 and 22_4 of a display device 10 according to one or more embodiments may include an extension portion RE-E extending in the second direction DR2 and having a larger width than the other portions, bent portions RE-B1 and RE-B2 extending in a direction inclined from the first direction DR1 and the second direction DR2, and connection portions RE-C1 and RE-C2 connecting the bent portions RE-B1 and RE-B2 and the extension portion RE-E. Each of the electrodes 21_4 and 22_4 may have an overall shape extending in the second direction DR2 and may have a shape that has a partially larger width or is bent in the direction inclined from the second direction DR2. A first electrode 21_4 and a second electrode 22_4 may be disposed in a symmetrical structure with respect a first insulating layer 51 disposed therebetween. Hereinafter, the shape of the first electrode 21_4 will be mainly described.

The first electrode 214 may include the extension portion RE-E having a larger width than other portions. The extension portion RE-E may be disposed on a first banks 40 in a light-emitting area EMA of a sub-pixel PXn and may extend in the second direction DR2. The first insulating layer 51 may be disposed between the extension portions RE-E of the first electrode 21_4 and the second electrode 22_4, and light-emitting elements 30 may be disposed on the first insulating layer 51. In addition, a first contact electrode 26_4 and a second contact electrode 27_4 may be disposed on the extension portions RE-E of the electrodes 21_4 and 22_4, respectively, and may each have a width less than the width of the extension portion RE-E.

The connection portions RE-C1 and RE-C2 may be connected to both sides of each of the extension portions RE-E in the second direction DR2. A first connection portion RE-C1 is disposed at one side of the extension portion RE-E in the second direction DR2, and a second connection portion RE-C2 is disposed at the other side thereof. The connection portions RE-C1 and RE-C2 may be connected to the extension portion RE-E and may be disposed over the light-emitting area EMA and the second bank 45 of each sub-pixel PXn.

A width of each of the first connection portion RE-C1 and the second connection portion RE-C2 may be less than the width of the extension portion RE-E. One side of each of the connection portions RE-C1 and RE-C2 extending in the second direction DR2 may be connected on the same line as one side of the extension portion RE-E extending in the second direction DR2. For example, from among both sides of the extension portion RE-E and the connection portions RE-C1 and RE-C2, one sides thereof positioned at an outer side based on a center of the light-emitting area EMA may extend to be connected to each other. Accordingly, an interval DE1 between the extension portions RE-E of the first electrode 21_4 and the second electrode 224 may be less than an interval DE2 between the connection portions RE-C1 and RE-C2 of the first electrode 21_4 and the second electrode 22_4.

The bent portions RE-B1 and RE-B2 are connected to the connection portions RE-C1 and RE-C2, respectively. The bent portions RE-B1 and RE-B2 may include a first bent portion RE-B1 connected to the first connection portion RE-C1 and disposed over the second bank 45 and a cut-out area CBA, and a second bent portion RE-B2 connected to the second connection portion RE-C2 and disposed over the second bank 45 and a cut-out area CBA of another sub-pixel PXn. The bent portions RE-B1 and RE-B2 may be connected to the connection portions RE-C1 and RE-C2, respectively and bent in a direction inclined from the second direction DR2, for example, toward a center of the sub-pixel PXn. Accordingly, a shortest interval DE3 between the bent portions RE-B1 and RE-B2 of the first electrode 21_4 and the second electrode 22_4 may be less than the interval DE2 between the connection portions RE-C1 and RE-C2 of the first electrode 21_4 and the second electrode 22_4. However, the shortest interval DE3 between the bent portions RE-B1 and RE-B2 may be greater than the interval DE1 between the extension portions RE-E.

A contact portion RE-P having a relatively great width may be formed at a portion at which the first connection portion RE-C1 and the first bent portion RE-B1 are connected. The contact portions RE-P may overlap the second bank 45, and a first electrode contact hole CTD and a second electrode contact hole CTS respectively of the first electrode 21_4 and the second electrode 22_4 may be formed therein.

Further, a fragment portion RE-D remaining after each of the first electrode 21_4 and the second electrode 22_4 is separated in the cut-out area CBA may be formed at one end portion of the first bent portion RE-B1. The fragment portion RE-D may be a portion remaining after each of the electrodes 21_4 and 22_4 of the sub-pixels PXn adjacent in the second direction DR2 is disconnected in the cut-out area CBA.

The embodiment of FIG. 24 is different from the embodiment of FIG. 2 in that each of the first electrode 21_4 and the second electrode 22_4 includes the extension portion RE-E, the connection portions RE-C1 and RE-C2, and the bent portions RE-B1 and RE-B2, which are symmetrically disposed with respect to the center of the sub-pixel PXn. However, the present disclosure is not limited thereto, and in some cases, the first electrode 21_4 and the second electrode 22_4 may have different shapes.

Figure 25:
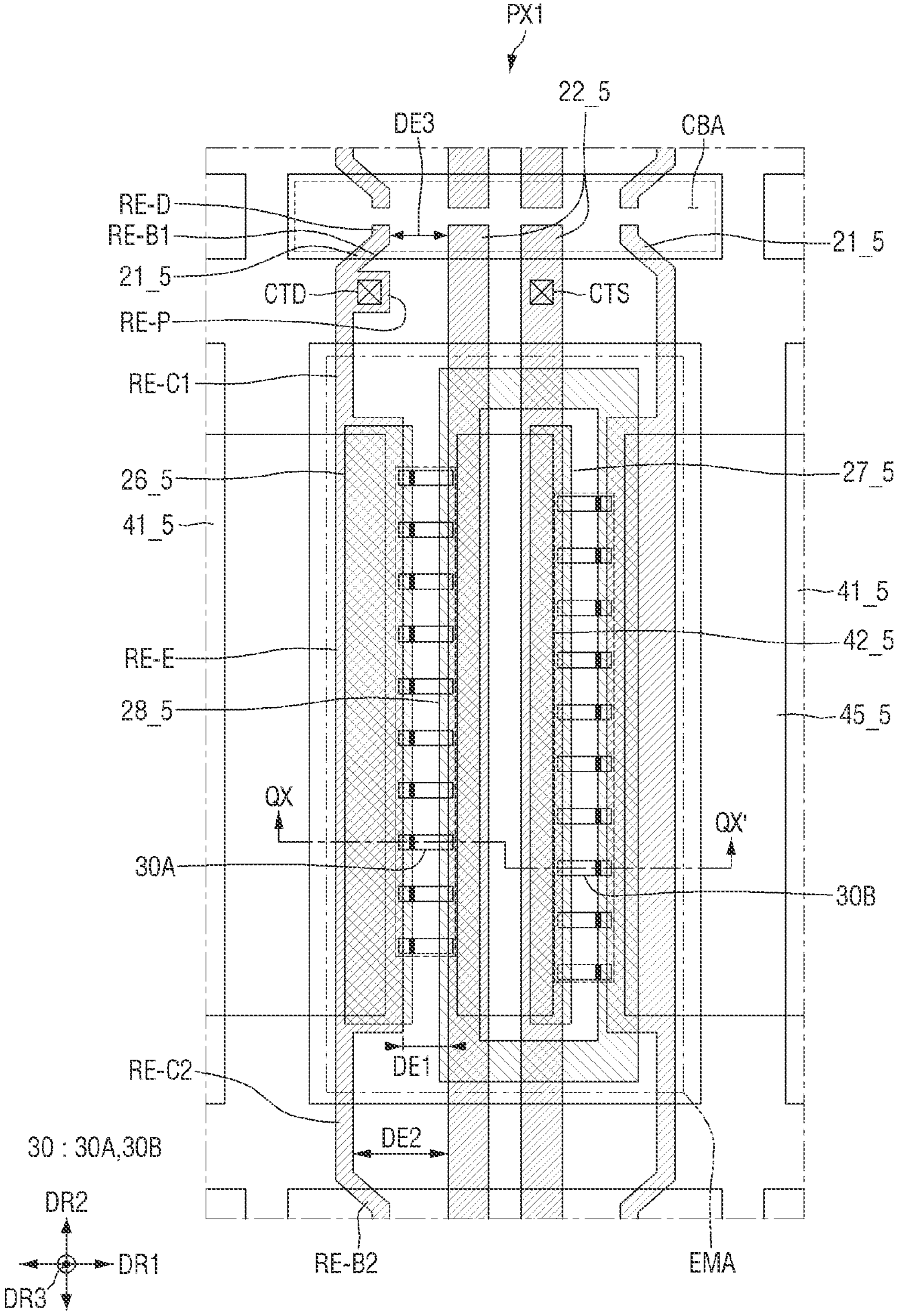
FIG. 25 is a plan view illustrating one sub-pixel of a display device according to one or more embodiments.
Figure 26:
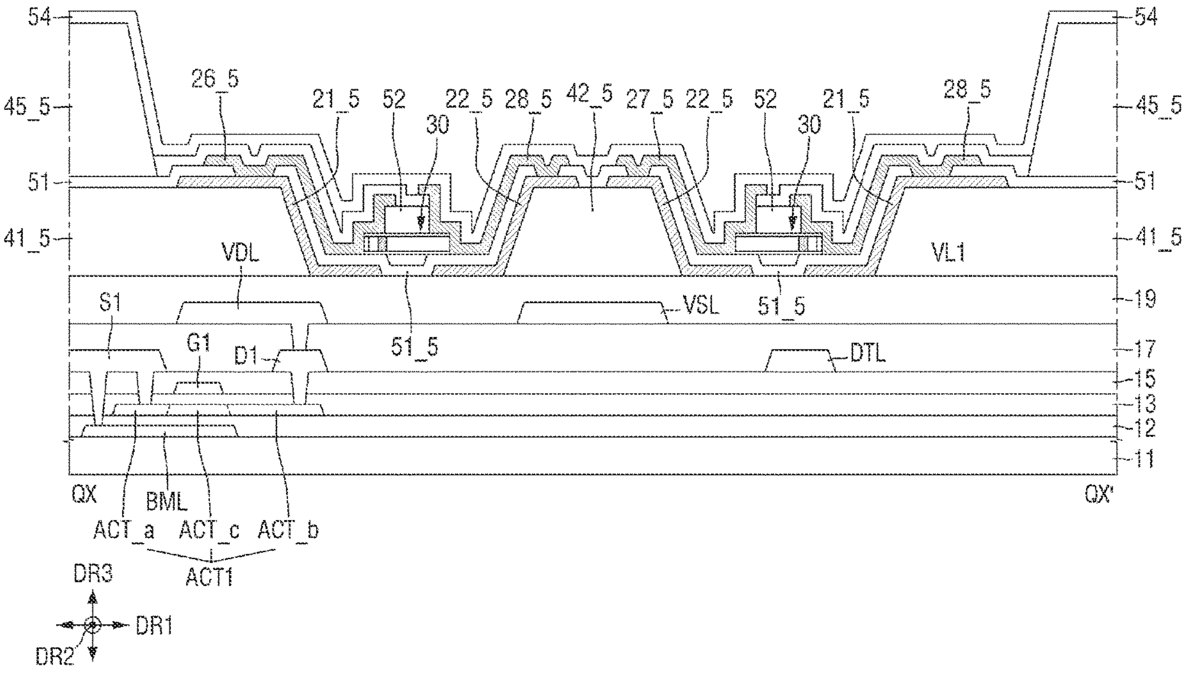
FIG. 26 is a cross-sectional view taken along the line QX-QX' of FIG. 25.

FIG. 25 is a plan view illustrating one sub-pixel of a display device according to one or more embodiments. FIG. 26 is a cross-sectional view taken along line QX-QX' of FIG. 25.

Referring to FIGS. 25 and 26, a display device 10 may include a plurality of first electrodes 21_5 and a plurality of second electrodes 22_5 for each sub-pixel PXn. The first electrodes 215 may have the same shape as those in the embodiment of FIG. 24, and the plurality of first electrodes 21_5, for example, two first electrodes 21_5 may be symmetrically disposed with respect to a center of the sub-pixel PXn. The second electrodes 225 may have the same shape as those in the embodiment of FIG. 7, and the plurality of second electrodes 225, for example, two second electrodes 22_5 may be disposed between the first electrodes 21_5. An interval between the first electrode 21_5 and the second electrode 22_5 may vary depending on the portion of the first electrode 21_5. For example, an interval DE1 between an extension portion RE-E and the second electrode 22_5 may be less than an interval DE2 between each of connection portions RE-C1 and RE-C2 and the second electrodes 22_5 and an interval DE3 between each of bent portions RE-B1 and RE-B2 and the second electrodes 22_5. The interval DE2 between each of the connection portions RE-C1 and RE-C2 and the second electrode 225 may be greater than the interval DE3 between each of the bent portions RE-B1 and RE-B2 and the second electrode 22_5. However, the present disclosure is not limited thereto. Because the shape of each of the electrodes 21_5 and 22_5 is the same as described above with reference to FIGS. 7 and 24, a detailed description thereof will be omitted.

In one or more embodiments, the arrangement and shape of first banks 41_5 and 425 (collectively 40) and contact electrodes 265, 275, and 28_5 disposed in each sub-pixel PXn may vary depending on the arrangement of the first electrodes 21_5 and the second electrodes 22_5.

The first bank 40 may include a first sub-bank 41_5 and a second sub-bank 42_5 having different widths. The first sub-bank 41_5 and the second sub-bank 42_5 may each extend in the second direction DR2, and may differ in width measured in the first direction DR1. As the first sub-bank 41_5 has a larger width than the second sub-bank 425, the first sub-bank 415 may be disposed over a boundary of the sub-pixels PXn adjacent in the first direction DR1. For example, the first sub-bank 415 may also be disposed on a boundary therebetween, including the light-emitting area EMA of each sub-pixel PXn. Accordingly, in one or more embodiments, a portion of a second bank 42_5 extending in the second direction DR2 may be partially disposed on the first sub-bank 41_5. Two first sub-banks 415 may be partially disposed in one sub-pixel PXn. One second sub-bank 425 may be disposed between the first sub-banks 41_5.

The second sub-bank 42_5 may extend in the second direction DR2 at a center portion of the light-emitting area EMA of the sub-pixel PXn. The second sub-bank 42_5 may have a width less than that of the first sub-bank 415, and may be disposed between the first sub-banks 41_5 to be spaced therefrom.

The extension portions RE-E of the first electrodes 21_5 and the second bank 42_5 may be disposed on the first sub-banks 41_5. The extension portions RE-E of the first electrodes 21_5 of the sub-pixels PXn adjacent in the first direction DR1 may be disposed on the first sub-bank 41_5. That is, the extension portions RE-E of two first electrodes 21_5 are disposed on one first sub-bank 41_5. Two second electrodes 225 may be disposed on the second sub-bank 42_5. The second electrodes 225 may be disposed on both sides of the second sub-bank 42_5 extending in the second direction DR2, and may be spaced from each other on the second sub-bank 42_5.

One of the first electrodes 215 may include a contact portion RE-P so that a first electrode contact hole CTD is formed in the contact portion RE-P, and the contact portion RE-P may not be formed in the other first electrodes 21_5. Similarly, the contact portion RE-P may be formed in one of the second electrodes 22_5 so that a second electrode contact hole CTS is formed in the contact portion RE-P, and the contact portion RE-P may not be formed in the other second electrode 22_5. An electrical signal may be transmitted to a first transistor T1 or the electrodes 21_5 and 22_5 connected to a second voltage wiring VSL through the first and second contact holes CTD and CTS, and the electrical signal may be transmitted to other electrodes 21_5 and 22_5 through the contact electrodes 265, 27_5, and 28_5.

Both end portions of each of light-emitting elements 30 are disposed on the extension portion RE-E of the first electrode 21_5 and the second electrode 22_5 on the first insulating layer 51. One end portion of both end portions of each of the light-emitting elements 30, in which a second semiconductor layer 32 is disposed, may be disposed on the first electrode 21_5. Accordingly, one end portion of each of first light-emitting elements 30A between the electrodes 21_5 and 22_5 disposed on a left side with respect to the center of each sub-pixel PXn and one end portion of each of second light-emitting elements 30B between the electrodes 21_5 and 22_5 disposed on a right side with respect to the center of each sub-pixel PXn may face opposite directions.

As the display device 10 includes a larger number of electrodes 21_5 and 22_5, the display device 10 may include a larger number of contact electrodes 26_5, 275, and 28_5.

In one or more embodiments, the contact electrodes 265, 275, and 28_5 may include a first contact electrode 26_5 disposed on one first electrodes 21_5, a second contact electrode 27_5 disposed on one second electrode 225, and a third contact electrode 28_5 disposed on the other first electrode 21_5 and the other second electrode 22_5 and surrounding the second contact electrode 27_5.

The first contact electrode 265 is disposed on one first electrodes 21_5. For example, the first contact electrode 26_5 is disposed on the extension portion RE-E of the first electrode 21_5 on which one end portion of the first light-emitting element 30A is disposed. The first contact electrode 26_5 may be in contact with each of the extension portion RE-E of the first electrode 21_5 and one end portion of the first light-emitting element 30A. The second contact electrode 27_5 is disposed on the second electrode 22_5. For example, the second contact electrode 27_5 is disposed on the second electrode 22_5 on which the other end portion of the second light-emitting element 30B is disposed. The second contact electrode 27_5 may be in contact with each of the second electrode 22_5 and the other end portion of the second light-emitting element 30B. The first contact electrode 26_5 and the second contact electrode 275 may be in contact with the electrodes 21_5 and 22_5 in which the first electrode contact hole CTD and the second electrode contact hole CTS are formed, respectively. The first contact electrode 26_5 may be in contact with the first electrode 21_5 that is electrically connected to a first transistor T1 through the first electrode contact hole CTD, and the second contact electrode 27_5 may be in contact with the second electrode 22_5 that is electrically connected to the second voltage wiring VSL through the second electrode contact hole CTS. The first contact electrode 26_5 and the second contact electrode 27_5 may transmit an electrical signal applied from the first transistor T1 or the second voltage wiring VSL to the light-emitting elements 30. The first contact electrode 26_5 and the second contact electrode 27_5 are substantially the same as those described above.

The electrodes 21_5 and 22_5 in which the electrode contact holes CTD and CTS are not formed are further disposed in each sub-pixel PXn. The electrodes 21_5 and 22_5 in which the electrode contact holes CTD and CTS are not formed may be substantially in a floating state in which an electrical signal is not applied directly from the first transistor T1 or the second voltage wiring VSL. However, the third contact electrode 285 may be disposed on the electrodes 21_5 and 22_5 in which the electrode contact holes CTD and CTS are not formed, and the electrical signal transmitted to the light-emitting element 30 may flow through the third contact electrode 285.

The third contact electrode 285 may be disposed on the first electrode 21_5 and the second electrode 22_5 in which the electrode contact holes CTD and CTS are not formed, and may be disposed to surround the second contact electrode 27_5. The third contact electrode 285 may surround the second contact electrode 275 by including portions extending in the second direction DR2 and portions extending in the first direction DR1 and connecting the portions extending in the second direction DR2. The portions of the third contact electrode 28_5 extending in the second direction DR2 may be disposed on the first electrode 21_5 and the second electrode 22_5, in which the electrode contact holes CTD and CTS are not formed, respectively, and may be in contact with the light-emitting element 30. For example, the portion of the third contact electrode 28_5, which is disposed on the second electrode 225, may be in contact with the other end portion of the first light-emitting element 30A, and the portion thereof disposed on the first electrode 215 may be in contact with one end portion of the second light-emitting element 30B. The portion of the third contact electrode 28_5 extending in the first direction DR1 and the second electrode 22_5 in which the second electrode contact hole CTS is formed may overlap each other, but may not be in direct contact with each other because another insulating layer may be disposed therebetween. Accordingly, as in the embodiment of FIG. 16, the first light-emitting element 30A and the second light-emitting element 30B may be connected in series through the third contact electrode 28_5.

In the case of the present embodiment, a second transistor T2 may be connected to each of the first electrode 21_5 and the second electrode 22_5 in which the first and second electrode contact holes CTD and CTS are not formed. During a manufacturing process of the display device 10, the same type of alignment signal may be applied to the first electrode 21_5 connected to a fourth transistor T4 through the first electrode contact hole CTD and the second electrode 22_5 connected to the second voltage wiring VSL through the second electrode contact hole CTS, and a different alignment signal may be applied to the electrode connected to the second transistor T2 as the other electrodes 21_5 and 22_5. Accordingly, between these electrodes, an electric field is generated by a voltage difference between the alignment signals and the light-emitting elements 30 may be aligned. A detailed description thereof is the same as described above.

In concluding the detailed description, those skilled in the art will appreciate that many variations and modifications can be made to the embodiments without substantially departing from the principles and scope of the present disclosure. Therefore, the disclosed embodiments of the present disclosure are used in a generic and descriptive sense only and not for purposes of limitation.

The invention claimed is:

1. A display device comprising:

a first substrate;

a semiconductor layer on the first substrate and comprising a plurality of active layers;

a first gate conductive layer on the semiconductor layer and comprising a scan line and a sensing line extending in a first direction, and a plurality of gate electrodes partially overlapping the semiconductor layer;

a first data conductive layer on the first gate conductive layer and comprising a first data line and a second data line extending in a second direction and are spaced from each other, and one electrode and the other electrode of each of a plurality of transistors, the second direction crossing the first direction;

a second data conductive layer on the first data conductive layer and comprising a first voltage wiring and a second voltage wiring extending in the second direction between the first data line and the second data line;

a first electrode and a second electrode on the second data conductive layer and extending in the second direction, the second electrode being spaced from the first electrode; and a plurality of light-emitting elements, each of the plurality of light-emitting elements having end portions respectively on the first electrode and the second electrode, wherein the plurality of transistors comprises a first transistor having one electrode electrically connected to the first electrode and the other electrode electrically connected to the first voltage wiring, and a second transistor having one electrode electrically connected to the second electrode and the other electrode electrically connected to the first data line, and wherein a distance between the first substrate and the second data conductive layer in a thickness direction of the first substrate is greater than a distance between the first substrate and the first data conductive layer in the thickness direction of the first substrate.

2. The display device of claim 1, wherein the plurality of transistors further comprises a third transistor having one electrode electrically connected to a gate electrode of the first transistor, the other electrode electrically connected to the second data line, and a gate electrode electrically connected to the scan line.

3. The display device of claim 2, wherein the first data conductive layer further comprises an initialization voltage wiring on one side of the first data line and extending in the second direction, and wherein the plurality of transistors further comprises a fourth transistor having one electrode electrically connected to the first electrode and the other electrode electrically connected to the initialization voltage wiring.

4. The display device of claim 3, wherein the first gate conductive layer further comprises an alignment signal line on one side of the sensing line and extending in the first direction, and wherein the second transistor comprises a gate electrode electrically connected to the alignment signal line.

5. The display device of claim 3, wherein each of the second transistor and the fourth transistor comprises a gate electrode electrically connected to the sensing line.

6. The display device of claim 3, wherein the first gate conductive layer further comprises a conductive pattern overlapping the first data conductive layer and the initialization voltage wiring and electrically connected to the second data line and a drain electrode of the second transistor.

7. The display device of claim 1, wherein the second electrode is electrically connected to the second voltage wiring.

8. The display device of claim 7, wherein the second data conductive layer further comprises a first electrode conductive pattern in contact with the one electrode of the first transistor and the first electrode, and a second electrode conductive pattern in contact with the one electrode of the second transistor and the second electrode.

9. The display device of claim 1, further comprising a third electrode between the first electrode and the second electrode, wherein the third electrode is electrically connected to the second voltage wiring, and the plurality of light-emitting elements comprises a first light-emitting element on the first electrode and the third electrode, and a second light-emitting element on the third electrode and the second electrode.

10. The display device of claim 1, further comprising:

a first gate insulating layer between the semiconductor layer and the first gate conductive layer;

a first protective layer between the first gate conductive layer and the first data conductive layer;

a first interlayer insulating layer between the first data conductive layer and the second data conductive layer;

a first planarization layer between the second data conductive layer, and the first electrode and the second electrode; and a first insulating layer partially covering the first electrode and the second electrode, wherein the plurality of light-emitting elements is on the first insulating layer.

11. The display device of claim 10, further comprising:

a first contact electrode on the first electrode and in contact with one end portion of each of the light-emitting elements; and a second contact electrode on the second electrode and in contact with the other end portion of each of the light-emitting elements.

12. The display device of claim 1, wherein the first electrode comprises a bent portion extending in a direction different from the first direction and the second direction, an extension portion extending in the second direction and having a width greater than that of the bent portion, and a connection portion configured to connect the bent portion and the extension portion and extending in the second direction, and wherein one end portion of each of the light-emitting elements is disposed on the extension portion of the first electrode.

13. The display device of claim 12, wherein the second electrode has a symmetrical structure with the first electrode, and wherein the other end portion of each of the plurality of light-emitting elements is on an extension portion of the second electrode.

14. The display device of claim 13, wherein an interval between the extension portions of the first electrode and the second electrode is less than an interval between connection portions of the first electrode and the second electrode, and wherein a shortest interval between bent portions of the first electrode and the second electrode is greater than the interval between the extension portions, and is less than the interval between the connection portions.

15. A display device having a first substrate, the display device comprising:

a first voltage wiring configured to receive a first power voltage and a second voltage wiring configured to receive a second power voltage;

a first data line and a second data line configured to receive different data signals;

a light-emitting diode having one end electrically connected to the first voltage wiring and the other end electrically connected to the second voltage wiring;

a first transistor comprising one electrode electrically connected to the one end of the light-emitting diode and the other electrode electrically connected to the first voltage wiring;

a second transistor comprising one electrode electrically connected to the other end of the light-emitting diode and the other electrode electrically connected to the second data line, the second transistor being configured to transfer a voltage applied to the second data line to the other end of the light-emitting diode;

a third transistor comprising one electrode connected to a gate electrode of the first transistor and the other electrode electrically connected to the first data line; and a storage capacitor electrically connected to the gate electrode and the one electrode of the first transistor, wherein a distance between the first substrate and the first voltage wiring and the second voltage wiring in a thickness direction of the first substrate is greater than a distance between the first substrate and the first data line and the second data line in the thickness direction of the first substrate.

16. The display device of claim 15, further comprising:

a scan line configured to receive a scan signal, the scan line being electrically connected to a gate electrode of the third transistor;

an alignment signal line configured to receive an alignment signal, the alignment signal line being electrically connected to a gate electrode of the second transistor; and a sensing line configured to receive a sensing signal, wherein the display device further comprises a fourth transistor having a gate electrode electrically connected to the sensing line, one electrode electrically connected to the one end of the light-emitting diode, and the other electrode connected to an initialization voltage wiring configured to receive an initialization voltage.

17. The display device of claim 16, wherein in a manufacturing mode of the display device, the second transistor and the fourth transistor are turned on in response to signals applied through the alignment signal line and the sensing line, respectively, and the first transistor and the third transistor are turned off.

18. The display device of claim 17, wherein in the manufacturing mode, a first alignment voltage applied to the initialization voltage wiring is transmitted to the one end of the light-emitting diode through the fourth transistor, and a second alignment voltage applied to the second data line is transmitted to the other end of the light-emitting diode through the second transistor.

19. The display device of claim 18, wherein in a driving mode of the display device, the first power voltage is transmitted to the one end of the light-emitting diode through the first transistor, and the second power voltage is transmitted to the other end of the light-emitting diode through the second voltage wiring.

20. The display device of claim 17, wherein the light-emitting diode comprises a first light-emitting diode and a second light-emitting diode connected in series with each other, and in the manufacturing mode, a first alignment voltage applied to the initialization voltage wiring is transmitted to one end of the first light-emitting diode through the fourth transistor, a third alignment voltage applied to the second data line is transmitted to one end of the second light-emitting diode and the other end of the first light-emitting diode through the second transistor, and a second alignment voltage is transmitted to the other end of the second light-emitting diode through the second voltage wiring.

* * * * *